(12) United States Patent
Yamazaki et al.

(10) Patent No.: US 9,397,149 B2
(45) Date of Patent: Jul. 19, 2016

(54) SEMICONDUCTOR DEVICE

(71) Applicant: Semiconductor Energy Laboratory Co., Ltd., Atsugi, Kanagawa-ken (JP)

(72) Inventors: Shunpei Yamazaki, Tokyo (JP); Kunihiko Suzuki, Kanagawa (JP); Masakatsu Ohno, Tochigi (JP); Hiroki Adachi, Tochigi (JP); Satoru Idojiri, Tochigi (JP); Koichi Takeshima, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/581,089

(22) Filed: Dec. 23, 2014

(65) Prior Publication Data
US 2015/0187855 A1 Jul. 2, 2015

(30) Foreign Application Priority Data
Dec. 27, 2013 (JP) ................. 2013-273513

(51) Int. Cl.
*H01L 27/32* (2006.01)
*H01L 51/00* (2006.01)
*H01L 51/52* (2006.01)
(Continued)

(52) U.S. Cl.
CPC ........ *H01L 27/3262* (2013.01); *H01L 29/7869* (2013.01); *H01L 51/003* (2013.01); *H01L 51/0097* (2013.01); *H01L 51/5012* (2013.01); *H01L 51/5246* (2013.01); *H01L 2251/303* (2013.01); *Y02E 10/549* (2013.01)

(58) Field of Classification Search
CPC ........................................ H01L 27/16
USPC ............... 257/46, 170, 496, 618, 623
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |

(Continued)

FOREIGN PATENT DOCUMENTS

| | | | |
|---|---|---|---|
| EP | 1737044 A | 12/2006 | |
| EP | 2226847 A | 9/2010 | |

(Continued)

OTHER PUBLICATIONS

Tilley.R, "8.6 Crystallographic shear phases", Crystals and Crystal Structures, Aug. 25, 2006, pp. 196-200, John and Wiley & Sons.

(Continued)

*Primary Examiner* — Earl Taylor
(74) *Attorney, Agent, or Firm* — Fish & Richardson P.C.

(57) ABSTRACT

A display device that includes a first flexible substrate, a first bonding layer over the first flexible substrate, a first insulating film over the first bonding layer, a first element layer over the first insulating film, a second element layer over the first element layer, a second insulating film over the second element layer, a second bonding layer over the second insulating film, and a second flexible substrate over the second bonding layer is provided. The first element layer includes a pixel portion and a circuit portion. The pixel portion includes a display element and a first transistor, and the circuit portion includes a second transistor. The second element layer includes a coloring layer and a light-blocking layer.

26 Claims, 37 Drawing Sheets

(51) Int. Cl.
*H01L 51/50* (2006.01)
*H01L 29/786* (2006.01)

(56) References Cited

U.S. PATENT DOCUMENTS

| | | | |
|---|---|---|---|
| 5,757,456 A | 5/1998 | Yamazaki et al. |
| 5,821,138 A | 10/1998 | Yamazaki et al. |
| 5,849,147 A | 12/1998 | Yasunaga et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,982,209 B2 | 1/2006 | Chen et al. |
| 7,049,190 B2 | 5/2006 | Takeda et al. |
| 7,060,153 B2 | 6/2006 | Yamazaki et al. |
| 7,061,014 B2 | 6/2006 | Hosono et al. |
| 7,064,346 B2 | 6/2006 | Kawasaki et al. |
| 7,091,070 B2 | 8/2006 | Imai et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,335,573 B2 | 2/2008 | Takayama et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,674 B2 | 12/2008 | Tamura et al. |
| 7,468,304 B2 | 12/2008 | Kaji et al. |
| 7,468,308 B2 | 12/2008 | Shimoda et al. |
| 7,482,248 B2 | 1/2009 | Tamura |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,973,313 B2 | 7/2011 | Arai et al. |
| 8,048,777 B2 | 11/2011 | Eguchi et al. |
| 8,137,417 B2 | 3/2012 | Eguchi et al. |
| 8,164,090 B2 | 4/2012 | Iwasaki et al. |
| 8,193,532 B2 | 6/2012 | Arai et al. |
| 8,344,374 B2 | 1/2013 | Yamazaki et al. |
| 8,384,076 B2 | 2/2013 | Park et al. |
| 8,415,208 B2 | 4/2013 | Takayama et al. |
| 8,624,240 B2 | 1/2014 | Sato et al. |
| 8,779,554 B2* | 7/2014 | Vellianitis | H01L 21/76264 257/190 |
| 8,796,681 B2 | 8/2014 | Yamade et al. |
| 8,830,413 B2 | 9/2014 | Yamazaki et al. |
| 8,835,918 B2 | 9/2014 | Yamazaki et al. |
| 8,878,180 B2 | 11/2014 | Yamazaki |
| 8,883,556 B2 | 11/2014 | Yamazaki et al. |
| 8,921,125 B2* | 12/2014 | Nagai | 438/3 |
| 8,952,379 B2* | 2/2015 | Yamazaki | 257/43 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0025675 A1* | 2/2010 | Yamazaki | H01L 27/1225 257/43 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0163874 A1 | 7/2010 | Koyama et al. |
| 2011/0079778 A1 | 4/2011 | Yamazaki et al. |
| 2011/0084267 A1 | 4/2011 | Yamazaki et al. |
| 2011/0095288 A1* | 4/2011 | Morosawa | H01L 29/7869 257/43 |
| 2011/0240998 A1 | 10/2011 | Morosawa et al. |
| 2012/0293859 A1 | 11/2012 | Ikegami et al. |
| 2012/0315730 A1 | 12/2012 | Koezuka et al. |
| 2012/0315735 A1 | 12/2012 | Koezuka et al. |
| 2013/0069054 A1 | 3/2013 | Isobe et al. |
| 2013/0069055 A1* | 3/2013 | Yamazaki | H01L 29/41733 257/43 |
| 2013/0153877 A1 | 6/2013 | Eguchi et al. |
| 2013/0203214 A1* | 8/2013 | Isobe | H01L 21/0237 438/104 |
| 2013/0248854 A1* | 9/2013 | Yamazaki | H01L 27/1225 257/43 |
| 2013/0262765 A1* | 10/2013 | Tsutsui | G06F 12/0802 711/118 |
| 2013/0270563 A1* | 10/2013 | Yamazaki | H01L 29/78609 257/57 |
| 2013/0300468 A1* | 11/2013 | Yamamoto | G06G 7/186 327/156 |
| 2014/0001468 A1 | 1/2014 | Yamazaki et al. |
| 2014/0234664 A1 | 8/2014 | Yasumoto et al. |

(56) References Cited

U.S. PATENT DOCUMENTS

| | | | | |
|---|---|---|---|---|
| 2014/0339538 | A1* | 11/2014 | Yamazaki | H01L 29/66969 257/43 |
| 2014/0339544 | A1* | 11/2014 | Hanaoka | H01L 29/7869 257/43 |
| 2014/0339548 | A1* | 11/2014 | Yamazaki | H01L 29/7869 257/43 |
| 2014/0339549 | A1* | 11/2014 | Yamazaki | H01L 29/7869 257/43 |
| 2014/0361293 | A1* | 12/2014 | Yamazaki | H01L 29/78696 257/43 |
| 2015/0076491 | A1* | 3/2015 | Yamazaki | H01L 29/26 257/43 |
| 2015/0084042 | A1* | 3/2015 | Maeda | H01L 29/78696 257/43 |
| 2015/0084045 | A1* | 3/2015 | Yamazaki | H01L 27/1222 257/43 |
| 2015/0155505 | A1* | 6/2015 | Yamazaki | H01L 51/0097 257/40 |
| 2015/0165477 | A1 | 6/2015 | Yamazaki et al. | |
| 2015/0179803 | A1* | 6/2015 | Yamazaki | H01L 29/7869 257/43 |
| 2015/0187818 | A1* | 7/2015 | Miyake | H01L 27/1225 257/43 |
| 2015/0187855 | A1* | 7/2015 | Yamazaki | H01L 27/3262 257/40 |
| 2015/0187951 | A1* | 7/2015 | Endo | H01L 29/7869 257/43 |
| 2015/0187952 | A1* | 7/2015 | Yamazaki | H01L 29/7869 257/43 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-250745 | A | 9/1996 |
| JP | 08-264794 | A | 10/1996 |
| JP | 08-288522 | A | 11/1996 |
| JP | 10-125931 | A | 5/1998 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2003-174153 | A | 6/2003 |
| JP | 2004-103957 | A | 4/2004 |
| JP | 2004-273614 | A | 9/2004 |
| JP | 2004-273732 | A | 9/2004 |
| WO | WO-2004/114391 | | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD D9 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest D7 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest D4 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

(56) References Cited

OTHER PUBLICATIONS

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YBFE2O4, and YB2FE3O7 Types of Structures for Compounds in the IN2O3 and SC2O3—A2O3—BO Systems [A; Fe, Ga, Or Al; B: Mg, Mn, Fe, Ni, Cu, Or Zn] At Temperatures over 1000°C", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest D8 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest D9 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 277-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

(56) References Cited

OTHER PUBLICATIONS

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 2, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Worskshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 6

| | (1) SiO$_2$/WO$_3$ | | (2) WO$_3$/WO$_3$ | |
|---|---|---|---|---|
| Structure | | | | |
| Bond energy [eV] | A | B | A | B |
| | 5.06 | 3.73 | 3.77 | |

| | (3) WO$_3$/W |
|---|---|
| Structure | |
| Bond energy [eV] | A |
| | 2.31 |

H
O
Si
W

| | W(VI)-O, W(VI)-N |  |
|---|---|---|
| Structure | | |
| Bond energy [eV] | A | B |
| | 2.54 | 2.89 |

| | (2)' WO$_3$/WO$_3$ |  |
|---|---|---|
| Structure | | |
| Bond energy [eV] | A | B |
| | 2.97 | |

H
O
N
W

FIG. 26A1
FIG. 26A2
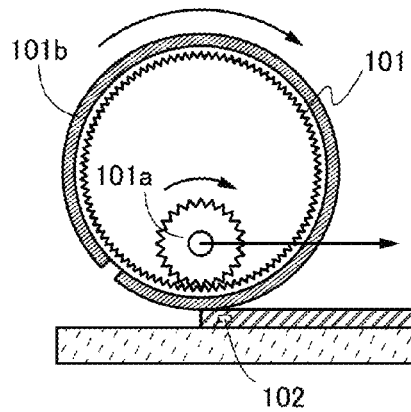
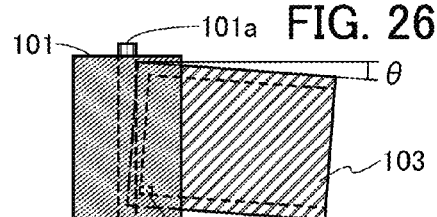
FIG. 26B1
FIG. 26B2
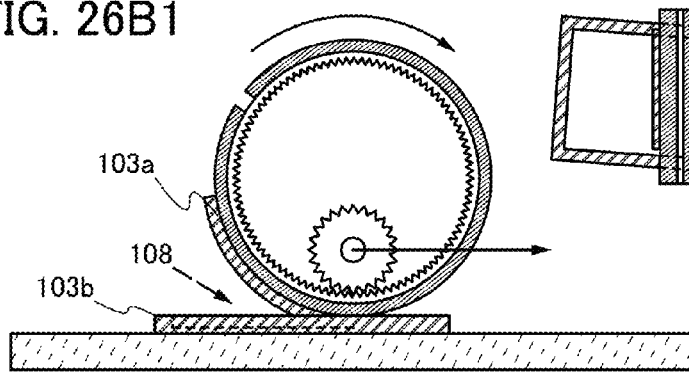
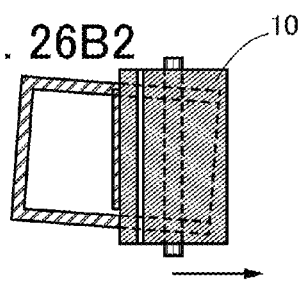
FIG. 26C2
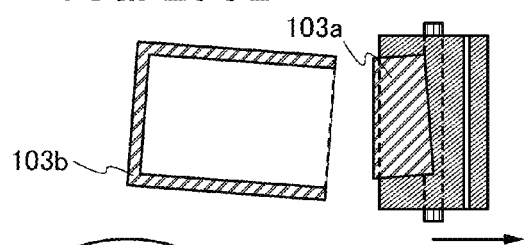
FIG. 26C1
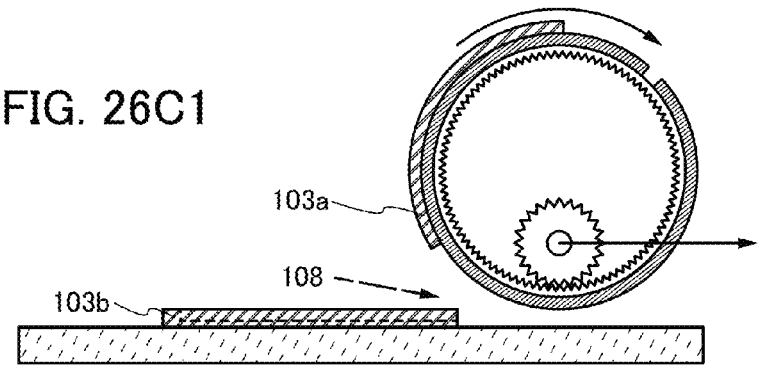

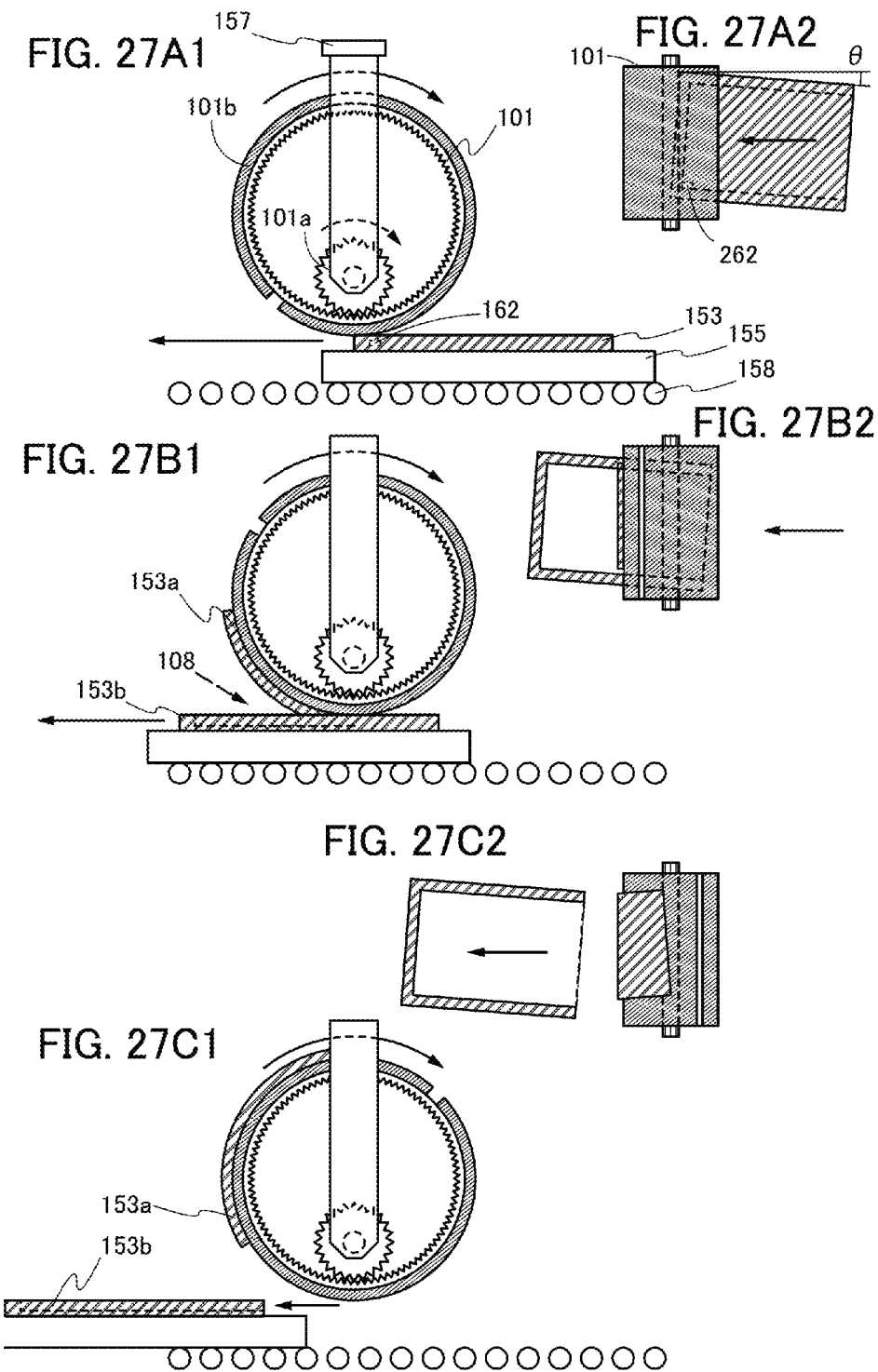

Transistor A        Transistor B

Transistor C     Transistor D

SEMICONDUCTOR DEVICE

BACKGROUND OF THE INVENTION

1. Field of the Invention

One embodiment of the present invention relates to an object, a method, or a manufacturing method. The present invention relates to a process, a machine, manufacture, or a composition of matter. One embodiment of the present invention relates to a semiconductor device, a display device, a light-emitting device, a lighting device, an electronic device, or a manufacturing method thereof. One embodiment of the present invention particularly relates to a semiconductor device including an oxide semiconductor and a method for manufacturing the semiconductor device.

Note that in this specification, a semiconductor device refers to any device that can function by utilizing semiconductor characteristics, and an electro-optical device, a semiconductor circuit, and an electronic device are all included in the category of semiconductor devices.

2. Description of the Related Art

In recent years, a flexible device in which a functional element such as a semiconductor element, a display element, or a light-emitting element is provided over a substrate having flexibility (hereinafter also referred to as a flexible substrate) has been developed. Typical examples of the flexible device include, as well as a lighting device and an image display device, a variety of semiconductor circuits including a semiconductor element such as a transistor.

As a method for manufacturing a device including a flexible substrate, a technique has been developed in which a functional element such as a thin film transistor or an organic electroluminescence (EL) element is formed over a formation substrate (e.g., a glass substrate or a quartz substrate), and then the functional element is transferred to a flexible substrate. This technique needs a step of peeling a layer to be separated including the functional element from the formation substrate.

In this specification, a step of peeling a layer to be separated from a formation substrate by mechanical force or a step of peeling the formation substrate from the layer to be separated by mechanical force is referred to as a substrate peeling process. Furthermore, a method for peeling a layer to be separated from a formation substrate by mechanical force or a method for peeling the formation substrate from the layer to be separated by mechanical force is referred to as a substrate peeling method. These are the step and the method for peeling the substrate to peel a necessary structure with less damage, which are different from those for peeling unnecessary objects, for example, for peeling a resist or the like by photolithography or the like.

For example, Patent Document 1 discloses the following peeling technique using laser ablation: a separation layer formed of amorphous silicon or the like is formed over a substrate, a layer to be peeled which is formed of a thin film element is formed over the separation layer, and the layer to be peeled is bonded to a transfer body with the use of a bonding layer. The separation layer is ablated by laser light irradiation, so that peeling is generated in the separation layer.

Peeling and transfer techniques described in Patent Documents 2 and 3 are proposed. Patent Document 2 discloses a peeling technique in which a silicon oxide film serving as a peeling layer is removed by wet etching. In addition, Patent Document 3 discloses a peeling technique in which a silicon film serving as a peeling layer is removed by dry etching.

A peeling and transfer technique described in Patent Document 4 is proposed. Patent Document 4 discloses a technique in which a metal layer (Ti, Al, Ta, W, Mo, Cu, Cr, Nd, Fe, Ni, Co, Ru, Rh, Pd, Os, or Ir) is formed over a substrate and an oxide layer is stacked thereover. In this technique, when the oxide layer is formed, a metal oxide layer of the metal layer is formed at an interface between the metal layer and the oxide layer, and peeling is carried out in a later step by utilizing this metal oxide layer.

REFERENCE

Patent Document

[Patent Document 1] Japanese Published Patent Application No. H10-125931
[Patent Document 2] Japanese Published Patent Application No. H8-288522
[Patent Document 3] Japanese Published Patent Application No. H8-250745
[Patent Document 4] Japanese Published Patent Application No. 2003-174153

SUMMARY OF THE INVENTION

Display devices include EL display devices, electronic paper, and liquid crystal display devices. Among these, active matrix EL display devices capable of displaying high-resolution images are particularly attracting attention. In an active matrix EL display device, where a plurality of switching elements is disposed in a pixel, voltage is applied to a light-emitting element electrically connected to at least one of the switching elements, whereby electrons and holes are separately injected from a pair of electrodes into a layer containing a light-emitting organic compound, and current flows. The carriers (electrons and holes) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

The application range of active matrix display devices is expanding and demand for larger screen size, higher definition, and higher aperture ratio is increasing. In addition, it is demanded that a production method of the active matrix display device offer high fabrication yield and reduced production cost.

In the manufacture of an active matrix display device, in the case where a plurality of different circuits is formed over an insulating surface, for example, where a pixel portion and a driver circuit are formed over one substrate, excellent switching characteristics such as a high on-off ratio are needed for a transistor used for the pixel portion, and high operation speed is needed for a transistor used for the driver circuit. In particular, as the definition of the display device is increased, writing time of a display image is reduced; therefore, it is preferable that the transistor used for the driver circuit operate at high speed.

An object is to provide a semiconductor device in which plural kinds of circuits are formed over one substrate and plural kinds of thin film transistors are provided corresponding to characteristics of the plural kinds of circuits.

In order to display an image on a display device, a large number of image signals need to be supplied to the display device. Further, a large number of wirings are needed to connect a device for supplying image signals (e.g., a main body of an electronic device) to the display device. For example, about 640 wirings are needed for VGA. Accordingly, the wirings occupy volume in part of the display device, which might limit the flexibility in design such as the size of the electronic device and the position of the display device.

It is preferable to reduce the number of external connection terminals also in the case of pursuing a reduction in the power consumption of the display device. In particular, as the screen size of a display module is increased, a larger number of pixel transistors are controlled to display an image of one frame. Thus, it is preferable to use a transistor in which high on-state current has priority, for a driving circuit. Furthermore, in order to achieve low power consumption, a transistor in which low off-state current has priority is preferably used for the pixel portion. In addition, as the definition of a display module is increased, the number of external connection terminals (also referred to as the number of pins) and the number of signal wirings are increased. A display module in which a pixel portion and a driver circuit are formed over one substrate can have fewer external connection terminals and fewer signal wirings than a display module not having a structure in which a pixel portion and a driver circuit are formed over one substrate.

In view of such a background, it is preferable that the number of external connection terminals in a display device be reduced.

Another object of one embodiment of the present invention is to provide a manufacturing method of a semiconductor device, a light-emitting device, a display device, an electronic device, a lighting device, or the like with high reliability. Furthermore, another object of one embodiment of the present invention is to provide a manufacturing method of a semiconductor device, a light-emitting device, a display device, an electronic device, a lighting device, or the like with a high degree of flexibility in shape.

When peelability at a peeling interface is low at the time of peeling of a semiconductor element from a support substrate, high stress is applied to the semiconductor element, breaking the semiconductor element in some cases. To prevent the breakage of the semiconductor element, it is necessary to peel the substrate very slowly, which degrades throughput in some cases.

In view of the above, another object of one embodiment of the present invention is to provide a peeling method with improved peelability, or the like. Another object of one embodiment of the present invention is to improve yield or throughput in a substrate peeling process. Another object of one embodiment of the present invention is to improve yield or throughput in a manufacturing process of a device such as a semiconductor device, a light-emitting device, a display device, an electronic device, or a lighting device. In particular, another object of one embodiment of the present invention is to improve yield or throughput in a manufacturing process of a semiconductor device, a light-emitting device, a display device, an electronic device, or a lighting device which is lightweight, thin, or flexible.

Another object of one embodiment of the present invention is to provide a novel peeling method or a novel stack manufacturing method.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to a flexible display device including a transistor using an oxide semiconductor layer and a method for manufacturing the flexible display device.

Another embodiment of the present invention is a display device including the following components: a first flexible substrate; a first bonding layer; a first insulating film; a first element layer that includes a pixel portion including a first transistor including an oxide semiconductor layer and a display element and that includes a circuit portion including a second transistor including an oxide semiconductor layer; a second element layer including a coloring layer and a light-blocking layer; a second insulating film; a second bonding layer; and a second flexible substrate, where the above components are stacked in this order.

The oxide semiconductor layer included in the first transistor may be a single layer, and the oxide semiconductor layer included in the second transistor may be a multilayer.

The oxide semiconductor layer included in the first transistor preferably has the same composition as a layer in contact with a gate insulating film of the oxide semiconductor layer included in the second transistor.

The pixel portion and the circuit portion are formed over the first flexible substrate in the following manner: an inorganic film such as a tungsten film is formed over a first substrate; the first insulating film is formed thereover; the pixel portion including the first transistor and the circuit portion including the second transistor are formed over the first insulating film; the first substrate is separated; and the first insulating film is bonded to the first flexible substrate with the first bonding layer.

For example, in the case where the tungsten oxide film which is tightly anchored by $N_2O$ plasma or the like is formed on an inorganic film such as a tungsten film, adhesion can be relatively high in deposition. After that, when a separation trigger is formed, cleavage occurs therefrom, whereby a layer to be separated can be easily separated from the formation substrate and transferred to another substrate. When a bond of M-O—W (M represents a given element) is divided by application of physical force, a liquid is absorbed into the gap, whereby peeling energy is reduced because of a hydrogen bond and the bond becomes bonds of M-OH HO—W with a longer bond distance, and the separation can be promoted.

Note that, when the substrate is peeled, a liquid may be sprayed in an atomized form or in a vaporized form. As the liquid, pure water, an organic solvent, a neutral solution, an alkaline solution, an acid solution, a solution into which salt is dissolved, or the like can be used. The liquid used when the substrate is peeled preferably includes $H_2O$.

The temperature of the liquid and the substrate at the time of mechanical separation is preferably higher than 0° C. and lower than 100° C., and preferably 60° C. or higher and 90° C. or lower.

In the case of bending a device, there is a problem in that cracks are generated by force applied when the device is bent. A resin substrate or a resin film might be changed in quality (expanded and contracted, swelled, cured, or the like) through a step of applying heat (heat treatment, deposition process, or the like) or a step using moisture (cleaning treatment or the like). There is also a problem in that degassing occurs when the resin substrate or the resin film is exposed to vacuum. Furthermore, the resin substrate or the resin film does not have, though depending on the material, a blocking property against impurities and moisture. Thus, when a barrier layer is provided on the surface of the resin substrate or the resin film, the barrier layer is formed at a temperature lower than or equal to the upper temperature limit of the resin substrate or the resin film, so that it is difficult to obtain a barrier layer with an excellent blocking property.

In the case where mass production of devices is performed by depositing films over a resin film, for example, a manufacturing apparatus, a carrying apparatus, or the like that can carry the resin film might have a complicated structure. Furthermore, if a manufacturing apparatus in which a thin film can be used as a base is newly purchased, capital investment is increased. Thus, it is preferable that a film be formed on a glass substrate, the glass substrate be carried, a device be formed over the glass substrate, and then the glass substrate be separated and the device be placed on a resin film.

Another embodiment of the present invention is a substrate peeling method including: a first step of forming a separation layer over a substrate; a second step of forming a layer to be separated over the separation layer; a third step of forming a first surface subjected to peeling and a second surface subjected to peeling by peeling part of the layer to be separated from the substrate; a fourth step of expanding the areas of the peeled first surface and the peeled second surface by mechanical force to carry on the peeling of the layer to be separated; a fifth step of supplying a liquid to at least part of the first surface subjected to peeling or the second surface subjected to peeling; a sixth step of transferring the liquid supplied in the fifth step to at least part of each of the first surface subjected to peeling, the second surface subjected to peeling, and a bonding portion of the first surface subjected to peeling and the second surface subjected to peeling by carrying on the peeling by mechanical force; and a seventh step of reducing peeling energy of at least part of a bond of the bonding portion of the first surface subjected to peeling and the second surface subjected to peeling by using a chemical bond to the liquid.

In the above substrate peeling method, a hydrogen bond may be used as the chemical bond to the liquid in the seventh step.

In the above substrate peeling method, the separation layer may be a layer including tungsten. Furthermore, in the above substrate peeling method, the separation layer may be a single layer or a plurality of layers of a layer containing at least one material selected from tungsten, molybdenum, titanium, tantalum, silicon, and aluminum.

In the above substrate peeling method, the liquid supplied in the fifth step may include $H_2O$. Furthermore, in the above substrate peeling method, the temperature of the liquid supplied in the fifth step is preferably higher than 0° C. and lower than 100° C.

In the above substrate peeling method, after the separation layer is formed, oxidation treatment may be performed on at least part of the separation layer. As the oxidation treatment, plasma treatment under an atmosphere containing $N_2O$ is preferably used. Furthermore, in the above substrate peeling method, the separation layer may be formed by a sputtering method under an atmosphere containing oxygen. Furthermore, the separation layer may be a layer containing oxygen.

In the above substrate peeling method, a roller is preferably used in the separation step.

In the above substrate peeling method, a semiconductor layer may be included in the layer to be separated. The semiconductor layer may be an oxide semiconductor layer. The oxide semiconductor layer may be formed using one or a plurality of In-M-Zn oxide (M is Al, Ti, Ga, Y, Zr, La, Ce, Nd, or Hf) layers. Furthermore, the oxide semiconductor layer may include a c-axis aligned crystal.

In the above substrate peeling method, the layer to be separated may include a functional element such as an organic EL element.

The thickness of the separation layer is preferably greater than or equal to 0.1 nm and less than or equal to 200 nm. In the case of using a tungsten film as the separation layer, a tungsten oxide film is preferably formed between the tungsten film and a first layer. The formation of the tungsten oxide film enables the layer to be separated to be separated with weak force.

When the separation is performed, a roller such as a drum roller can be used. Part of the roller surface may have stickness. For example, an adhesive tape or the like may be put on part of the roller surface. By rotating the roller, the layer to be separated is wound and separated from the substrate having an insulating surface.

After the separation, metal oxide or metal such as the tungsten oxide film is left on the surface subjected to peeling on the layer to be separated side in some cases. In this case, parasitic capacitance might be generated to adversely affect the characteristics of a functional element. Thus, a step of removing metal oxide or metal such as the tungsten oxide film left on the surface subjected to peeling on the layer to be separated side may be performed after the step of separating the separation layer and the layer to be separated.

In the manufacturing method, the resin substrate and the resin film are provided immediately before or after the separation from the glass substrate; thus, the resin substrate and the resin film do not go through a formation process (including a cleaning step, a deposition step, a vacuum heating step, and the like) of the functional element such as a transistor. Thus, the device structure is sandwiched between resin films without damage, so that a high reliable semiconductor device can be obtained.

Furthermore, the semiconductor device obtained through the manufacturing method also has the following feature: at least a buffer layer provided between the separation layer and the transistor includes hydrogen and a p-type impurity element or an n-type impurity element, and stress can be relieved by adjusting the content of hydrogen and a p-type impurity element or an n-type impurity element. Therefore, the buffer layer including at least the p-type impurity element or the n-type impurity element can suppress generation of cracks.

The buffer layer is formed using a silicon oxide film, a silicon nitride film, a silicon oxynitride film, an aluminum oxide film, an aluminum nitride film, an aluminum oxynitride film, an yttrium oxide film, or the like, and the boron concentration in the buffer layer measured by SIMS is set to be higher than or equal to $1\times10^{16}/cm^3$, preferably set to be higher than or equal to $1\times10^{19}/cm^3$ and lower than or equal to $1\times10^{21}/cm^3$.

The buffer layer may be formed by depositing the aluminum oxide film, the yttrium oxide film, or the like by an aerosol deposition (AD) method. Alternatively, the buffer layer may have a stacked-layer structure, and for example, a silicon oxynitride film formed by a plasma CVD method and an aluminum oxide film deposited by the aerosol deposition method may be stacked. When the deposition by the aerosol deposition method is performed under reduced pressure, a stacked layer can be formed without exposure to the air.

Furthermore, the buffer layer is not limited to an insulating film and may be a metal film, a semiconductor film such as an amorphous silicon film, or a stacked layer thereof as long as the layer contains hydrogen.

In addition, the present invention can be applied regardless of an element structure, e.g., a transistor structure. For example, a top gate transistor, a bottom gate (inverted staggered) transistor, or a forward stagger transistor can be used. Moreover, the transistor is not limited to a transistor having a single-gate structure; a multi-gate transistor having a plurality of channel formation regions, such as a double-gate transistor, may be used.

A large display device using a resin film can be manufactured, and not only a passive-matrix liquid crystal display device or a passive-matrix light-emitting device but also an active-matrix liquid crystal display device or an active-matrix light-emitting device can be manufactured.

Additionally, the resin film used for the base refers to a plastic substrate that is formed as a film, for example, a plastic substrate made from polyimide (PI), an aramid resin, polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), a silicone resin, or the like. The resin film includes a flexible substrate. The resin film includes a fiber or the like (e.g., a prepreg). Furthermore, a base is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

One embodiment of the present invention can achieve a semiconductor device that has a curved shape or is bendable by using a flexible resin film. One embodiment of the present invention can suppress generation of cracks inside a bendable semiconductor device at the time of or after manufacturing the semiconductor device, and can achieve a highly reliable semiconductor device.

One embodiment of the present invention can improve yield or throughput in a substrate peeling process.

One embodiment of the present invention can improve yield or throughput in a manufacturing process of a device such as a semiconductor device, a light-emitting device, a display device, an electronic device, or a lighting device. In particular, one embodiment of the present invention can improve yield or throughput in a manufacturing process of a semiconductor device, a light-emitting device, a display device, an electronic device, or a lighting device which is lightweight, thin, or flexible.

One embodiment of the present invention can provide a novel substrate peeling method or a novel substrate peeling method of a stack. One embodiment of the present invention can provide a substrate peeling method of a highly reliable light-emitting device or the like.

BRIEF DESCRIPTION OF THE DRAWINGS

In the accompanying drawings:
FIG. 6 shows calculation results of bond energies of an embodiment;
FIGS. 26A1 to 26C2 illustrate a structure and operation of a peeling apparatus of one embodiment of the present invention;
FIGS. 27A1 to 27C2 illustrate a structure and operation of a peeling apparatus of one embodiment of the present invention.

DETAILED DESCRIPTION OF THE INVENTION

Figure 1A:
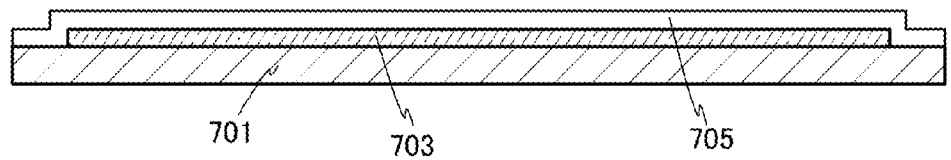
FIGS. 1A to 1D illustrate a substrate peeling method.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatch pattern is applied to similar functions, and these are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, size, range, or the like disclosed in the drawings and the like.

A layer to be separated can be formed over a formation substrate, separated from the formation substrate, and then transferred to another substrate. With this method, for example, a layer to be separated which is formed over a formation substrate having high heat resistance can be transferred to a substrate having low heat resistance. The forming temperature of the layer to be separated is not limited by a substrate having low heat resistance. The layer to be separated is transferred to a substrate or the like that is more lightweight, thin, or flexible than the formation substrate, whereby a variety of devices such as a semiconductor device, a light-emitting device, or a display device that are lightweight, thin, and flexible can be manufactured.

Furthermore, electronic devices including the variety of devices, such as television devices, monitors for computers, cameras such as digital cameras and digital video cameras, digital photo frames, cellular phones, portable game machines, portable information terminals, and audio reproducing devices, can be made lightweight, thin, and flexible.

A device that can be manufactured using a substrate peeling method of one embodiment of the present invention includes a functional element. Examples of the functional element include a semiconductor element such as a transistor; a light-emitting diode; a light-emitting element such as an inorganic EL element and an organic EL element; and a display element such as a liquid crystal element. For example, a semiconductor device including a sealed transistor and a light-emitting device including a sealed light-emitting element (here, a display device including a transistor and a light-emitting element which are sealed is also included) are also examples of the device that can be manufactured according to the present invention.

As a specific example, since an organic EL element is likely to deteriorate due to moisture or the like, it is preferable that a protective film having an excellent moisture-proof property be formed over a glass substrate at a high temperature and transferred to a flexible organic resin substrate having low heat resistance and a poor moisture-proof property. A highly reliable flexible light-emitting device can be manufactured by forming an organic EL element over the protective film transferred to the organic resin substrate.

As another example, a protective film having an excellent moisture-proof property may be formed over a glass substrate at a high temperature, and an organic EL element may be formed over the protective film. After that, the protective film and the organic EL element may be separated from the glass substrate and transferred to a flexible organic resin substrate having low heat resistance and a poor moisture-proof property. A highly reliable flexible light-emitting device can be manufactured by transferring the protective film and the organic EL element to the organic resin substrate.

In this specification, the term peeling energy refers to energy needed for carrying on peeling by cutting a bond between atoms.

Embodiment 1

In this embodiment, a method for manufacturing a bendable or foldable device that can be used in an electronic device of one embodiment of the present invention, or the like will be described with reference to FIGS. 1A to 1D, FIGS. 2A to 2D, and FIGS. 3A to 3D. Note that examples of the bendable or foldable device include a display device, a light-emitting device, an input device, and the like. Examples of the input device include a touch sensor, a touch panel, and the like. Examples of the light-emitting device include an organic EL panel, a lighting device, and the like. Examples of the display device include a light-emitting device, an organic EL panel, a liquid crystal display device, and the like. Note that a function of the input device such as a touch sensor may be provided in a display device or a light-emitting device. For example, a counter substrate (e.g., a substrate not provided with a transistor) of a display device or a light-emitting device may be provided with a touch sensor. Alternatively, an element substrate (e.g., a substrate provided with a transistor) of the display device or the light-emitting device may be provided with a touch sensor. Still alternatively, the counter substrate and the element substrate of the display device or the light-emitting device may be provided with touch sensors.

Figure 1B:
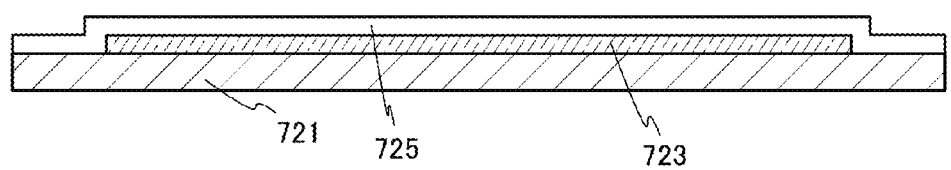

First, a separation layer 703 is formed over a formation substrate 701, and a layer 705 to be separated (hereinafter referred to as a layer 705) is formed over the separation layer 703 (FIG. 1A). In addition, a separation layer 723 is formed over a formation substrate 721, and a layer 725 to be separated (hereinafter referred to as a layer 725) is formed over the separation layer 723 (FIG. 1B).

For example, in the case where a tungsten film is used as the separation layer, oxidation such as plasma treatment in an atmosphere of a gas containing oxygen, such as $N_2O$, heat treatment in an atmosphere of a gas containing oxygen, or sputtering in an atmosphere of a gas containing oxygen is performed on the tungsten film, whereby a tungsten oxide film can be formed between the tungsten film and the layer 705.

At the time of a separating and transferring process, it is preferable that the tungsten oxide film be mainly tungsten oxide, that is, $WO_x$ whose x is smaller than 3. In the case where tungsten oxide is $W_nO_{(3n-1)}$ or $W_nO_{(3n-2)}$, which is a homologous series, shear is easily caused by heating because there is a crystal optical shear plane in the tungsten oxide. Forming the tungsten oxide film by $N_2O$ plasma treatment enables separation of the layer to be separated from the substrate with weak force.

Alternatively, the tungsten oxide film can be directly formed without forming the tungsten film. For example, by performing plasma treatment in an atmosphere of a gas containing oxygen, heat treatment in an atmosphere of a gas containing oxygen, or sputtering in an atmosphere of a gas containing oxygen on a sufficiently thin tungsten film, only the tungsten oxide film may be formed as the separation layer.

At this time, when the separation is performed at the interface between the layer 705 and the tungsten oxide film, at the interface between the tungsten film and the tungsten oxide film, or in the tungsten oxide film, the tungsten oxide film is left on the layer to be separated side in some cases. When the tungsten oxide film is left, parasitic capacitance may be generated. Thus, after a step of separating the separation layer and the layer to be separated, the step of removing the tungsten oxide film is preferably included. Note that in the case where the generation of parasitic capacitance is not a problem or is preferable, $N_2O$ plasma treatment is not necessarily performed; thus, the step of removing the tungsten oxide film can be omitted. In that case, the device can be manufactured more easily.

In one embodiment of the present invention, a tungsten film with a thickness of greater than or equal to 0.1 nm and less than 200 nm is formed over the substrate.

As the separation layer, a film containing molybdenum, titanium, vanadium, tantalum, silicon, aluminum, or an alloy thereof can be used, besides a tungsten film. Furthermore, it is also possible to use a stack of such a film and its oxide film. The separation layer is not limited to an inorganic film, and an organic film such as polyimide may be used.

In the case of using an organic resin for the separation layer, a process temperature needs to be lower than or equal to 350° C. when low-temperature polysilicon is used as an active layer of a transistor. Thus, dehydrogenation baking for silicon crystallization, hydrogenation for termination of defects in silicon, or activation of a doped region cannot be performed sufficiently, so that the performance of the transistor is limited. On the other hand, in the case of using an inorganic film, the process temperature is not limited to 350° C., and excellent characteristics of a transistor can be obtained.

In the case of using the organic resin for the separation layer, the organic resin or a functional element is damaged in some cases by laser irradiation at the time of crystallization; thus, it is preferable to use an inorganic film for the separation layer because such a problem is not caused.

Furthermore, in the case of using the organic resin for the separation layer, the organic resin shrinks by laser irradiation for separating the resin and contact failure is caused in the contact portion of the terminal of an FPC or the like, which makes it difficult for functional elements with many terminals in a high-definition display, or the like to be separated and transferred with high yield. In the case of using an inorganic film for the separation layer, there is no such limitation, and functional elements with many terminals of a high-definition display or the like can be separated and transferred with high yield.

In the peeling method of a functional element from a substrate of one embodiment of the present invention, an insulating layer or a functional element such as a transistor can be formed over a formation substrate at a temperature of lower than or equal to 600° C., for example. In that case, low-temperature polysilicon can be used for a semiconductor layer. With use of a conventional manufacturing line for low-temperature polysilicon, semiconductor devices with a high operation speed, a high gas barrier property, and high reliability can be mass-produced. In that case, with use of the insulating layer and the transistor formed through a process at 600° C. or lower, for example, insulating layers having an excellent gas barrier property formed at a temperature of lower than or equal to 600° C. can be provided above and below an organic EL element. Accordingly, for example, entry of impurities such as moisture into the organic EL element or the semiconductor layer can be suppressed, whereby an extraordinarily reliable light-emitting device can be obtained as compared with the case of using an organic resin or the like for the separation layer.

Alternatively, the insulating layer or the functional element such as a transistor can be formed over the formation substrate at a temperature of 500° C. or lower. In that case, an oxide semiconductor can be used for the semiconductor layer, and mass production is possible with use of an existing production line for an oxide semiconductor or a manufacturing line for low-temperature polysilicon or the like. Also in that case, with use of the insulating layer and the transistor formed through the process at 500° C. or lower, for example, insulating layers having an excellent gas barrier property formed at 500° C. or lower can be provided above and below the organic EL element. Accordingly, for example, the entry of impurities such as moisture into the organic EL element or the semiconductor layer can be suppressed, whereby a very highly reliable light-emitting device can be obtained as compared with the case of using an organic resin for the separation layer.

Alternatively, the insulating layer or the functional element such as a transistor can be formed over the formation substrate at a temperature of 400° C. or lower. In that case, amorphous silicon, an oxide semiconductor, or the like can be used for the semiconductor layer, and mass production is possible with use of a conventional production line for amorphous silicon. Also in that case, with use of the insulating layer and the transistor formed through the process at 400° C. or lower, for example, insulating layers having an excellent gas barrier property formed at 400° C. or lower can be provided above and below the organic EL element. Accordingly, for example, the entry of impurities such as moisture into the organic EL element or the semiconductor layer can be suppressed, whereby a highly reliable light-emitting device can be obtained as compared with the case of using an organic resin or the like for the separation layer.

Figure 1C:
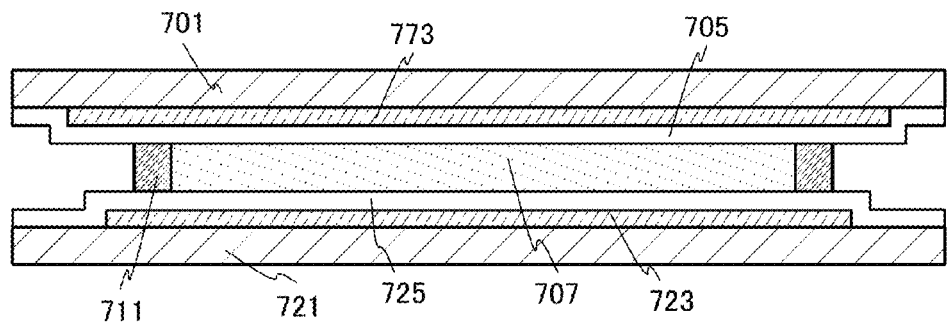

Next, the formation substrate 701 and the formation substrate 721 are attached to each other by using a bonding layer 707 and a frame-like bonding layer 711 so that the surfaces over which the layers to be separated are formed face each other, and then, the bonding layer 707 and the frame-like bonding layer 711 are cured (FIG. 1C). Here, the frame-like bonding layer 711 and the bonding layer 707 in a region surrounded by the frame-like bonding layer 711 are provided over the layer 725 and after that, the formation substrate 701 and the formation substrate 721 face each other and are attached to each other.

Note that the formation substrate 701 and the formation substrate 721 are preferably attached to each other in a reduced-pressure atmosphere.

Figure 1D:
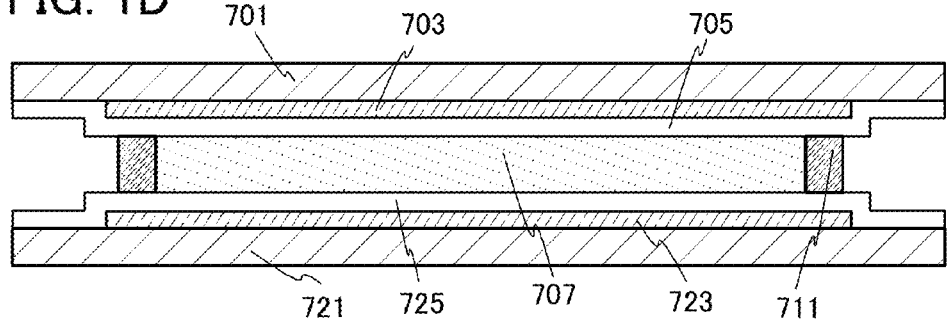

Note that although FIG. 1C illustrates the case where the separation layer 703 and the separation layer 723 are different in size, separation layers having the same size as illustrated in FIG. 1D may be used.

The bonding layer 707 is provided to overlap with the separation layer 703, the layer 705, the layer 725, and the separation layer 723. Then, edges of the bonding layer 707 are preferably positioned inside an area between at least edges of either the separation layer 703 or the separation layer 723 (the separation layer which is desirably separated from the substrate first). Accordingly, strong adhesion between the formation substrate 701 and the formation substrate 721 can be suppressed; thus, a decrease in yield of a subsequent substrate peeling process can be suppressed.

Figure 2A:
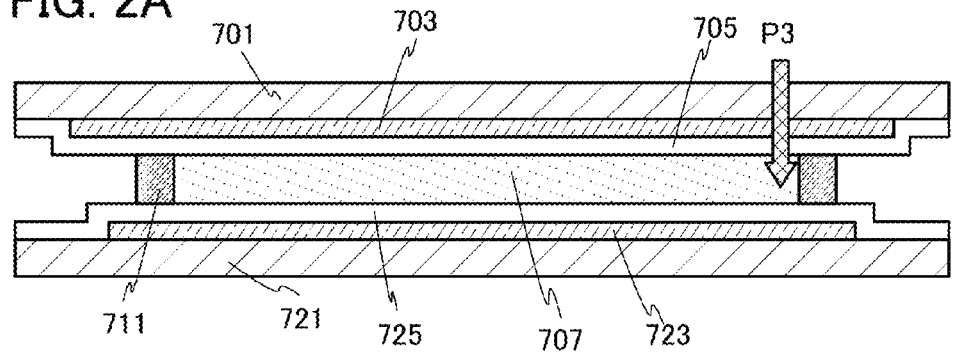
FIGS. 2A to 2D illustrate a substrate peeling method.
Figure 2B:
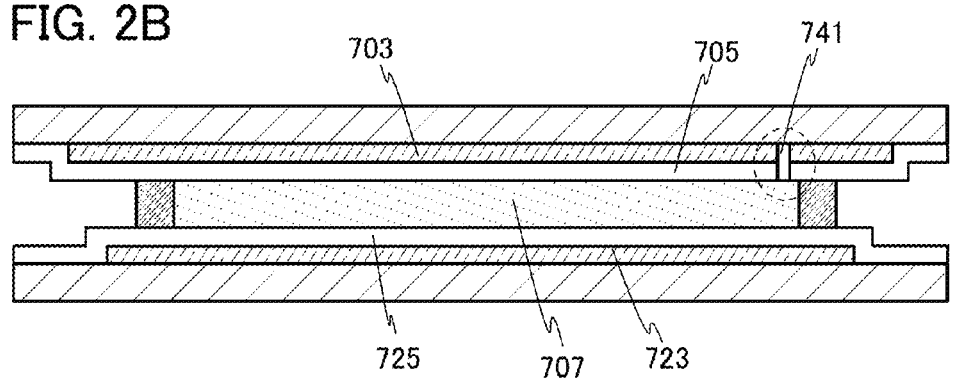

Next, a first trigger 741 for separation from the substrate is formed by laser irradiation (FIGS. 2A and 2B).

Either the formation substrate 701 or the formation substrate 721 may be separated first. In the case where the separation layers differ in size, a substrate over which a larger separation layer is formed may be separated first or a substrate over which a smaller separation layer is formed may be separated first. In the case where an element such as a semiconductor element, a light-emitting element, or a display element is formed over only one of the substrates, the substrate on the side where the element is formed may be separated first or the other substrate may be separated first. Here, an example in which the formation substrate 701 is separated first is described.

A region where the bonding layer 707 in a cured state or the frame-like bonding layer 711 in a cured state, the layer 705, and the separation layer 703 overlap with one another is irradiated with laser light. Here, the bonding layer 707 is in a cured state and the frame-like bonding layer 711 is not in a cured state, and the bonding layer 707 in a cured state is irradiated with laser light (see an arrow P3 in FIG. 2A).

Part of the first layer is removed; thus, the first trigger 741 for separation from the substrate can be formed (see a region surrounded by a dashed line in FIG. 2B). At this time, not only the first layer but also the separation layer 703, the bonding layer 707, or another layer included in the layer 705 may be partly removed.

It is preferred that laser light irradiation be performed from the side of the substrate provided with the separation layer that is desirably separated. In the case where a region where the separation layer 703 and the separation layer 723 overlap with each other is irradiated with laser light, the formation substrate 701 and the separation layer 703 can be selectively separated by cracking only the layer 705 of the layers 705 and 725 (see the region surrounded by the dotted line in FIG. 2B).

When a trigger for separation from the substrate is formed in both the layer 705 on the separation layer 703 side and the layer 725 on the separation layer 723 side in the case where the region where the separation layer 703 and the separation layer 723 overlap with each other is irradiated with laser light, it might be difficult to selectively separate one of the formation substrates. Therefore, laser light irradiation conditions are restricted so that only one of the layers to be separated is cracked, in some cases. The method for forming the first trigger 741 for separation from the substrate is not limited to laser light irradiation, and the first trigger 741 for separation from the substrate may be formed by a sharp knife such as a cutter.

Figure 2C:
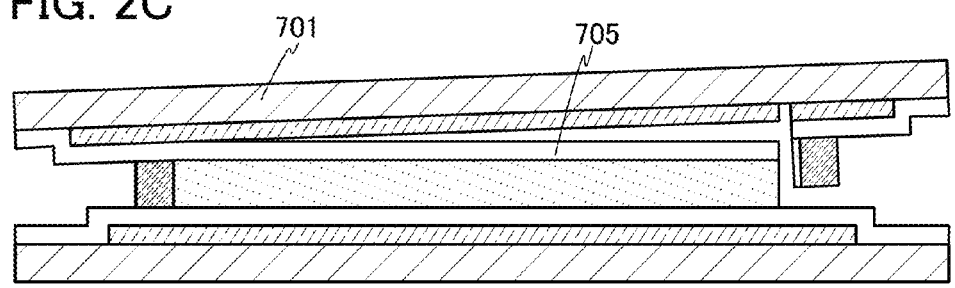
Figure 2D:
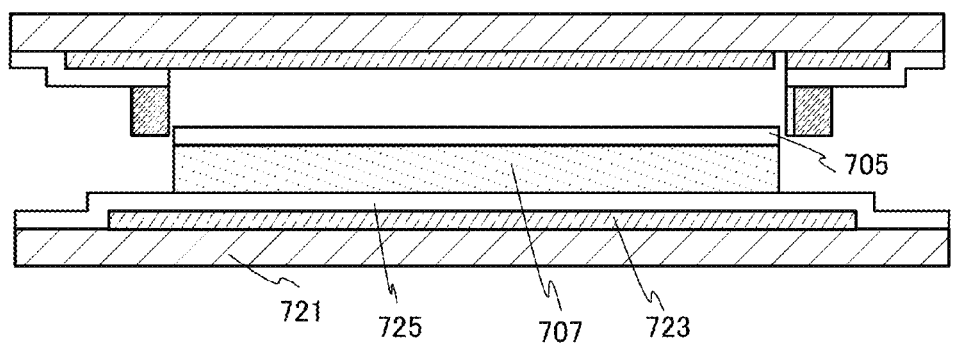

Then, the layer 705 and the formation substrate 701 are separated from each other from the first trigger 741 for separation from the substrate (FIGS. 2C and 2D). Consequently, the layer 705 can be transferred from the formation substrate 701 to the formation substrate 721.

Figure 3A:
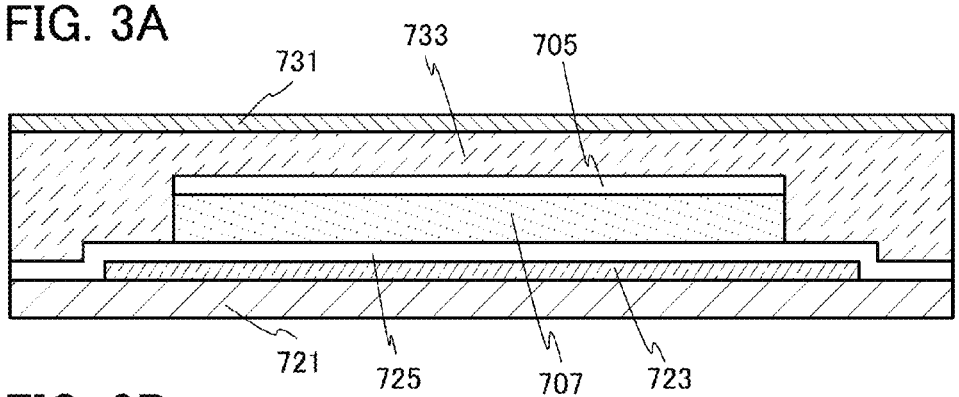
FIGS. 3A to 3D illustrate a substrate peeling method.

The layer 705 that is separated from the formation substrate 701 in the step in FIG. 2D is attached to a substrate 731 with a bonding layer 733, and the bonding layer 733 is cured (FIG. 3A).

Figure 3B:
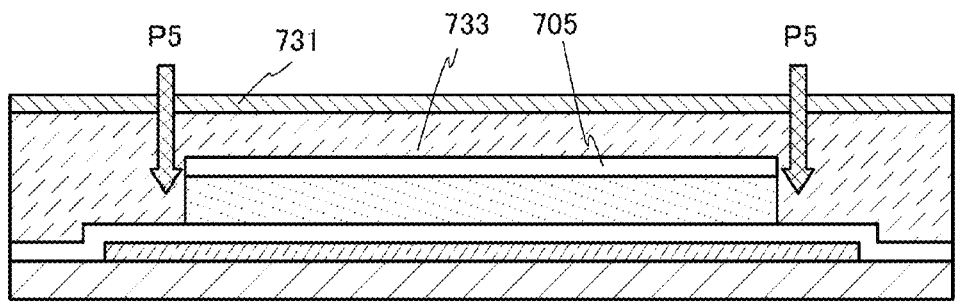
Figure 3C:
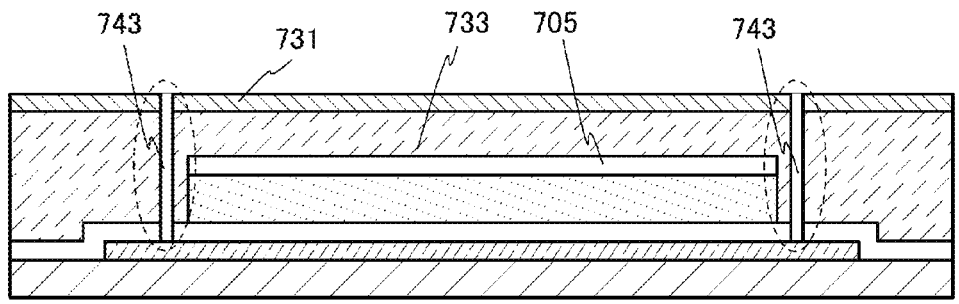
Figure 3D:
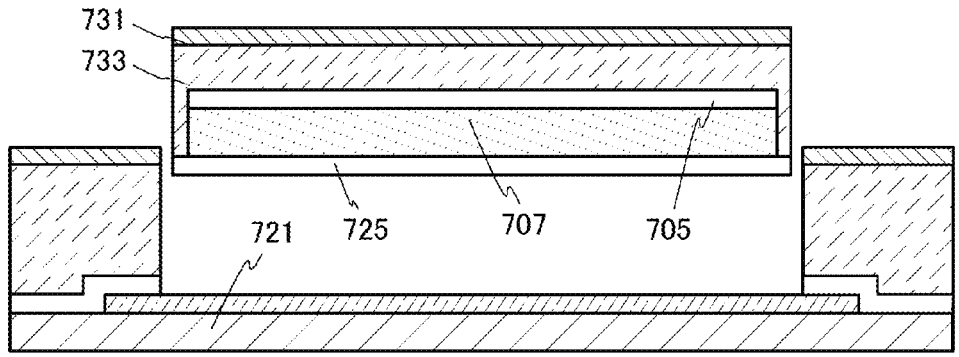

Next, a second trigger 743 for separation from the substrate is formed by a sharp knife such as a cutter (FIGS. 3B and 3C). The method for forming the second trigger 743 for separation from the substrate is not limited to a sharp knife such as a cutter, and the second trigger 743 for separation from the substrate may be formed by laser light irradiation or the like.

In the case where the substrate 731 on the side where the separation layer 723 is not provided can be cut by a knife or the like, a cut may be made in the substrate 731, the bonding layer 733, and the layer 725 (see arrows P5 in FIG. 3B). Consequently, part of the first layer can be removed; thus, the second trigger 743 for separation from the substrate can be formed (see a region surrounded by a dashed line in FIG. 3C).

In the case where there is a region in which the formation substrate 721 and the substrate 731 are attached to each other using the bonding layer 733 without overlapping with the separation layer 723 as illustrated in FIGS. 3B and 3C, yield of a subsequent substrate peeling process might be decreased depending on the degree of adhesion between the formation substrate 721 and the substrate 731. Therefore, a cut is preferably made in a frame shape in a region where the bonding layer 733 in a cured state and the separation layer 723 overlap with each other to form the second trigger 743 for separation from the substrate in the form of a solid line. This can improve the yield of the substrate peeling process.

Then, the layer 725 and the formation substrate 721 are separated from each other from the second trigger 743 for separation from the substrate (FIG. 3D), so that the layer 725 can be transferred from the formation substrate 721 to the substrate 731.

For example, in the case where the tungsten oxide film, which is tightly anchored by $N_2O$ plasma or the like is formed on an inorganic film such as a tungsten film, adhesion can be relatively high in deposition. After that, when a separation trigger is formed, cleavage occurs therefrom, whereby a layer to be separated can be easily separated from a formation substrate and transferred to another substrate.

The formation substrate 721 and the layer 725 may be separated from each other by filling the interface between the separation layer 723 and the layer 725 with a liquid such as water. A portion between the separation layer 723 and the layer 725 absorbs a liquid through a capillarity action. Accordingly, an adverse effect on the functional element such as an FET included in the layer 725 due to static electricity caused at the time of separation from the substrate (e.g., a phenomenon in which a semiconductor element is damaged by static electricity) can be suppressed.

When a bond of M—O—W (M represents a given element) is divided by application of physical force, moisture is absorbed into the gap, whereby the bond becomes bonds of M—OH HO—W with a longer bond distance and the separation is promoted.

Note that a liquid may be sprayed in an atomized form or in a vaporized form. Examples of liquids include pure water, an organic solvent, a neutral, alkali, or acid aqueous solution, and an aqueous solution in which a salt is dissolved.

The temperature of the liquid and the substrate at the time of mechanical separation is set in the range from room temperature to 120° C., and preferably set to 60° C. to 90° C.

In the substrate peeling method in one embodiment of the present invention described above, separation of the formation substrate is performed in such a manner that the second trigger 743 for separation from the substrate is formed by a sharp knife or the like so that the separation layer and the layer to be separated are made in a separable state. This can improve the yield of the substrate peeling process.

In addition, bonding of a substrate with which a device is to be formed can be performed after the following procedure: a pair of formation substrates each provided with a layer to be separated are attached to each other and the formation substrates are individually separated. Therefore, formation substrates having low flexibility can be attached to each other when the layers to be separated are attached to each other, whereby alignment accuracy at the time of attachment can be improved compared with the case where flexible substrates are attached to each other.

Embodiment 2

In this embodiment, a peeling mechanism relating to the substrate peeling method of one embodiment of the present invention is described.

[Consideration of Peeling Area]

In the substrate peeling method of one embodiment of the present invention, peeling occurs in an oxide layer interposed between a separation layer and a layer to be separated. At this time, it is important, in examining the peeling mechanism, to examine in which of the following three areas a bond is most likely to be cut: an interface between the separation layer and the oxide layer, an interface between the oxide layer and the layer to be separated, and the inside of the oxide layer. The bond energy in each of the three areas was estimated to examine in which of the areas peeling is likely to be generated.

In this embodiment, the case where a tungsten (W) film and a silicon oxide ($SiO_2$) film are used for the separation layer and the layer to be separated, respectively is examined. Furthermore, the oxide layer is assumed to be oxide containing $WO_3$, which is an oxide of hexavalent W.

Figure 4A:
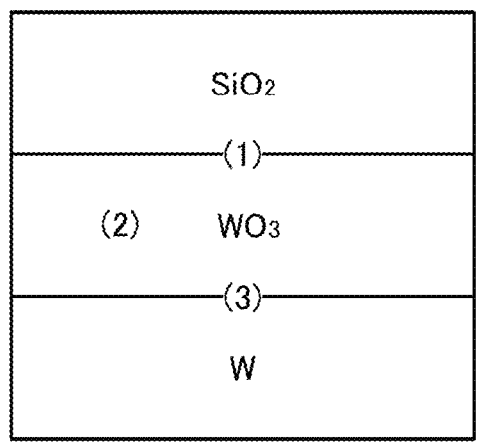
FIGS. 4A and 4B illustrate a model used for calculation of an embodiment.

FIG. 4A shows peeling areas used in calculation. In the structure shown in FIG. 4A, $WO_3$, which is an oxide of hexavalent W, is present between W and $SiO_2$.

In FIG. 4A, there can be three areas where the bond can be cut because of peeling: (1) $SiO_2$/$WO_3$ interface, (2) inside of $WO_3$, and (3) $WO_3$/W interface. The bond energy of each area was calculated as described below.

Figure 4B:
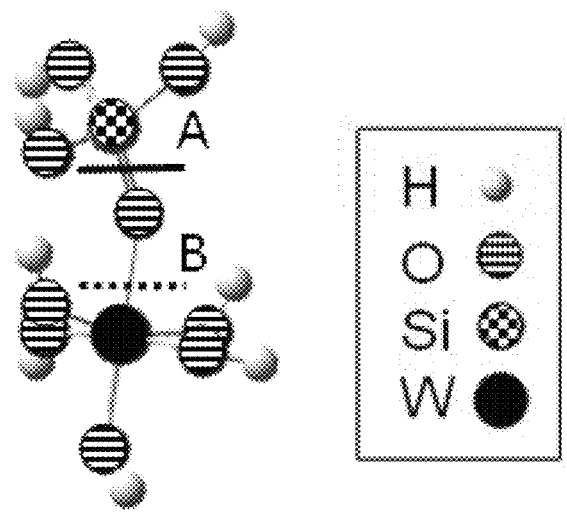

A cluster model was used as a calculation model. FIG. 4B shows an example of the cluster model. FIG. 4B shows a cluster model used for the calculation of the bond energy between $SiO_2$ and $WO_3$. In the cluster model shown in FIG. 4B, oxygen atoms bonded to Si and W are terminated with hydrogen (H) atoms. The bond energy of two areas, in the cluster model, of the Si atom side (A) and the W atom side (B), between which an oxygen (O) atom cross-linking between Si and W is interposed, is calculated.

For the calculation of the bond energy, structure optimization and vibration analysis were performed using density functional theory. As a functional, B3LYP was used. The electric charge was 0, and a singlet state, a doublet state, and a quintet state were considered for the spin multiplicities. In addition, LanL2DZ was adopted as a basis function for all atoms. Note that Gaussian 09 was used as the quantum chemistry computational program. A high performance computer (Altix 4700, manufactured by SGI Japan, Ltd.) was used for the calculations. The zero point correction was added to the calculated bond energy.

Note that in the cluster model, atoms other than the cross-linking O atom have a high degree of freedom and are positioned to stabilize the energy. In fact, however, these atoms cannot move freely because of the adjacent atoms. Therefore, it needs to be noted that there might be a slight difference in energy value between the cluster model and an actual system because of their different degrees of freedom.

Figure 5:
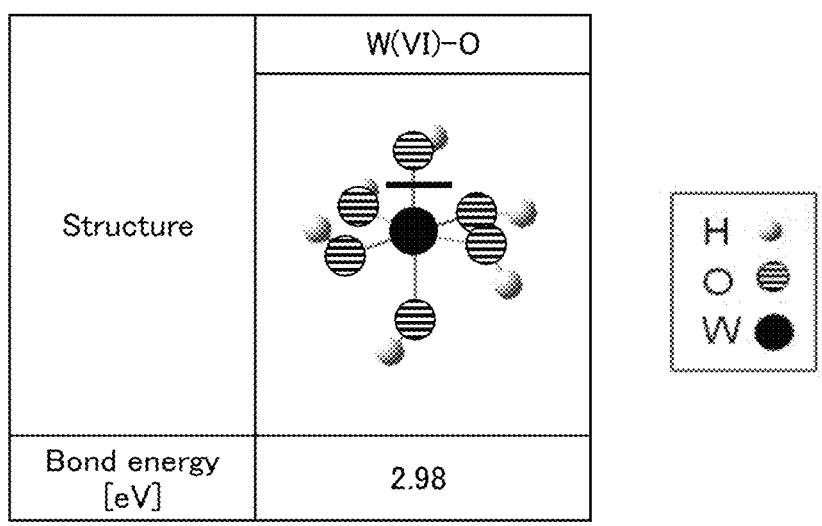
FIG. 5 shows a calculation result of bond energy of an embodiment.

FIG. 5 shows calculated bond energy between a W atom and an O atom in $WO_3$ having a hexavalent W atom. A cluster model in which a dangling bond of an O atom is terminated with an H atom is used in the following description unless otherwise specified.

According to FIG. 5, the bond energy of the W—O bond in the hexavalent W atom is 2.98 eV.

FIG. 6 shows the bond energy calculated in consideration of the areas shown in FIG. 4A.

According to FIG. 6, the W—O bond (B) energy in (1) $SiO_2$/$WO_3$ interface is 3.73 eV, which is lower than the Si—O bond (A) energy. This indicates that peeling occurs more easily from the W—O bond side than from the Si—O bond side. When $WO_3$ is included, peeling tends to occur easily.

In the above calculation, an example of $WO_3$ is shown; however, the composition of tungsten oxide is not limited to this example. According to Non-Patent Document A (*Crystals and Crystal Structures*, Richard J. D. Tilley), very slight reduction to a composition of $WO_{2.9998}$ from $WO_3$ results in faults on {120} planes, and as the composition approaches $WO_{2.97}$, the faults tend to become ordered. It is known that tungsten oxide has a shear plane represented by $W_nO_{3n-1}$ ($WO_2$, $W_2O_5$, $W_3O_8$, $W_4O_{11}$, . . . , $W_{18}O_{53}$, . . . , $W_{30}O_{89}$, . . . ), which is a homologous series. When reduction is continued, faults lie on {130} planes, and tungsten oxide has a shear plane represented by $W_nO_{3n-2}$ ($W_{15}O_{46}$, $W_{16}O_{46}$, . . . , $W_{25}O_{73}$, . . . ), which is a homologous series.

Thus, the tungsten oxide film preferably has a composition represented by $W_nO_{3n-1}$, $W_nO_{3n-2}$, or the like.

[Effect of N Atom]

As described above, the W—O bond is cut easily because of $WO_3$ at the time of peeling from the substrate. In view of this, how the bond energy is affected by replacement of the O atom cross-linking between the two W atoms with an N atom is analyzed.

Here, the bond energy of a W—N bond at the time when an NH group is introduced instead of the O atom cross-linking between two W atoms was calculated.

Figure 7:
FIG. 7 shows calculation results of bond energies of an embodiment.

A cluster model in which one O atom is replaced with an NH group in $WO_3$ having a hexavalent W atom is shown in the upper part of FIG. 7. The W—O bond energy and the W—N bond energy of $WO_3$ were calculated.

According to FIG. 7, the bond energy (2.54 eV) of the W—N bond is lower than that (2.89 eV) of the W—O bond. In addition, the W—O bond energy (2.89 eV) of the model in FIG. 7 is lower than that (2.98 eV) of the model in FIG. 5, in which an N atom is not introduced. Thus, it is indicated that not only the W—N bond but also the W—O bond is cut easily by introducing the N atom.

Next, the calculated W—N bond energy in a model (2)' in which an O atom cross-linking between the two W atoms is replaced with an NH group in a cluster model (2) assuming inside of $WO_3$ shown in FIG. 4A is shown in the lower part of FIG. 7.

The bond energy (2.97 eV) in the case where the two W atoms are cross-linked by the NH group as shown in the model (2)' in FIG. 7 is lower than that (3.77 eV) in the case of the W—O bond as shown in the model (2) in FIG. 6.

The above results demonstrate that the bonds tend to be cut more easily by replacing the O atom cross-linking between the two W atoms with the N atom. This indicates that peeling from the substrate occurs more easily by supplying nitrogen to the oxide layer.

Therefore, in order to improve peelability, it is important to supply a larger number of nitrogen atoms to the oxide layer.

In the substrate peeling method of one embodiment of the present invention, the first layer from which nitrogen is released by heating and the second layer over the first layer which has a function of suppressing the release of nitrogen to the outside (i.e., blocks the release of nitrogen) are provided as the layer to be separated provided over the oxide layer. In addition, a large amount of nitrogen released from the layer to be separated by heat treatment is supplied to the oxide layer, so that the oxide layer can contain a large amount of nitrogen. Consequently, peelability from the substrate can be improved.

[Consideration of Improvement in Peelability from Substrate at the Time of Water Injection]

As described in Embodiment 1, liquid containing water is added to a peeling interface at the time of peeling from the substrate and the liquid penetrates into the peeling interface, so that peelability from the substrate is improved. The function of water in peeling is described below.

<Relationship Between Liquid Type and Peelability from Substrate>

Examination was performed to check whether the force required for peeling from the substrate varies depending on the type of liquid injected at the time of peeling from the substrate, and examination results are described.

Figure 8:
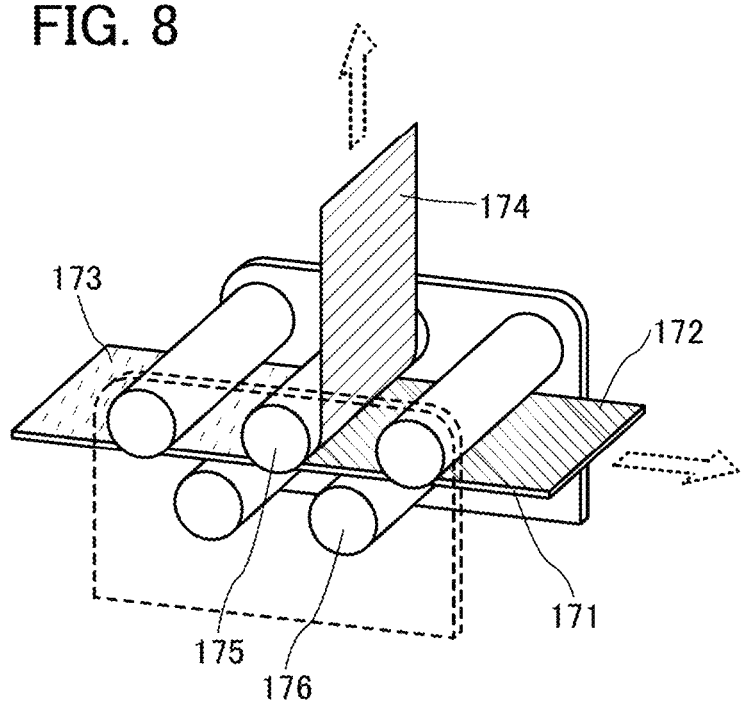
FIG. 8 illustrates a structural example of an apparatus used for a peeling test of an embodiment.

The force required for peeling from the substrate was examined with a jig illustrated in FIG. 8. The jig illustrated in FIG. 8 includes a plurality of guide rollers 176 and a plurality of support rollers 175. A tape 173 is attached onto a layer 174 including a layer to be separated which is formed over the support substrate 171 and an end portion of the tape 173 is partly peeled from the substrate in advance. Then, the support substrate 171 is fixed to the jig so that the tape 173 is held by the support rollers 175, and the tape 173 and the layer 174 including the layer to be separated are positioned perpendicular to the support substrate 171. The force required for peeling from the substrate can be measured as follows: when the tape 173 is pulled perpendicular to the support substrate 171 to peel the layer 174 including the layer to be separated from the support substrate 171, the force required for the pulling in the perpendicular direction is measured. During the peeling, the support substrate 171 moves in the plane direction along the guide rollers 176 with the separation layer 172 exposed. The support rollers 175 and the guide rollers 176 are rotatable so that the layer 174 including the layer to be separated and the support substrate 171 are not affected by friction during the move.

A sample used was manufactured as follows. First, an approximately 100-nm-thick silicon oxynitride film was formed over a glass substrate by a plasma CVD method, and then an approximately 50-nm-thick W film was formed as a separation layer by a sputtering method. After that, an approximately 600-nm-thick silicon oxynitride film was formed as a first layer and an approximately 50-nm-thick silicon nitride oxide film was formed as a second layer, and over the silicon nitride oxide film, an approximately 100-nm-thick silicon oxynitride film and an approximately 66-nm-thick silicon film were formed. After that, heat treatment was performed at 650° C. for 6 minutes. Next, the silicon film was irradiated with laser light to form polysilicon, and then a gate insulating film, a gate electrode, an interlayer insulating layer, a source and drain electrodes, and an interlayer insulating layer, an electrode, and the like are formed to manufacture a transistor. In a process after the heat treatment performed at 650° C. for 6 minutes, a step at temperatures of 650° C. or higher is not performed.

As described above, the sample in which the separation layer and the layer to be separated were provided over the glass substrate is manufactured.

Next, the support substrate was cut into a size of 20 mm×126.6 mm, and a UV film (UHP-0810MC produced by DENKI KAGAKU KOGYO KABUSHIKI KAISHA) was attached as the tape 173 to the cut support substrate by a tape mounter. After that, an approximately 20 mm of an end portion of the UV film was peeled from the substrate, and the sample was fixed to the jig.

For a peeling test, a compact table-top universal tester (EZ-TEST EZ-S-50N) manufactured by Shimadzu Corporation was used. For the peeling test, an adhesive tape/adhesive sheet testing method based on standard number JIS Z0237 of Japanese Industrial Standards (JIS) was referred to. Note that a liquid was dripped into a portion that was a boundary between a portion where peeling proceeded from the substrate and a portion where peeling did not proceed after the sample was fixed to the jig.

Figure 9:
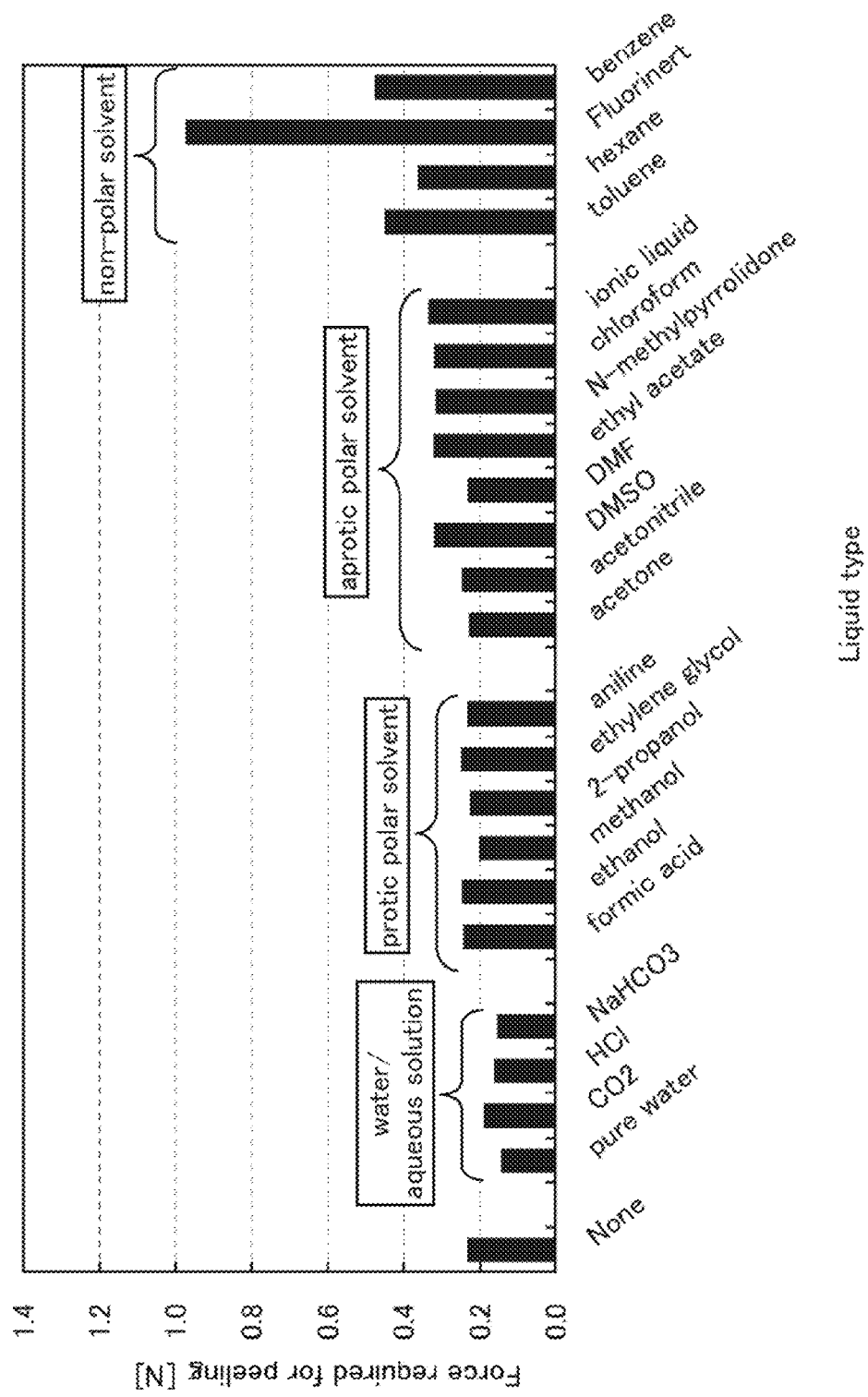
FIG. 9 shows a relationship between peelability and types of solutions used for peeling from a substrate of an embodiment.

FIG. 9 shows the force required for peeling from the substrate which was measured by changing the types of liquid supplied at the time of peeling from the substrate.

The liquid used for the measurement is broadly classified into four types: water/aqueous solution, a protic polar solvent, an aprotic polar solvent, and a non-polar solvent. As the water/aqueous solution, pure water, a $CO_2$ aqueous solution, an HCl aqueous solution, and an $NaHCO_3$ aqueous solution were used. As the protic polar solvent, formic acid, ethanol, methanol, 2-propanol, ethylene glycol, and aniline were used. As the aprotic polar solvent, acetone, acetonitrile, DMSO, DMF, ethyl acetate, N-methylpyrrolidone, chloroform, and N-methyl-N-n-pentylpyrrolidinium bis(trifluoromethylsulfonyl)imide that is ionic liquid were used. As the non-polar solvent, toluene, hexane, Fluorinert™, and benzene were used. In addition, the force required for peeling from the substrate without liquid injection was measured for comparison.

According to the results shown in FIG. 9, the force required for peeling from the substrate in the case of using the water or the aqueous solution that is liquid containing water tends to be lower, that is, peelability from the substrate tends to be higher than that in the case of not using liquid. On the other hand, the force required for peeling from the substrate tends to increase in the order of the protic polar solvent, the aprotic polar solvent, and the non-polar solvent. In particular, the use of the non-polar solvent has an adverse effect on the peelability from the substrate.

These results indicate that the presence of hydrogen (hydrogen ions) is involved when peelability from the substrate is improved by the injection of liquid to a peeling surface. The existence of hydrogen ions might work more effectively particularly when water or an aqueous system liquid is selected.

<Effect of Water Molecule>

Analysis results of the effect of a water molecule on peelability from the substrate, which were obtained by examining a peeling process in the case where a water molecule was introduced, is described below.

As described above, peeling might be less likely to occur in the case of W—O—W than in the case of W—N—W. Thus, calculation was performed focusing on the W—O bond energy in $WO_3$ which is higher than the W—N bond energy.

Figure 10A:
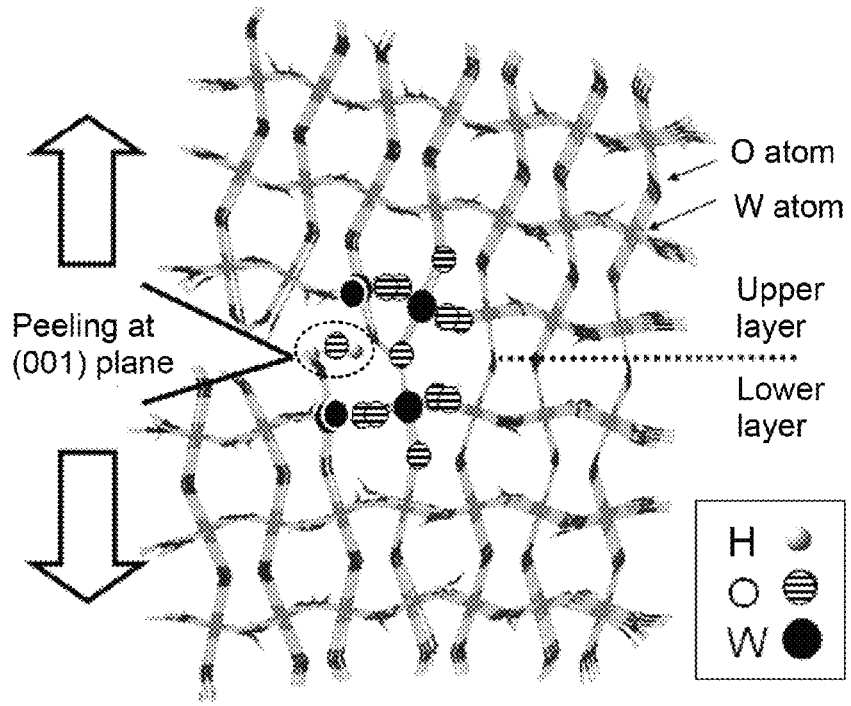
FIGS. 10A to 10C illustrate a model used for calculation of an embodiment.

FIG. 10A shows a model used for the calculation. Peeling occurs at a (001) plane in a $WO_3$ crystal structure. Here, a case is considered where peeling occurs at an O atom to which attention is paid and which cross-links between two W atoms and proceeds from the left side of FIG. 10A. On the left side of the O atom in FIG. 10A, there are separated upper and lower layers, while on the right side including the O atom in FIG. 10A, the upper and lower layers are connected. There are surfaces subjected to peeling on the upper left side and the lower left side in FIG. 10A. Here, the case where a water molecule surrounded by a dashed line is positioned close to the O atom to which attention is paid and the case where a water molecule surrounded by the dashed line is not positioned close to the O atom to which attention is paid are examined by calculation.

Then, the case where the upper surface area subjected to peeling and the lower surface area subjected to peeling are expanded by mechanical force is assumed, and peeling energy needed for separation of the bonding portion between the upper surface subjected to peeling and the lower surface subjected to peeling by mechanical force is estimated.

Figure 10B:
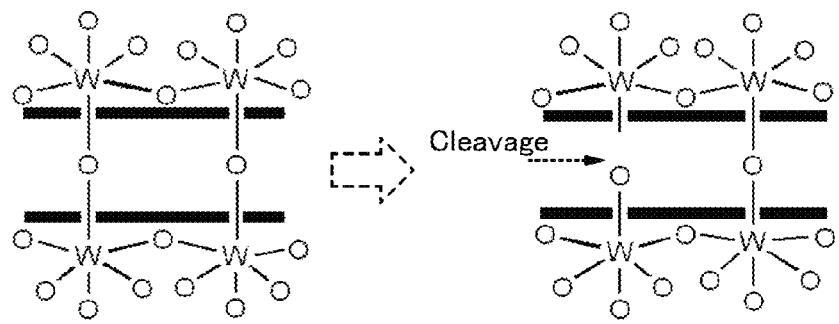

Next, the examined peeling process is described. In the case where a water molecule is not present, as shown in FIG. 10B, the W—O bond in which an O atom cross-links between two W atoms is cleaved at the time of peeling. Although the W atoms and the O atom have dangling bonds after the cleavage, atoms terminating the dangling bonds do not exist.

Figure 10C:
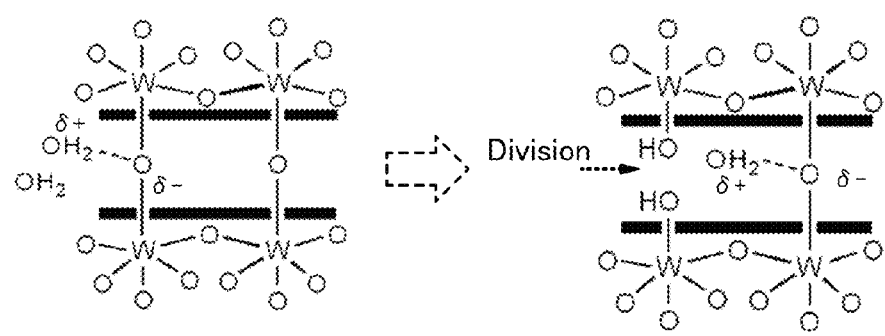

In contrast, in the case where a water molecule is present as shown in FIG. 10C, the water molecule probably forms a hydrogen bond with an O atom cross-linking between two W atoms before peeling. By the formation of the hydrogen bond, the O atom cross-linking the two W atoms is more negatively charged than that at the time when a hydrogen bond is not formed, and one of the H atoms which is involved in the hydrogen bond is more positively charged than the other H atom. As a result, the O atom and the H atom electrostatically work on each other to cause a moderating effect, which might lead to a weak W—O bond. In addition, the W—O bond is cleaved with peeling and the W atom and the O atom have dangling bonds; however, the dangling bonds are probably terminated with an H group and an OH group derived from the water molecule. A steric effect of two OH groups occurs because of the termination, which might lead to a weak W—O bond which is to be cleaved.

As described above, as effects of the water molecule on peeling from the substrate, the moderating effect due to the electrostatic interaction before peeling, the steric effect of the OH groups after peeling, and the like can be given. In the following description, the hypothesis that peeling from the substrate occurs easily because of these effects is verified.

An ONIOM method that is one of the quantum mechanics/molecular mechanics (QM/MM) methods was used for the calculation. For a QM region represented as circles in the calculation model in FIG. 10A, the density functional theory was used, B3LYP was used as a functional, and LanL2DZ was used as a basis function. For an MM region represented as poles, a universal force field was used as a force field. The electric charge was 0, and a singlet state was considered for spin multiplicities.

Figure 11A:
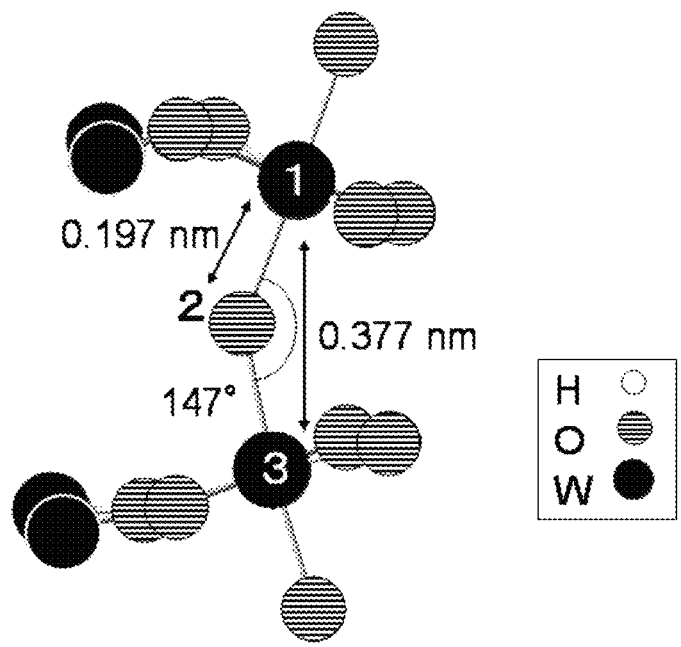
FIGS. 11A and 11B show calculation results of a structure in which an O atom cross-links between two W atoms of an embodiment.
Figure 11B:
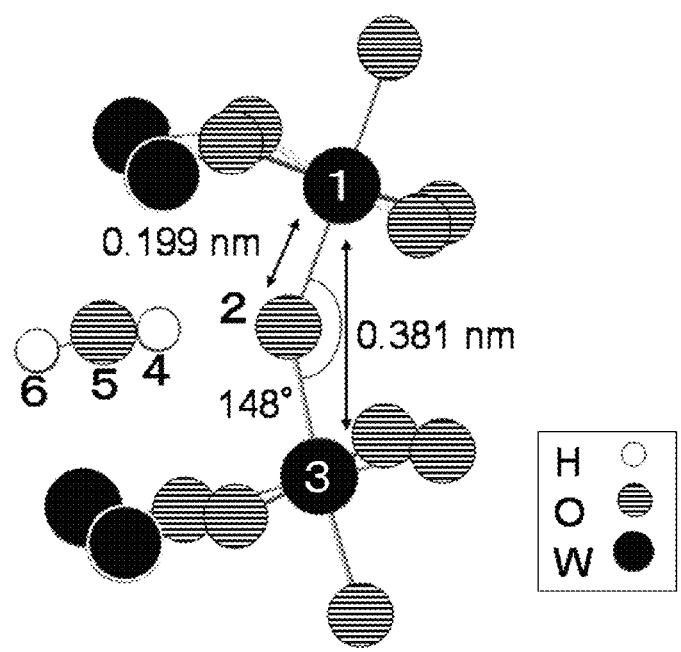

First, electric charge distributions and changes in structure at the time when a water molecule is present and when a water molecule is not present were analyzed. FIGS. 11A and 11B show structures in which an O atom cross-links between two W atoms at the time when a water molecule is not present and when a water molecule is present, respectively. Table 1 shows the electric charge (Mulliken charge) distribution in numbered atoms in FIGS. 11A and 11B.

TABLE 1

Electric Charge (Mulliken Charge) Distribution

| Atom | Without water molecule | With water molecule |
|---|---|---|
| 1W | 2.12 | 2.10 |
| 2O | −0.81 | −0.90 |
| 3W | 2.09 | 2.08 |
| 4H | — | 0.48 |
| 5O | — | −0.69 |
| 6H | — | 0.34 |

According to Table 1, in the structure in which an O atom cross-links between two W atoms before peeling, the charge of an O atom represented by 2 (hereinafter, 2O), which cross-links between the two W atoms, shifts in the negative direction because of the water molecule. This indicates that a hydrogen bond is formed between the water molecule and the O atom cross-linking between the two W atoms and an electron is attracted to the 2O atom. In addition, as for the bond length between 1W and 2O in the cross-linked structure, the bond length at the time when the water molecule is present is longer than that at the time when a water molecule is not present.

From the above results, it is presumed that an increase in the electron density of the hydrogen bond between a 4H atom in the water molecule and the 2O atom cross-linking between the two W atoms causes a decrease in the electron density of the 1W-2O bond, so that the 1W-2O bond is cut easily. The results indicate that the electrostatic interaction of the water molecule causes structure relaxation, so that peeling occurs easily.

In this embodiment, calculation was performed with an example in which peeling occurs easily because of a hydrogen bond in $H_2O$; however, the peeling energy may be reduced by using a hydrogen bond in a molecule other than $H_2O$. Furthermore, the peeling energy may be reduced using a chemical bond other than the hydrogen bond.

Figure 12A:
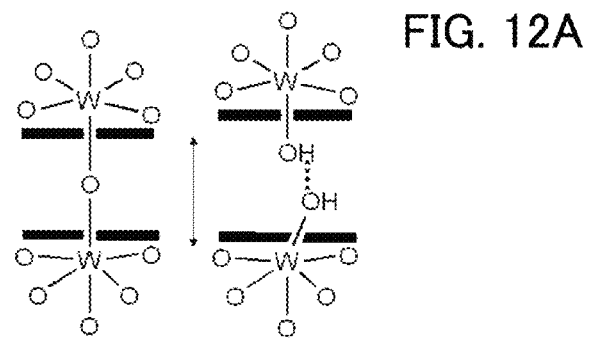
FIGS. 12A and 12B show a calculation result of a structure in which an O atom cross-links between two W atoms of an embodiment.

Next, the steric effect of two OH groups was examined. Assuming that dangling bonds are terminated with an H group and an OH group from a water molecule, as shown in FIG. 12A, the distance between an upper and lower layers is estimated to be long because of the steric repulsion (i.e., steric effect) of the two OH groups of the case where the dangling bonds of the two W atoms are terminated with the two OH groups (the right drawing) as compared to the case where two W atoms are cross-linked with an O atom (the left drawing).

Figure 12B:
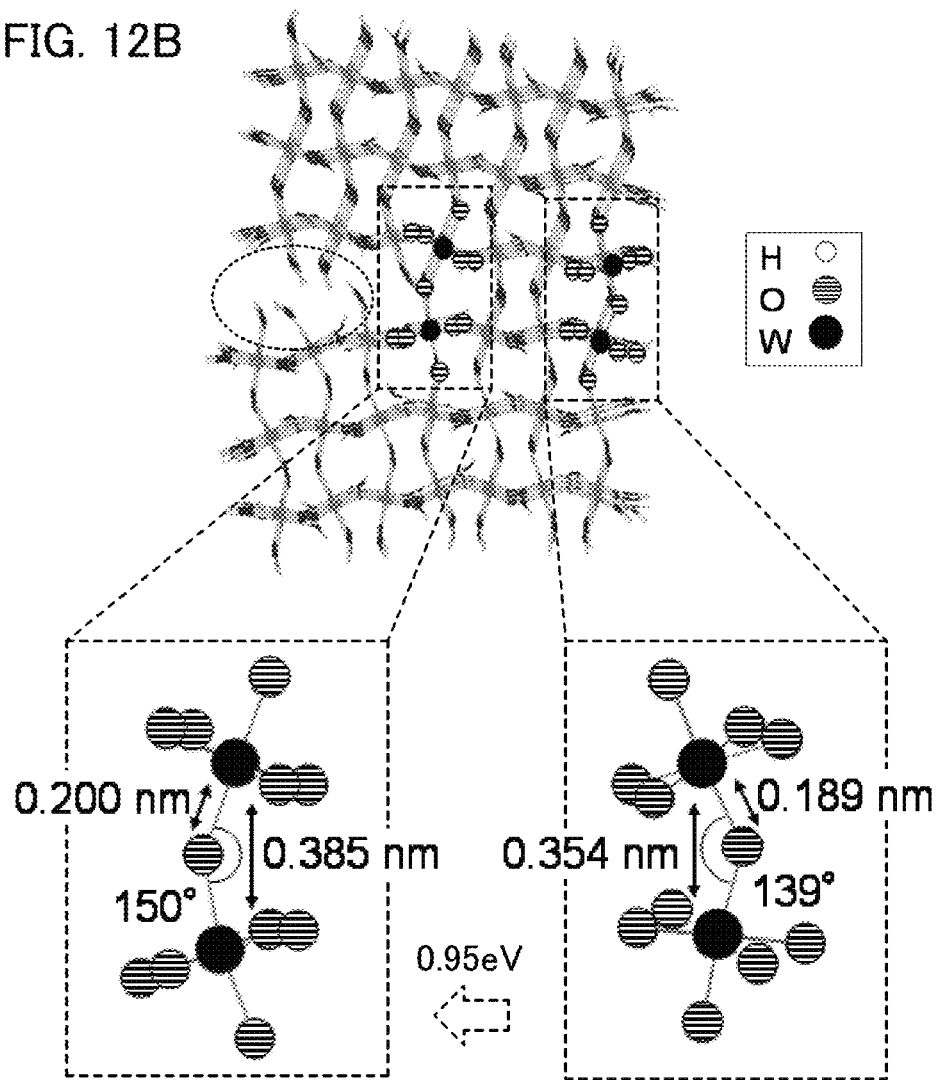

FIG. 12B shows an analyzed structure and an energy change. A region surrounded by an ellipse in FIG. 12B has steric effects of two OH groups. In the bottom part of FIG. 12B, enlarged structures in which two W atoms are cross-linked with an O atom in an area adjacent to the region with the steric effects and an area sufficiently away from the region are shown.

A comparison between the cross-linked structures of the two areas reveals that the steric effect of the two OH groups increases both the W—W bond length by approximately 0.031 nm and the W—O bond length by approximately 0.011 nm. This means that the W—O bond is weak and is cut easily. In addition, in the cross-linked structure in the area adjacent to the region with the steric effects, an upper and lower layers are extended in the opposite directions because of the steric effects, so that the energy is activated by approximately 0.95 eV; thus, the W—O bond is cleaved easily.

The above results indicate that peeling occurs easily because of the steric effects of the OH groups which are caused when the dangling bonds are terminated with the OH groups.

Next, the energy diagrams in the case where the dangling bonds are not terminated with the OH groups and in the case where the dangling bonds are terminated with the OH groups were examined. Here, a peeling process of tungsten oxide by physical force in the absence of a water molecule was considered. A reaction path and an energy diagram which were analyzed are shown in FIG. 13.

Figure 13:
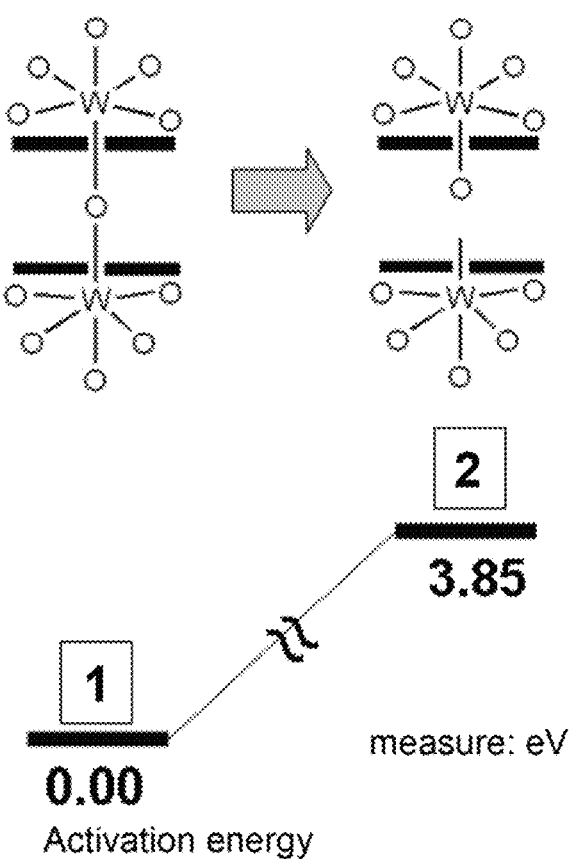
FIG. 13 shows a calculation result of an energy diagram of an embodiment.

As the reaction path, a process in FIG. 13 in which a reaction proceeds from State 1 to State 2 was considered. In State 1, an O atom cross-links between two W atoms. In State 2, the W—O bond has been cleaved and one W atom and one O atom each include one dangling bond.

Next, the hypothesis that the dangling bonds are terminated with the OH groups was examined. Here, in the presence of the water molecule, how hydrolysis of a water molecule occurs in a peeling process of tungsten oxide by physical force was considered. A reaction path and an energy diagram which were analyzed are shown in FIG. 14.

Figure 14:
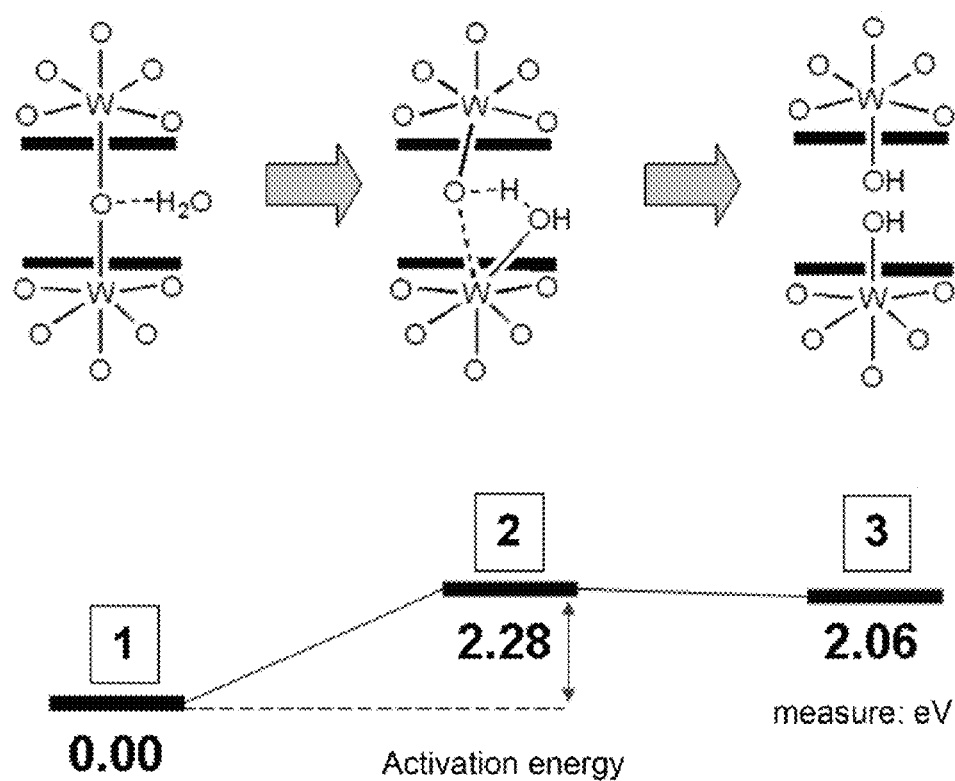
FIG. 14 shows a calculation result of an energy diagram of an embodiment.

As the reaction path, a process in FIG. 14 in which a reaction proceeds from State 1 to State 3 through State 2 was considered. In State 1, an O atom cross-linking between two W atoms and a water molecule have a weak interaction. State 2 is a transition state in which the O atom in the water molecule forms a bond with the W atom and an H atom derived from the water molecule moves close to the O atom cross-linking between two W atoms. In State 3, the W—O bond has been cleaved and two dangling bonds are terminated with two OH groups.

In the energy diagram shown in the bottom part of FIG. 14, State 1 is used as a reference. In State 2, which is the transition state in which the peeling and termination with the two OH groups occur at the same time, the activation energy is 2.28 eV. This activation energy is lower than the activation energy (3.61 eV) in the case where a water molecule is not present; this indicates that peeling occurs easily because of the water molecule.

In State 3 after the transition, the relative energy is 2.06 eV, which means that State 3 is not as stable as State 1. This is probably because of a steric effect of the two OH groups.

The above results reveal that performing peeling and termination of dangling bonds with two OH groups at the same time is advantageous in terms of energy. Peelability from the substrate is improved in a peeling process probably because of the above-described function of the water molecule.

This embodiment can be implemented in an appropriate combination with any of the other embodiments described in this specification.

Embodiment 3

In this embodiment, an example of a flexible display device that can be manufactured using one embodiment of the present invention is described. Note that "flexible device" means that a device that can be bent or warped. The flexibility can be utilized in an end product in some cases and utilized in a manufacturing process in some cases. In the latter case, the end product has no flexibility in some cases.

The "display device" in this specification means an image display device or a light source (including a lighting device). Further, the display device includes any of the following modules in its category: a module including a connector such as a flexible printed circuit (FPC), or tape carrier package (TCP); a module including TCP which is provided with a printed wiring board at the end thereof; and a module including a driver circuit which is directly mounted on a display element by a chip on glass (COG) method.

Figure 15:
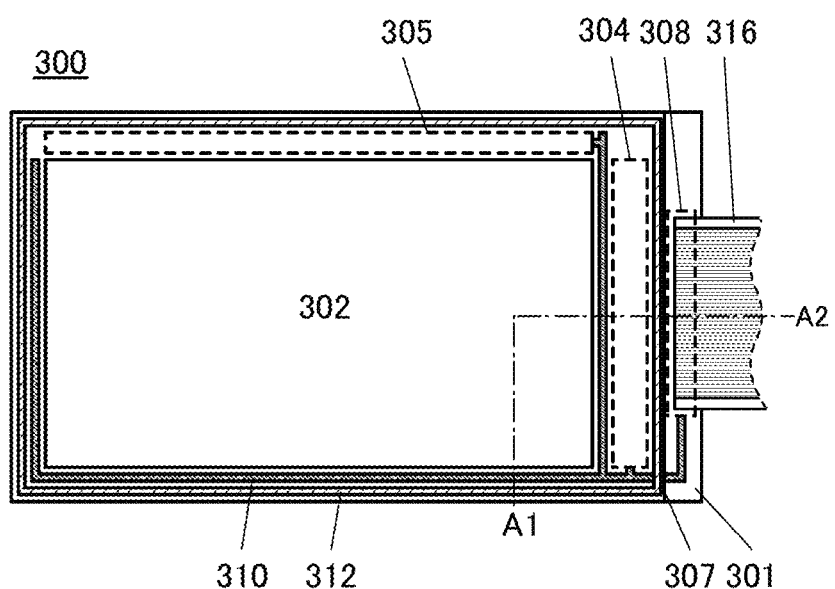
FIG. 15 illustrates an example of a light-emitting device.

FIG. 15 is a top view of a display device 300 that is one embodiment of the present invention. In FIG. 15, some components are enlarged, reduced in size, made to be visible, or omitted for easy understanding.

The display device 300 includes a pixel portion 302 over a first flexible substrate 301, a first circuit portion 304 and a second circuit portion 305 configured to drive the pixel portion, a sealant 312 provided to surround the pixel portion 302, the first circuit portion 304, and the second circuit portion 305, and a second flexible substrate 307 provided to face the first flexible substrate 301. Note that a signal line driver circuit (source driver) and a scan line driver circuit (gate driver) can be used, for example, as the first circuit portion 304 and the second circuit portion 305, respectively.

The first flexible substrate 301 and the second flexible substrate 307 are bonded to each other with the sealant 312. Although not shown in FIG. 15, a display element is provided between the first flexible substrate 301 and the second flexible substrate 307. In other words, the pixel portion 302, the first circuit portion 304, the second circuit portion 305, and the display element are sealed with the first flexible substrate 301, the sealant 312, and the second flexible substrate 307.

Furthermore, in the display device 300, an FPC terminal portion 308 (FPC: flexible printed circuit) that is electrically connected to the pixel portion 302, the first circuit portion 304, and the second circuit portion 305 is provided over the first flexible substrate 301 in a region different from a region surrounded by the sealant 312.

The FPC terminal portion 308 is connected to an FPC 316, and a variety of signals are supplied to the pixel portion 302, the first circuit portion 304, and the second circuit portion 305 with the FPC 316. In addition, signal lines 310 are connected to the pixel portion 302, the first circuit portion 304, the second circuit portion 305, and the FPC terminal portion 308. The variety of signals supplied from the FPC 316 are given to the pixel portion 302, the first circuit portion 304, and the second circuit portion 305 through the signal lines 310.

In FIG. 15, the circuits for driving the pixel circuit portion 302 are positioned in two regions; however, the structure of the circuit is not limited thereto. For example, the circuit may be positioned in one region. Alternatively, the circuit may be divided into three or more parts. Further alternatively, only one of the first circuit portion 304 and the second circuit portion 305 may be provided over the first flexible substrate 301, and the other circuit may be externally provided.

FIG. 15 shows an example in which a structure of a transistor 350 of the pixel portion 302 is different from that of a transistor 352 of the circuit for driving the pixel portion 302.

Figure 28A:
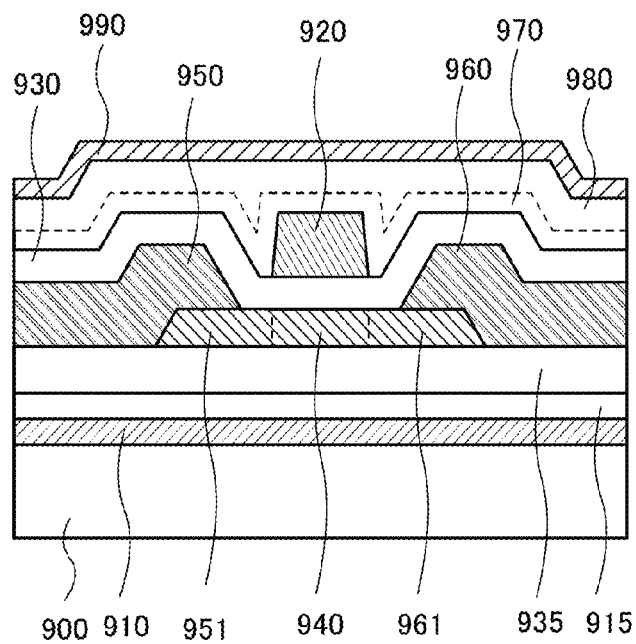
FIGS. 28A and 28B are cross-sectional views each illustrating a transistor.

The transistor 350 of the pixel portion 302 in FIG. 15 has a self-aligned top-gate structure illustrated in FIG. 28A. Note that the transistor in FIG. 28A has a structure in a state before being transferred to a flexible substrate.

Figure 31A:
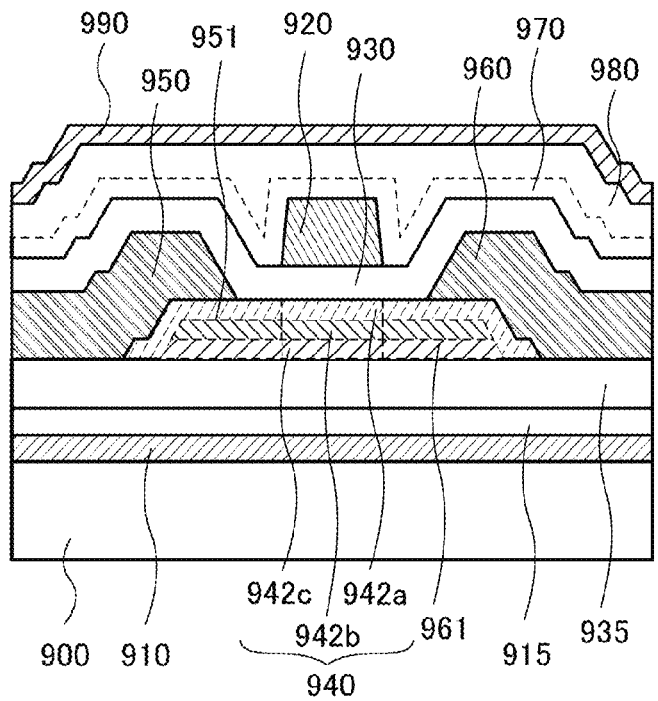
FIGS. 31A and 31B are cross-sectional views each illustrating a transistor.
Figure 31B:
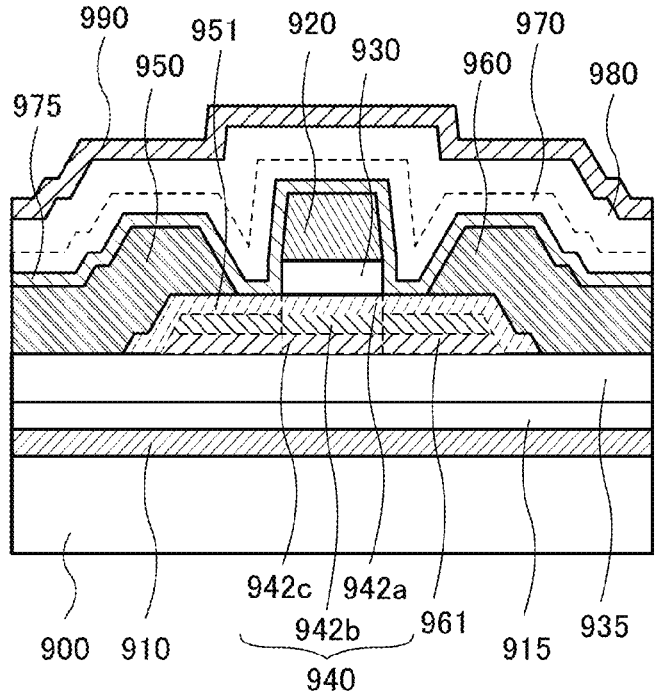

The transistor 352 of the circuit for driving the pixel portion 302 has a self-aligned top-gate structure illustrated in FIG. 31A. Note that the transistor in FIG. 31A has a structure in a state before being transferred to a flexible substrate. The transistor 352 includes a third oxide semiconductor layer 942a, a second oxide semiconductor layer 942b, and a first oxide semiconductor layer 942c which are stacked in this order from the gate insulating film side.

The first oxide semiconductor layer 942c and the third oxide semiconductor layer 942a are formed using a material represented by $InM_{1x}Zn_yO_z$ ($x\geq 1$, $y>1$, $z>0$, $M_1$=Ga, Hf, or the like). The second oxide semiconductor layer 942b is formed using a material which can be represented by $InM_{2x}Zn_yO_z$ ($x\geq 1$, $y\geq x$, $z>0$, $M_2$=Ga, Sn, or the like).

Materials of the first to third oxide semiconductor layers are selected as appropriate so as to form a well-shaped structure in which the conduction band minimum in the second oxide semiconductor layer 942b is deeper from the vacuum level than the conduction band minimum in the first and third oxide semiconductor layers 942c and 942a.

For example, the first oxide semiconductor layer 942c and the third oxide semiconductor layer 942a may each have an atomic ratio of In:Ga:Zn=1:1:1, 1:3:2, 1:3:4, 1:3:6, 1:4:5, 1:6:4, or 1:9:6; the second oxide semiconductor layer 942b may have an atomic ratio of In:Ga:Zn=1:1:1, 5:5:6, or 3:1:2.

Since the first to third oxide semiconductor layers 942c to 942a include the same constituent elements, the second oxide semiconductor layer 942b has few defect states (trap levels) at the interface with the third oxide semiconductor layer 942a. Specifically, the defect states (trap levels) are fewer than those at the interface between the gate insulating film and the third oxide semiconductor layer 942a. For this reason, when the oxide semiconductor layers are stacked in the above manner, the amount of change in the threshold voltage of a transistor due to a change over time or a reliability test can be reduced.

Further, materials of the first to third oxide semiconductor layers are selected as appropriate so as to form a well-shaped structure in which the conduction band minimum in the second oxide semiconductor layer 942b is deeper from the vacuum level than the conduction band minimum in the first and third oxide semiconductor layers 942c and 942a. As a result, the field-effect mobility of the transistor can be increased and the amount of change in the threshold voltage of the transistor due to change over time or a reliability test can be reduced.

Further, the first to third oxide semiconductor layers 942c to 942a may be formed using oxide semiconductors having different crystallinities. Note that at least the second oxide semiconductor layer 942b that can function as a channel formation region is preferably a film with crystallinity, further preferably a film in which c-axes are aligned perpendicularly to a surface.

Figure 35A:
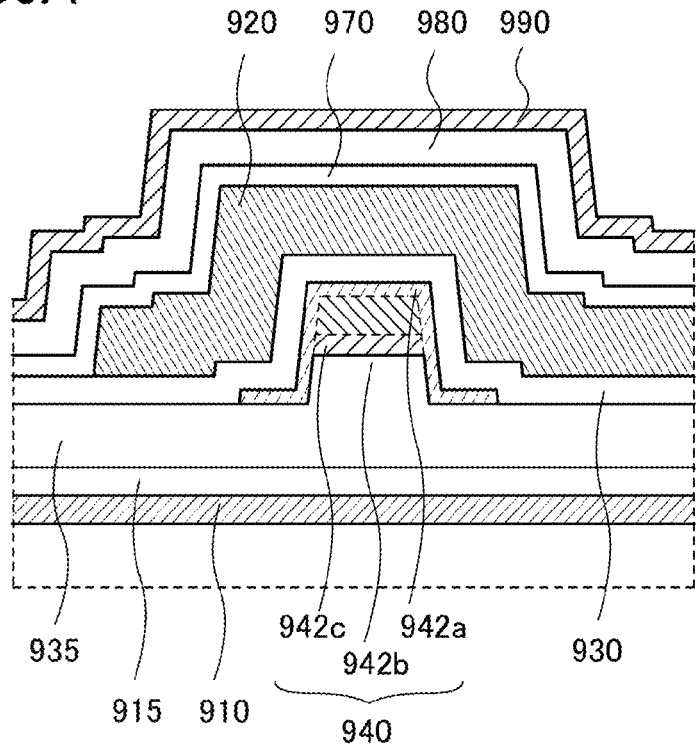
FIGS. 35A and 35B are cross-sectional views each illustrating a transistor.

A Structure illustrated in FIG. 35A is preferably for a cross section in the channel width direction, of a channel formation region in a top-gate transistor illustrated in FIG. 31A or the like. Note that the transistors shown in FIGS. 35A and 35B each have a structure in a state before being transferred to a flexible substrate. In each of the above structures, the gate electrode layer 920 electrically surrounds the oxide semiconductor layer 940 in the channel width direction. Such a transistor structure is referred to as a surrounded channel (s-channel) structure.

Figure 30A:
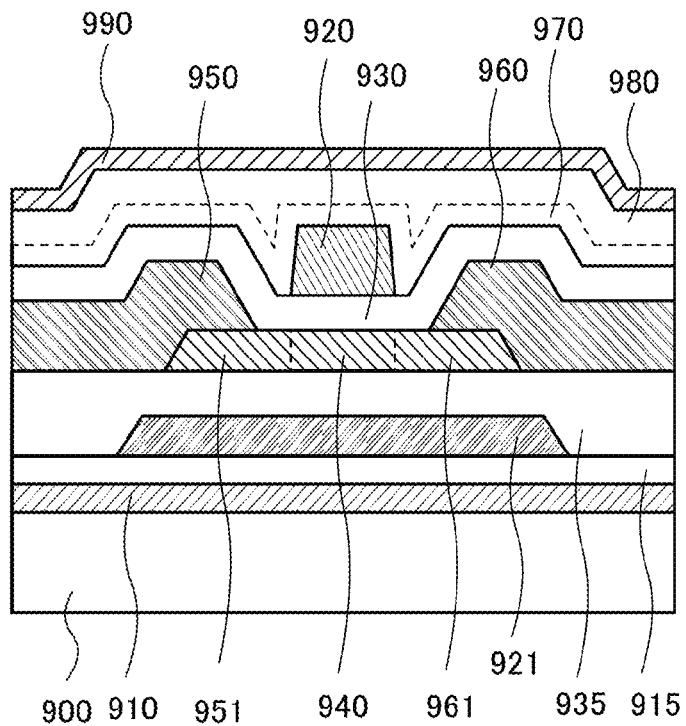
FIGS. 30A and 30B are cross-sectional views each illustrating a transistor.
Figure 30B:
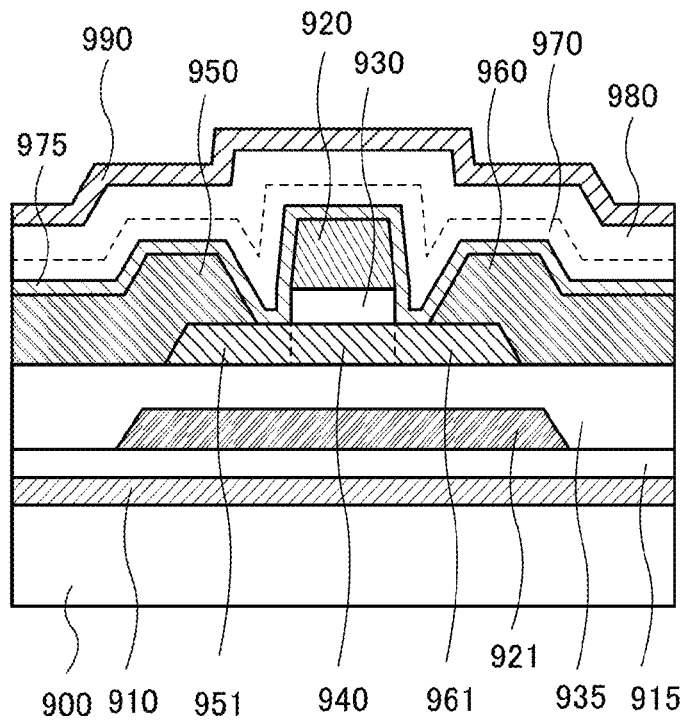
Figure 35B:
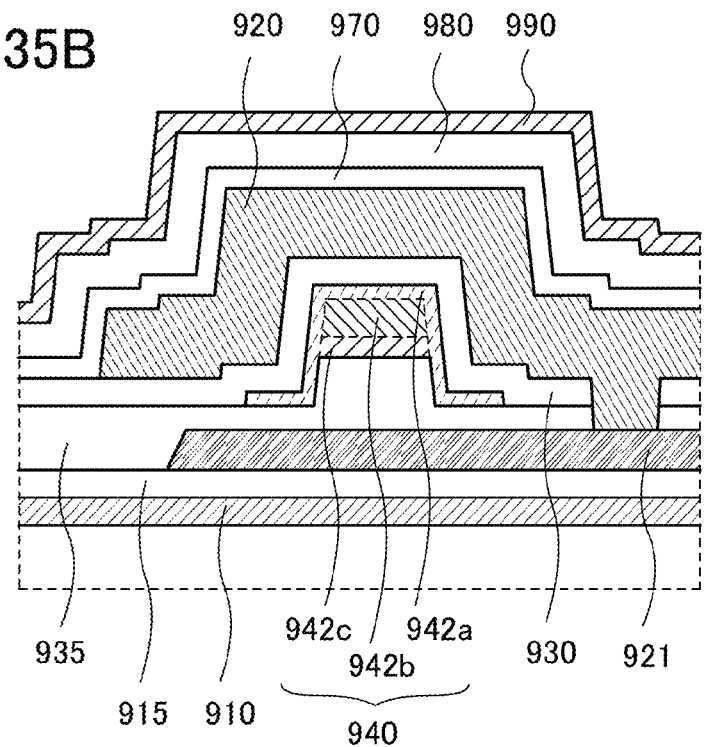

In the structure including the conductive film 921 as illustrated in FIGS. 30A and 30B, the gate electrode layer 920 and the conductive film 921 may be connected to each other through a contact hole, as illustrated in FIG. 35B, so as to have the same potential. Note that the transistors shown in FIGS. 30A and 30B each have a structure in a state before being transferred to a flexible substrate.

Further, the circuit for driving the pixel portion 302 may be formed over the first flexible substrate 301 like a transistor included in the pixel portion 302. To increase the field-effect mobility, the circuit for driving the pixel portion 302 may have the same structure as that of the transistor included in the pixel portion 302 and may have a different channel length from that of the transistor included in the pixel portion 302. Typically, the channel length of a transistor 194 in the driver circuit portion can be less than 2.5 µm, or greater than or equal to 1.45 µm and less than or equal to 2.2 µm. The channel length of a transistor 190 in the pixel portion can be less than or equal to 2.5 µm, or greater than or equal to 2.5 µm and less than or equal to 20 µm.

When the channel length of the transistor in the driver circuit portion is less than 2.5 µm or greater than or equal to 1.45 µm and less than or equal to 2.2 µm, as compared with the transistor in the pixel portion, the field-effect mobility can be increased, and the amount of on-state current can be increased. As a result, a driver circuit portion that can operate at high speed can be formed.

When the transistor in the driver circuit portion has high field-effect mobility, the number of input terminals can be made small.

Further, the circuit may be formed by mounting an IC chip on the first flexible substrate 301 by chip on glass (COG) or the like. Alternatively, the circuit may be connected to a TCP or the like.

The pixel portion 302, the first circuit portion 304, and the second circuit portion 305 in the display device 300 include a plurality of transistors in which a channel formation region is formed using an oxide semiconductor layer.

Since the transistor using an oxide semiconductor layer has high mobility, an area occupied by transistors can be made small, and the aperture ratio can be increased. With use of the transistor, the first circuit portion 304 and the second circuit portion 305 can be formed over the substrate provided with the pixel portion 302. In addition, the transistor has extremely low off-state current and can hold a video signal or the like for a longer period; thus, the frame frequency can be lowered, and the power consumption of the display device can be reduced.

The oxide semiconductor layer preferably includes a c-axis aligned crystal. In the case where the oxide semiconductor layer including the crystal is used for a channel formation region of the transistor, a crack or the like is less likely to occur in the oxide semiconductor layer when the display device 300 is bent, for example. As a result, the reliability can be improved.

Thus, with use of the transistor using an oxide semiconductor layer, a display device that is superior to a display device including an amorphous silicon layer or a polycrystalline silicon layer can be formed, for example.

As a display element included in the display device 300, a liquid crystal element or a light-emitting element can be typically used.

Figure 16:
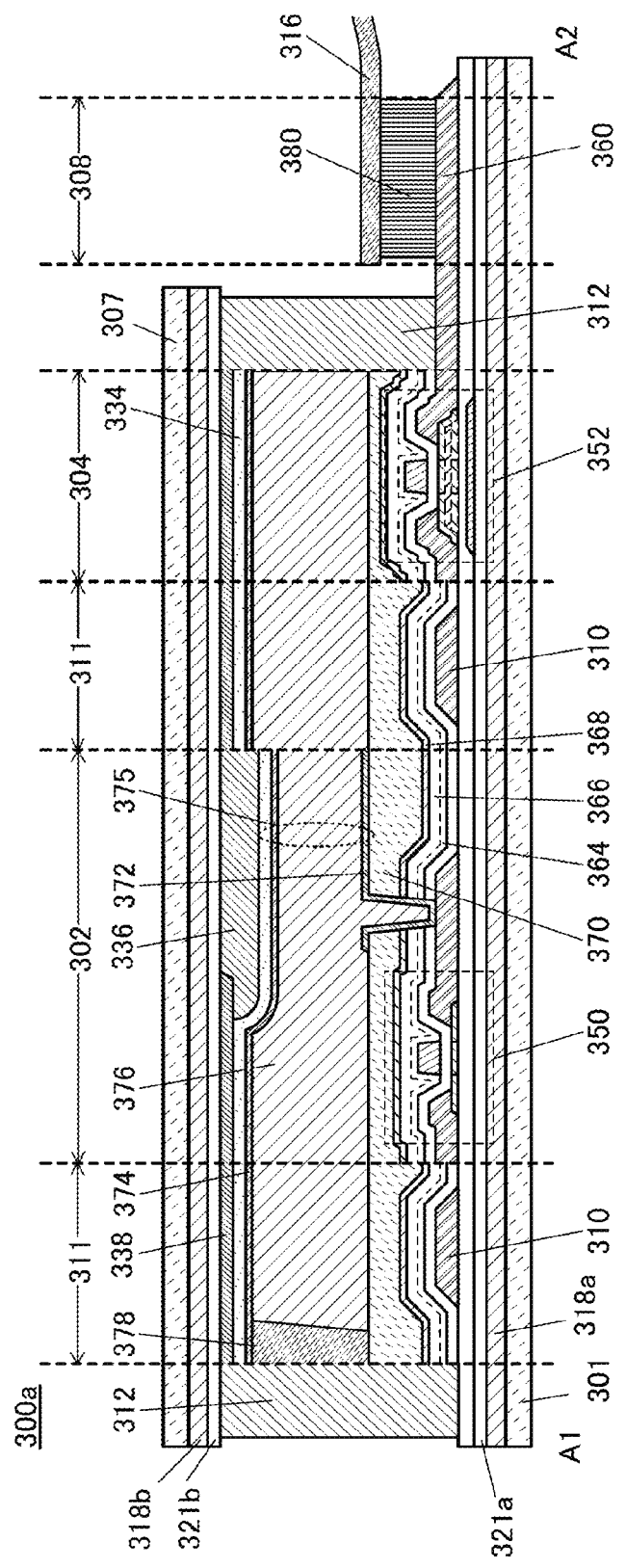
FIG. 16 illustrates an example of a light-emitting device.

Next, a display device 300a including a liquid crystal element is described. FIG. 16 is a cross-sectional view along dashed-dotted line A1-A2 in FIG. 15 in the case where a liquid crystal element is used for the display device 300.

The display device 300a includes the first flexible substrate 301, a first bonding layer 318a, a first insulating film 321a, a first element layer, a second element layer, a second insulating film 321b, a second bonding layer 318b, and the second flexible substrate 307, which are stacked in this order.

In FIG. 16, the first element layer includes transistors 350 and 352, insulating films 364, 366, and 368, a planarization insulating film 370, a connection electrode 360, a conductive film 372, and the like. The second element layer includes a conductive film 374, an insulating film 334, a coloring layer 336 (color filter), a light-blocking layer 338 (black matrix), and the like. There is a case where some of the above components is not included or a component other than the above components is included in the first element layer and the second element layer.

The first element layer and the second element layer are sealed with a liquid crystal layer 376 and the sealant 312 to form a liquid crystal element 375.

Examples of the material of the first flexible substrate 301 and the second flexible substrate 307 include glass thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polyether ether ketone (PEEK) resin. In particular, a material whose coefficient of thermal expansion is low is preferable, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

For the bonding layers 318a and 318b, for example, a resin that is curable at room temperature such as a two-component type resin, a light-curable resin, a heat-curable resin, or the like can be used. The examples include an epoxy resin, an acrylic resin, a silicone resin, a phenol resin, and the like. In particular, a material with low moisture permeability, such as an epoxy resin, is preferred.

As the first insulating film 321a and the second insulating film 321b, a single layer of a silicon oxide film, a silicon oxynitride film, a silicon nitride film, or a silicon nitride oxide film, or a stacked layer including any of the films can be used. In particular, a film containing nitrogen with high blocking properties against impurities is preferably used to prevent impurities contained in the first flexible substrate 301, the first bonding layer 318a, or the like from diffusing into the transistor or the like.

The display device 300a includes a lead wiring portion 311, the pixel portion 302, the first circuit portion 304, and the FPC terminal portion 308. Note that the lead wiring portion 311 includes the signal line 310.

The display device 300a has a structure in which the transistor 350 and the transistor 352 are included in the pixel portion 302 and the first circuit portion 304, respectively.

In FIG. 16, the sizes of the transistor 350 and the transistor 352 are the same; however, the sizes of the transistors are not limited thereto. The sizes of the transistor 350 and the transistor 352 can be changed (in the channel length, the channel width, and the like) as appropriate, or the number of transistors can be changed. In addition, the second circuit portion 305 (not shown in FIG. 16) can have a structure similar to that of the first circuit portion 304.

The signal line 310 included in the lead wiring portion 311 can be formed in a step of forming a source electrode layer and a drain electrode layer of the transistor 350.

The FPC terminal portion 308 includes the connection electrode 360, an anisotropic conductive film 380, and the FPC 316. The connection electrode 360 can be formed in a step of forming the source electrode layer and the drain electrode layer of the transistor 350. In addition, the connection electrode 360 is electrically connected to a terminal of the FPC 316 through the anisotropic conductive film 380.

A wiring containing a copper element is preferably used for the signal line connected to the transistor in the pixel portion and the transistor in the driver circuit portion. When the wiring containing a copper element is used, the signal delay due to the wiring resistance and the like can be suppressed.

Further, in FIG. 16, the insulating films 364, 366, and 368 and the planarization insulating film 370 are provided over the transistor 350 and the transistor 352.

The insulating films 364 and 366 can be formed using the same material, and for example, silicon oxide, silicon oxynitride, or the like can be used. The insulating film 364 is preferably formed using an oxide insulating film with few defects, and the insulating film 366 is preferably formed using an oxide insulating film containing oxygen in excess of the stoichiometric composition. Note that the insulating films 364 and 366 can be a single layer formed using the same material. The insulating film 368 has a function of blocking oxygen, hydrogen, water, an alkali metal, an alkaline earth metal, or the like. For example, a nitride insulating film is preferably used.

The planarization insulating film 370 can be formed using a heat-resistant organic material, such as a polyimide resin, an acrylic resin, a polyimide amide resin, a benzocyclobutene resin, a polyamide resin, or an epoxy resin. Note that the planarization insulating film 370 may be formed by stacking a plurality of insulating films formed from these materials. Alternatively, a structure without the planarization insulating film 370 may be employed.

The conductive film 372 is electrically connected to one of the source electrode layer and the drain electrode layer of the transistor 350. The conductive film 372 functions as a pixel electrode formed over the planarization insulating film 370, i.e., one electrode of the liquid crystal element. As the conductive film 372, a conductive film having properties of transmitting visible light is preferably used. For example, a material including one of indium (In), zinc (Zn), and tin (Sn) is preferably used for the conductive film.

The liquid crystal element 375 includes the conductive film 372, the conductive film 374, and the liquid crystal layer 376. The conductive film 374 is provided on the second flexible substrate 307 side and functions as a counter electrode. In the display device 300a illustrated in FIG. 16, an orientation state of the liquid crystal layer 376 is changed by the voltage applied to the conductive film 372 and the conductive film 374, so that transmission or non-transmission of light is changed and thus an image can be displayed.

Although not shown in FIG. 16, alignment films may be formed between the conductive film 372 and the liquid crystal layer 376 and between the conductive film 374 and the liquid crystal layer 376. An optical member (an optical substrate) such as a polarizing member, a retardation member, or an anti-reflection member, and the like may be provided as appropriate. For example, circular polarization may be employed by using a polarizing substrate and a retardation substrate. In addition, a backlight, a sidelight, or the like may be used as a light source.

A spacer 378 is provided between the first flexible substrate 301 and the second flexible substrate 307. The spacer 378 is a columnar spacer obtained by selective etching of an insulating film and is provided in order to adjust the thickness (cell gap) of the liquid crystal layer 376. Note that as the spacer 378, a spherical spacer may be used.

For the liquid crystal layer 376, a liquid crystal material such as thermotropic liquid crystal, low-molecular liquid crystal, high-molecular liquid crystal, polymer dispersed liquid crystal, ferroelectric liquid crystal, or anti-ferroelectric liquid crystal can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal showing a blue phase and a chiral material has a short response time and optical isotropy, which makes the alignment process unneeded and the viewing angle dependence small. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where the liquid crystal element is used as a display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. There are some examples of a vertical alignment mode; for example, a multi-domain vertical alignment (MVA) mode, a patterned vertical alignment (PVA) mode, an ASV mode, or the like can be employed.

As a display method in the pixel portion 302, a progressive method, an interlace method, or the like can be employed. Further, color elements controlled in a pixel at the time of color display are not limited to three colors: R, G, and B (R, G, and B correspond to red, green, and blue, respectively). For example, a display unit may be composed of four pixels of the R pixel, the G pixel, the B pixel, and a W (white) pixel.

Alternatively, a display unit may be composed of two of color elements among R, G, and B as in PenTile layout. The two colors may differ among display units. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

Figure 17:
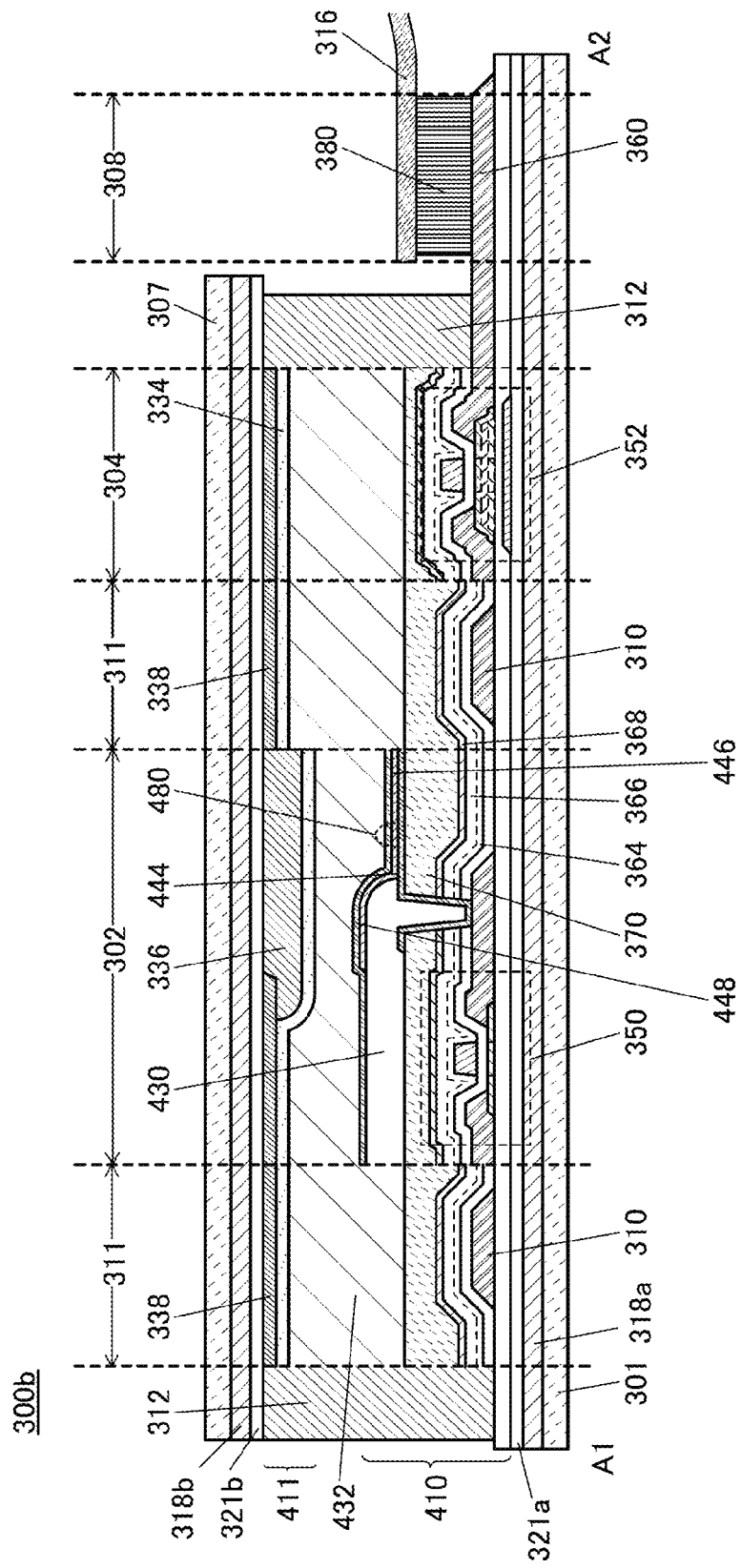
FIG. 17 illustrates an example of a light-emitting device.

Next, a display device 300b including a light-emitting element is described. FIG. 17 is a cross-sectional view along dashed-dotted line A1-A2 in FIG. 15 in the case where a light-emitting element is used for the display device 300. Note that the same description as that of the display device 300a including the liquid crystal element is omitted.

The display device 300b includes the first flexible substrate 301, the first bonding layer 318a, the first insulating film 321a, a first element layer 410, a second element layer 411, the second insulating film 321b, the second bonding layer 318b, and the second flexible substrate 307, which are stacked in this order.

In FIG. 17, the first element layer 410 includes the transistors 350 and 352, the insulating films 364, 366, and 368, the planarization insulating film 370, a connection electrode 360, a light-emitting element 480, an insulating film 430, the signal line 310, and the connection electrode 360. The second element layer 411 includes the insulating film 334, the coloring layer 336, and the light-blocking layer 338. The first element layer 410 and the second element layer 411 are sealed with a sealing layer 432 and the sealant 312. Note that there is a case where part of the above components is not included or a component other than the above components is included in the first element layer 410 and the second element layer 411.

The light-emitting element 480 includes a conductive film 444, an EL layer 446, and a conductive film 448. The display device 300b enables an image to be displayed when the EL layer 446 in the light-emitting element 480 emits light.

The insulating film 430 is provided over the conductive film 444 over the planarization insulating film 370. The insulating film 430 partly covers the conductive film 444. A conductive film with high properties of reflecting light emitted from the EL layer is used for the conductive film 444, and a conductive film with high properties of transmitting light emitted from the EL layer is used for the conductive film 448, whereby the light-emitting element 480 can have a top emission structure. Alternatively, a conductive film with high properties of transmitting the light is used for the conductive film 444, and a conductive film with high properties of reflecting light is used for the conductive film 448, whereby the light-emitting element 480 can have a bottom emission structure. Further alternatively, a conductive film with high properties of transmitting the light is used for both the conductive film 444 and the conductive film 448, whereby a dual emission structure can be obtained.

The coloring layer 336 is provided to overlap with the light-emitting element 480, and the light-blocking layer 338 is provided to overlap with the insulating film 430 and to be included in the lead wiring portion 311 and in the first circuit portion 304. The coloring layer 336 and the light-blocking layer 338 are covered with a third insulating film 334. A space between the light-emitting element 480 and the third insulating film 334 is filled with the sealing layer 432. Although a structure with the coloring layer 336 is described as the display device 300b, the structure is not limited thereto. In the case where the EL layer 446 is formed by a separate coloring method, the coloring layer 336 is not necessarily provided.

In the display device 300b, a dry agent may be included in the bonding layers 318a and 318b. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because entry of an impurity such as moisture into the light-emitting element 480 can be suppressed, thereby improving the reliability of the display device.

In addition, it is preferable to mix a filler with a high refractive index (e.g., titanium oxide) into the sealing layer 432, in which case the efficiency of light extraction from the light-emitting element 480 can be improved.

The bonding layers 318a and 318b may also include a scattering member for scattering light. For example, the bonding layers 318a and 318b can be a mixture of the sealing layer 432 and particles having a refractive index different from that of the sealing layer 432. The particles function as the scattering member for scattering light. The difference in refractive index between the sealing layer 432 and the particles is preferably 0.1 or more, further preferably 0.3 or more. As the particles, titanium oxide, barium oxide, zeolite, or the like can be used. Particles of titanium oxide or barium oxide are preferable because they scatter light excellently. When zeolite is used, it can adsorb water contained in the sealing layer 432 and the like, thereby improving the reliability of the light-emitting element.

Each of the first flexible substrate 301 and the second flexible substrate 307 are preferably formed using a material with high toughness. Thus, a light-emitting device with high impact resistance that is less likely to be broken can be provided. For example, when the first flexible substrate 301 and the second flexible substrate 307 are each an organic resin substrate, it is possible to manufacture a display device that is light and less likely to be broken as compared with the case where a glass substrate is used.

Furthermore, when a material with high thermal emissivity is used for the first flexible substrate 301, the surface temperature of the display device can be prevented from rising, leading to prevention of breakage or a decrease in reliability of the display device. For example, the first flexible substrate 301 may have a stacked structure of a metal substrate and a layer with high thermal emissivity (e.g., the layer can be formed using a metal oxide or a ceramic material).

Note that the light-emitting device of this embodiment may be provided with a touch sensor or a touch panel. A touch sensor may be directly formed on the first flexible substrate 301 or the second flexible substrate 307; alternatively, the touch panel formed on another substrate may be placed over the first flexible substrate 301 or the second flexible substrate 307.

There is no particular limitation on the structures of the transistors 350 and 352. For example, a forward staggered transistor or an inverted staggered transistor may be used. A top-gate transistor or a bottom-gate transistor may be used.

Alternatively, an oxide semiconductor is preferably used for the transistors 350 and 352. For example, an oxide semiconductor having a wider band gap than silicon is preferably used. A semiconductor material having a wider band gap and a lower carrier density than silicon is preferably used because off-state current of the transistor can be reduced.

The oxide semiconductor preferably contains at least indium (In) or zinc (Zn), for example. More preferably, the oxide semiconductor contains an oxide represented by an In-M-Zn-based oxide (M is a metal such as Al, Ti, Ga, Ge, Y, Zr, Sn, La, Ce, or Hf).

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. The CAAC-OS film is one of oxide semiconductor films having a plurality of c-axis aligned crystal parts.

As the semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary. There is no grain boundary in such an oxide semiconductor; therefore, generation of a crack in an oxide semiconductor film which is caused by stress when a flexible device formed using one embodiment of the present invention is bent is prevented. Therefore, such an oxide semiconductor can be preferably used for a flexible device (e.g., a display device) which is used in a bent state, or the like.

The use of such materials for the semiconductor layer makes it possible to provide a highly reliable transistor in which a change in the electrical characteristics is suppressed.

Charge accumulated in a capacitor through a transistor can be held for a long time because of the low off-state current of the transistor. When such a transistor is used for a pixel, a driver circuit can be stopped while the luminance of an image displayed on each display region is maintained. As a result, an electronic device with extremely low power consumption can be obtained.

In the first element layer 410, the light-emitting element is preferably provided between a pair of insulating films having high gas barrier properties. In that case, an impurity such as water can be prevented from entering the light-emitting element, leading to prevention of a decrease in the reliability of the light-emitting device.

As an insulating film having a high gas barrier property, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film having a high gas barrier property is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The second flexible substrate 307 has a light-transmitting property and transmits at least light emitted from the light-emitting element included in the first element layer 410. The refractive index of the second flexible substrate 307 is higher than that of the air.

An organic resin, which is lighter than glass, is preferably used for the second flexible substrate 307, in which case the light-emitting device can be lightweight as compared with the case where glass is used.

The second bonding layer 318b has a light-transmitting property and transmits at least light emitted from the light-emitting element included in the first element layer 410. The refractive index of the second bonding layer 318b is higher than that of the air.

For the second bonding layer 318b, a curable resin that is curable at room temperature (e.g., a two-component-mixture-type resin), a light curable resin, a heat curable resin, or the like can be used. Examples include an epoxy resin, an acrylic resin, a silicone resin, a phenol resin, and the like. In particular, a material with low moisture permeability, such as an epoxy resin, is preferred.

The second bonding layer 318b may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because entry of an impurity such as moisture into the light-emitting element can be suppressed, thereby improving the reliability of the light-emitting device.

In addition, it is preferable to mix a filler with a high refractive index (e.g., titanium oxide) into the second bonding layer 318b, in which case the efficiency of light extraction from the light-emitting element can be improved.

The second bonding layer 318b may also include a scattering member for scattering light. For example, the second bonding layer 318b can be a mixture of the above resin and particles having a refractive index different from that of the resin. The particles function as the scattering member for scattering light.

A material similar to that of the second bonding layer 318b can be used for the first bonding layer 318a. In the case where the first bonding layer 318a is provided on the side where light emitted from the light-emitting element is not extracted, there is no limitation on the light-transmitting property or the refractive index of the first bonding layer 318a.

The first bonding layer 318a is used, as described in Embodiment 1, for bonding the first flexible substrate 301 and the layer 705 after the separation layer 703 is formed over the formation substrate 701, the layer 705 is formed over the separation layer 703, and the formation substrate 701 and the layer 705 are separated from each other.

Here, an example of a peeling apparatus used for separating the formation substrate 701 from the layer 705 described in Embodiment 1 is shown below.

One embodiment of the present invention is a peeling apparatus including a structure body which can hold a first member of a process member and a stage which can hold a second member of the process member. The first member is wound to separate the first member and the second member of the process member between the structure body and the stage from each other.

With the use of the peeling apparatus of one embodiment of the present invention, the first member and the second member of the process member can be separated from each other with a high yield. The peeling apparatus of one embodiment of the present invention does not require a complicated structure and can be used for the peeling of process members with a variety of sizes.

Examples of the structures and operations of peeling apparatuses and peeling methods using any of the peeling apparatuses will be described below.

Structural Example 1

FIGS. 18A to 18D, FIGS. 19A to 19C, and FIGS. 20A to 20C illustrate an example where a first member 203a is peeled from a process member 203 so that the first member 203a and a second member 203b are separated from each other.

Figure 18A:
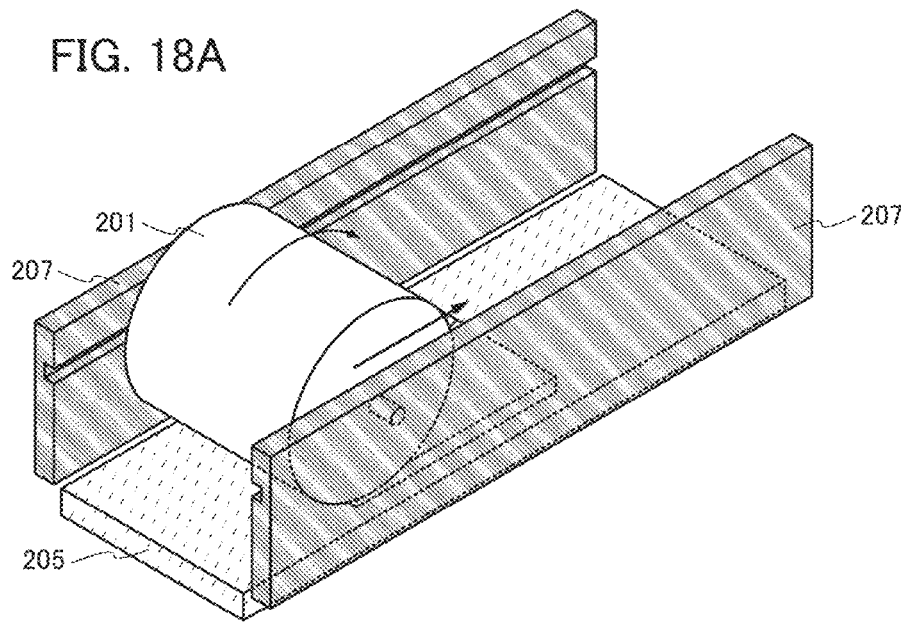
FIGS. 18A to 18D illustrate an example of a peeling apparatus.
Figure 18B:
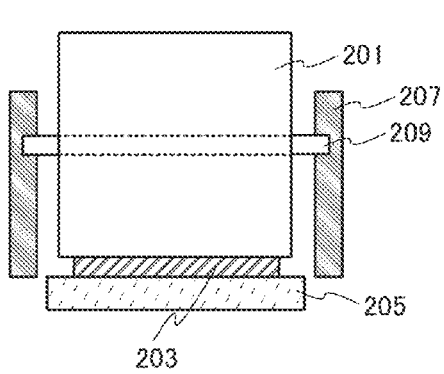
Figure 18C:
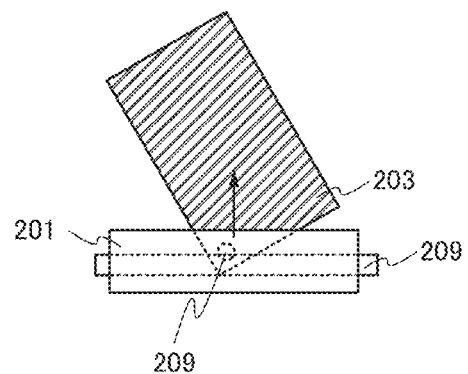
Figure 18D:
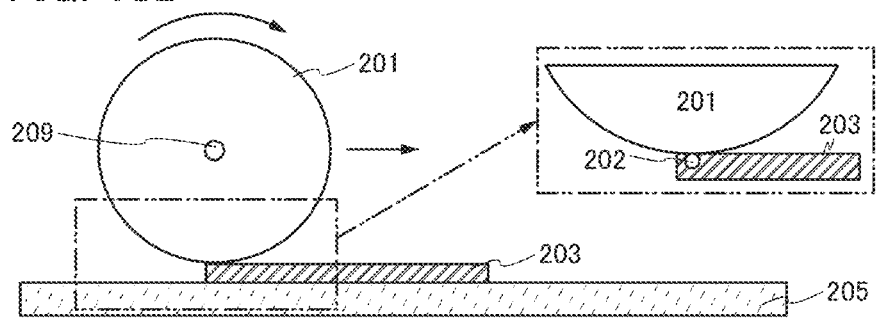

FIG. 18A, FIG. 18B, and FIG. 18D are a perspective view, a front view, and a side view, respectively, of a peeling apparatus just before peeling.

The peeling apparatus illustrated in FIGS. 18A to 18D includes a structure body 201 and a stage 205. The structure body 201 has a convex surface. The stage 205 has a supporting surface facing the convex surface.

In FIGS. 18A to 18D, the process member 203 is positioned between the convex surface and the supporting surface in the peeling apparatus.

FIG. 18C is a top view showing the case where the process member 203 with respect to the structure body 201 is positioned differently from that illustrated in FIGS. 18A, 18B, and 18D. FIG. 18A illustrates the case where peeling is performed from a side portion of the process member 203, whereas FIG. 18C illustrates the case where peeling is performed from a corner portion of the process member 203. In the case where peeling is performed from the side portion of the process member 203, the peeling is preferably performed from a short side in a long side direction, in which case conditions such as the rotation speed of the structure body can be easily controlled and the yield of the peeling can be improved.

The process member 203 has a sheet-like shape and includes the first member 203a and the second member 203b each having a sheet-like shape. Each of the first member 203a and the second member 203b may have a single-layer structure or a stacked-layer structure. A separation trigger is preferably formed in the process member 203, in which case peeling can be easily performed at the interface between the first member 203a and the second member 203b.

In the case where the peeling apparatus includes a transfer means, the process member 203 may be positioned over the stage 205 by the transfer means.

As illustrated in an enlarged view of a portion surrounded by dashed-two dotted line in FIG. 18D, the convex surface of the structure body 201 is positioned so as to overlap with a separation trigger 202, which is formed to have a point-like shape or a linear shape (including a solid line shape, a dashed line shape, and a frame-like shape) in the process member 203. After that, when the structure body 201 rotates, the force of peeling the first member 203a is applied to the process member 203; thus, the first member 203a is peeled from the vicinity of the separation trigger 202. As a result, the process member 203 is divided into the first member 203a and the second member 203b.

The structure body 201 preferably has a convex shape, for example, a cylindrical shape (including a columnar shape, a right cylinder shape, an elliptical cylinder shape, a parabolic cylinder shape, and the like), a spherical shape, a structure whose part is a cylinder shape, a structure whose part is a spherical shape, or the like. The structure body 201 can be a roller such as a drum roller, for example.

As a material of the structure body, a metal, an alloy, an organic resin, or the like can be given. The structure body may have a space or a hollow inside.

Figure 21A:
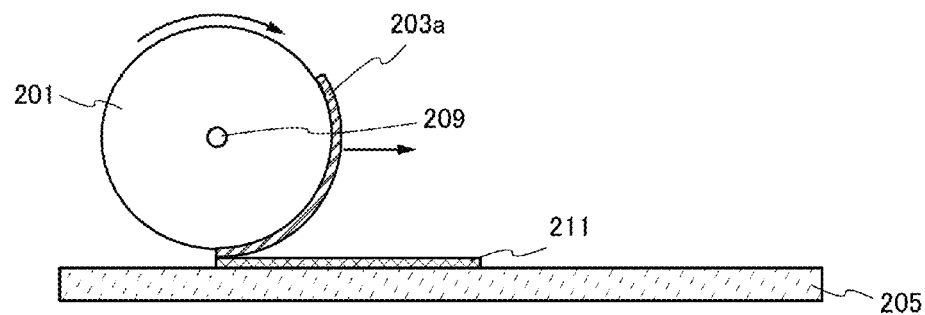
FIGS. 21A to 21D illustrate an example of a peeling apparatus.
Figure 21B:
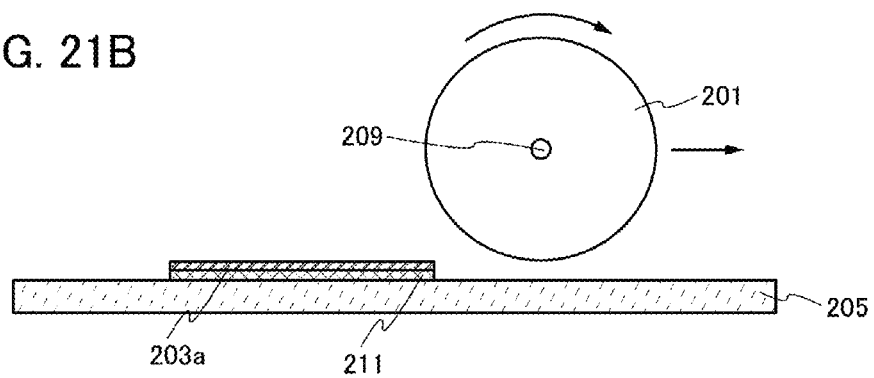
Figure 21C:
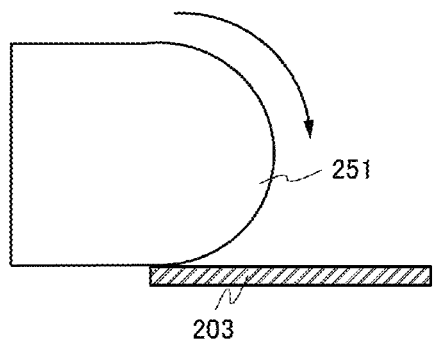
Figure 21D:
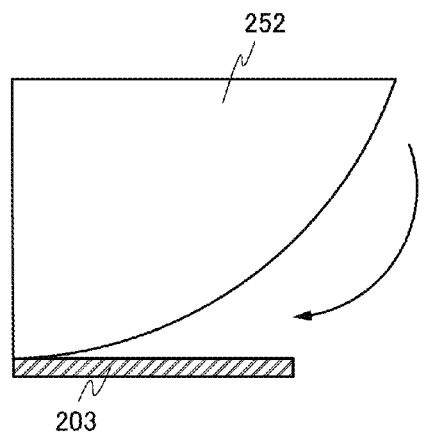

FIG. 21C and FIG. 21D illustrate a structure body 251 and a structure body 252, each of which partly has a convex surface, respectively. Each of the structure body 251 and the structure body 252 partly has a cylindrical shape.

The radius of curvature of the convex surface of the structure body is less than the radius of curvature of the supporting surface of the stage 205. The radius of curvature of the convex surface can be, for example, greater than or equal to 0.5 mm and less than or equal to 1000 mm. In the case where a film is peeled, for example, the radius of curvature of the convex surface can be greater than or equal to 0.5 mm and less than or equal to 500 mm, and specifically can be 150 mm, 225 mm, or 300 mm. As an example of the structure body having such a convex surface, a roller with a diameter of 300 mm, 450 mm, or 600 mm can be given. Note that a preferred radius of curvature of the convex surface depends on the thickness or the size of a process member. For this reason, in one embodiment of the present invention, the radius of curvature of the convex surface of the structure body is not limited to the above range as long as the radius of curvature of the convex surface is less than that of the supporting surface of the stage 205.

In the case where the process member 203 includes a stacked-layer structure with low adhesion, peeling might occur at an interface with low adhesion, which causes a reduction in the yield of peeling. In the case where the process member 203 includes an organic EL element, for example, peeling might occur at the interface between two layers in the EL layer or the interface between the EL layer and an electrode, in which case peeling does not occur at the interface between the first member 203a and the second member 203b. Thus, the radius of curvature of the convex surface or the rotation speed of the structure body 201 is set so that peeling can occur at the interface between the first member 203a and the second member 203b.

When the radius of curvature of the convex surface is too small, an element included in the first member 203a which is wound along the convex surface might be broken. For this reason, the radius of curvature of the convex surface is preferably greater than or equal to 0.5 mm.

Meanwhile, when the radius of curvature of the convex surface is large, a substrate of glass, sapphire, quartz, silicon, or the like, which has low flexibility and high stiffness, can be wound along the convex surface. For this reason, the radius of curvature of the convex surface is preferably greater than or equal to 300 mm, for example.

However, when the radius of curvature of the convex surface is too large, the size of the peeling apparatus might be increased, which might limit the installation location. For this reason, the radius of curvature of the convex surface is preferably less than or equal to 1000 mm, further preferably less than or equal to 500 mm, for example.

At least part of the convex surface may have stickness. For example, an adhesive tape may be put on part or the whole of the convex surface. In addition, at least part of the convex surface may have adhesion to the first member 203a.

Furthermore, the structure body 201 may include a suction mechanism so that the convex surface can be attached to the first member 203a.

The structure body 201 or the stage 205 may be movable in at least one of the following directions: forward and backward; right and left; and up and down. The distance between the convex surface of the structure body 201 and the supporting surface of the stage 205 is preferably changeable because peeling of process members with a variety of thicknesses can be performed. In Structural Example 1, the structure body 201 is movable in the longitudinal direction of the stage 205.

Examples of holding means for holding a member or the like (e.g., the process member 203 or the second member 203b) placed over the stage 205 include chucks such as a suction chuck, an electrostatic chuck, and a mechanical chuck. For example, a porous chuck may be used. Alternatively, a member may be fixed to a suction table, a heater table, a spinner table, or the like.

Figure 19A:
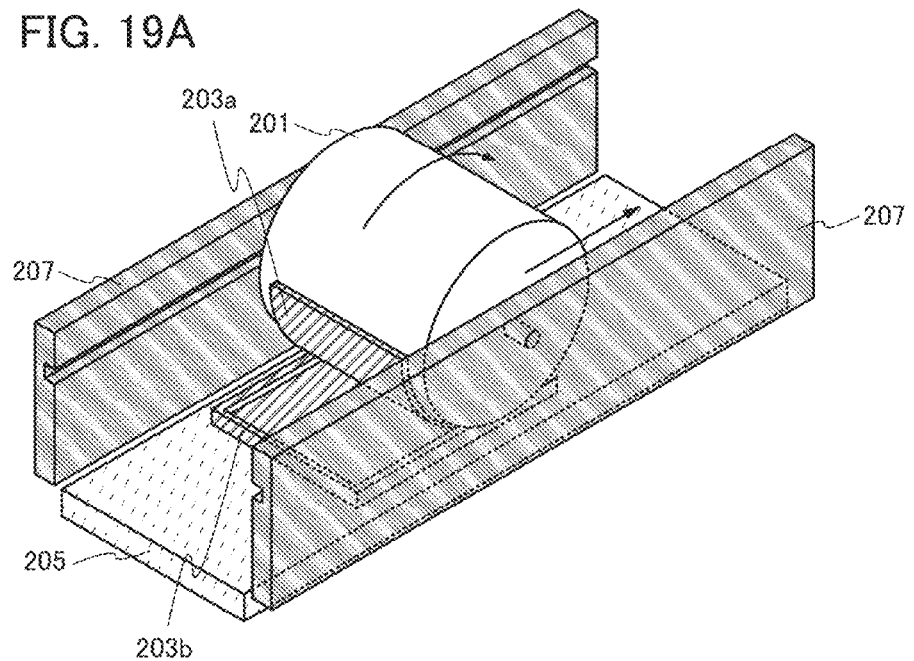
FIGS. 19A to 19C illustrate an example of a peeling apparatus.
Figure 19B:
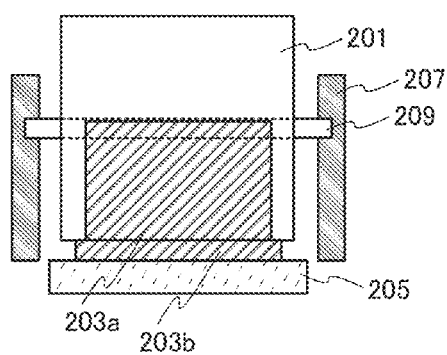
Figure 19C:
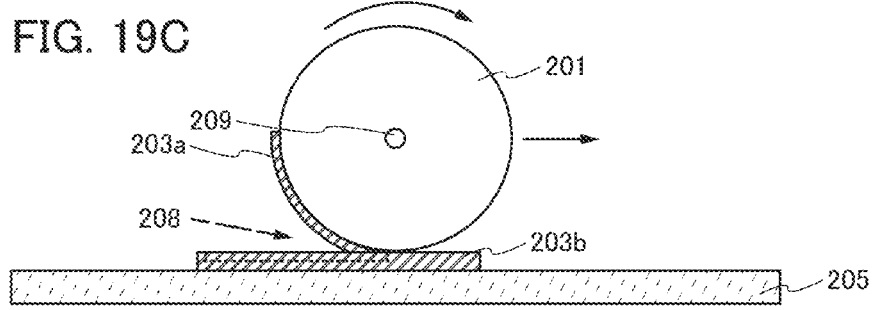
Figure 20A:
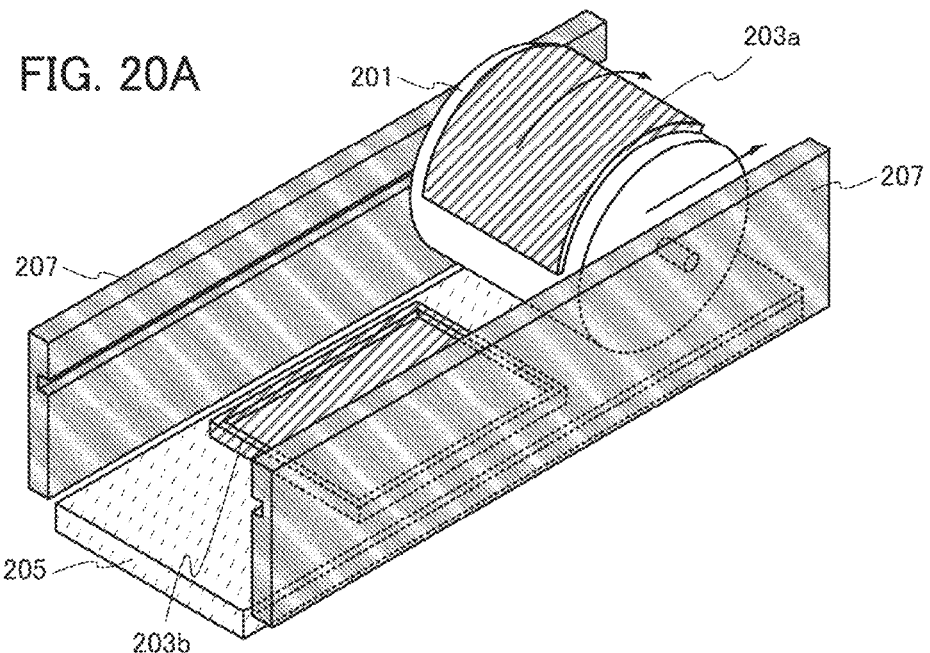
FIGS. 20A to 20C illustrate an example of a peeling apparatus.
Figure 20B:
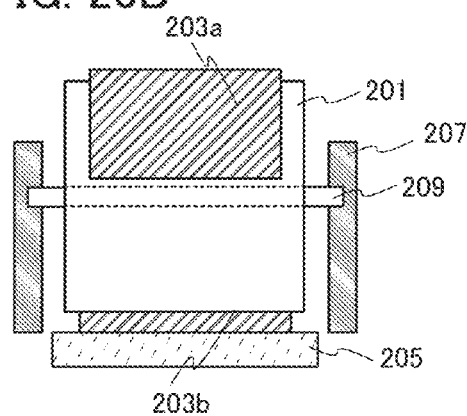
Figure 20C:
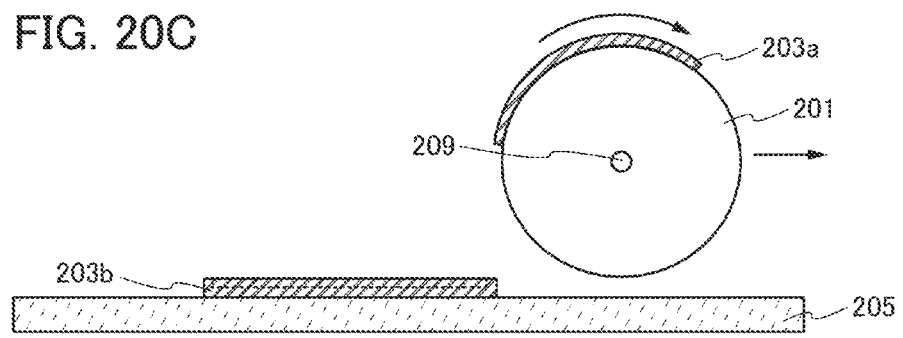

FIG. 19A, FIG. 19B, and FIG. 19C are a perspective view, a front view, and a side view, respectively, of the peeling apparatus during the peeling. FIG. 20A, FIG. 20B, and FIG. 20C are a perspective view, a front view, and a side view, respectively, of the peeling apparatus after the peeling.

The structure body 201 includes a rotation axis 209 at the center. FIG. 19A, FIG. 19C, and the like show the rotation direction of the structure body 201; however, the structure body 201 may rotate in the reverse direction. The rotation axis 209 moves along a groove of a guide 207, whereby the structure body 201 can move in the longitudinal direction of the stage 205 (the horizontal direction in FIG. 19C and FIG. 20C).

When the structure body 201 rotates, the first member 203a overlapping with the convex surface of the structure body 201 is peeled from the process member 203 from the vicinity of the separation trigger and wound along the convex surface to be separated from the second member 203b. The first member 203a is held by the convex surface of the structure body 201 and the second member 203b is held over the stage 205.

In the peeling apparatus of one embodiment of the present invention, at least one of the stage 205 and the structure body 201 moves so that the position of the rotation center of the structure body 201 with respect to the stage 205 changes. In Structural Example 1, the rotation center of the structure body 201 moves. Specifically, with the stationary (or fixed) stage 205, the structure body 201 can move (roll) from one end portion side of the process member 203 to the opposite end portion while the first member 203a is wound by the structure body 201.

The linear velocity of the convex surface of the structure body 201 is greater than or equal to the speed of the rotation center of the structure body 201 passing the stage 205.

The first member 203a and the second member 203b may be separated from each other while tension is applied to the first member 203a or the second member 203b.

As indicated by an arrow 208 in FIG. 19C, a liquid feeding mechanism for feeding liquid to the separation surface between the first member 203a and the second member 203b may be provided.

In that case, an adverse effect of static electricity caused at the time of peeling (e.g., damage to a semiconductor element from static electricity) on an element or the like included in the first member 203a can be suppressed. Note that mist or vapor of liquid may be sprayed. As liquid, pure water, an organic solvent, a neutral solution, an alkaline solution, an acid solution, a solution into which salt is melted, or the like can be used.

In the case where the peeling apparatus includes a transfer means, the second member 203b over the stage 205 and the first member 203a wound by the structure body 201 may be individually transferred by the transfer means after the peeling.

Alternatively, as illustrated in FIGS. 21A and 21B, the structure body 201 may further rotate so that the first member 203a is bonded to a sheet-like member 211 positioned over the stage 205.

The member 211 may have a single-layer structure or a stacked-layer structure. At least part of a surface, which is in contact with the first member 203a, of the member 211 preferably has adhesion to the first member 203a. For example, an adhesive layer may be provided.

The whole first member 203a may be wound along the convex surface before the structure body 201 finishes rotating one turn. This is preferred because the first member 203a can be prevented from touching by the stage 205 and from pressure application by the structure body 201.

It is also preferable that the first member 203a wound along the convex surface be bonded to the member 211 without touching the stage 205.

For example, it is possible that the structure body 201 rotates ¼ turn so that the whole first member 203a is wound along the convex surface, the structure body 201 further rotates ¾ turn to move to the vicinity of an end portion of the member 211, and the structure body 201 further rotates ¼ turn so that the first member 203a is bonded on the member 211.

The distance between the structure body 201 and the stage 205 may be adjusted after the peeling so that the first member 203a wound by the structure body 201 does not touch the stage 205.

Structural Example 2

In Structural Example 2, an example in which a position of the rotation center of a structure body with respect to a stage is changed by moving the stage is shown. Specifically, shown is an example in which the position of the rotation center of the structure body is not moved but the stage is moved from one end portion of a process member toward the opposite end portion.

FIGS. 22A to 22C, FIGS. 23A to 23C, and FIGS. 24A to 24C illustrate an example where a first member 253a is peeled from a process member 253 so that the first member 253a and a second member 253b are separated from each other.

Figure 22A:
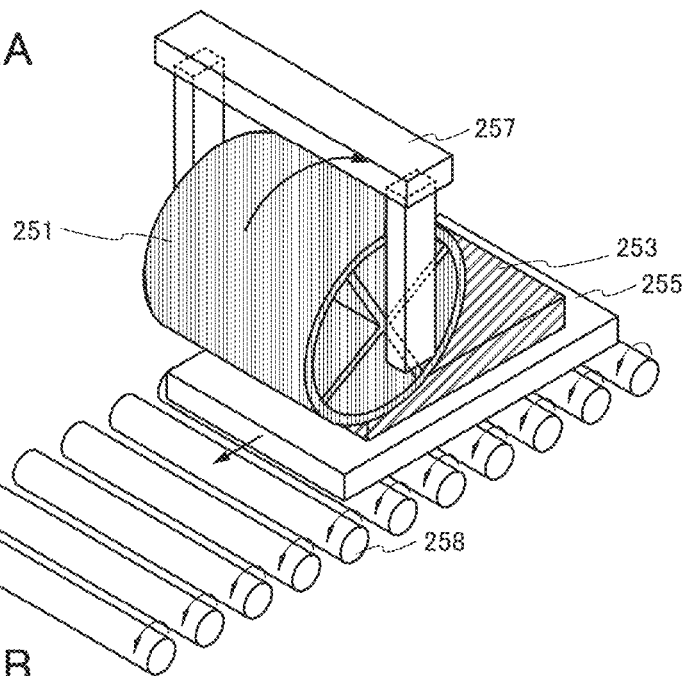
FIGS. 22A to 22C illustrate an example of a peeling apparatus.
Figure 22B:
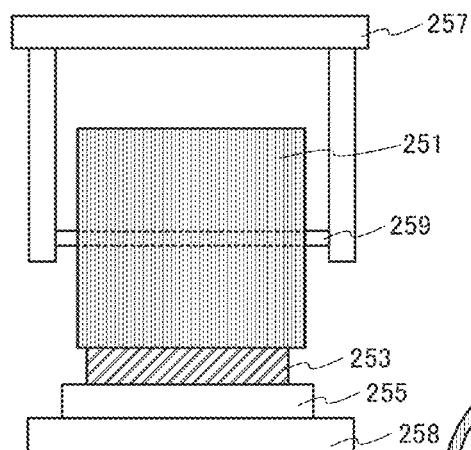
Figure 22C:
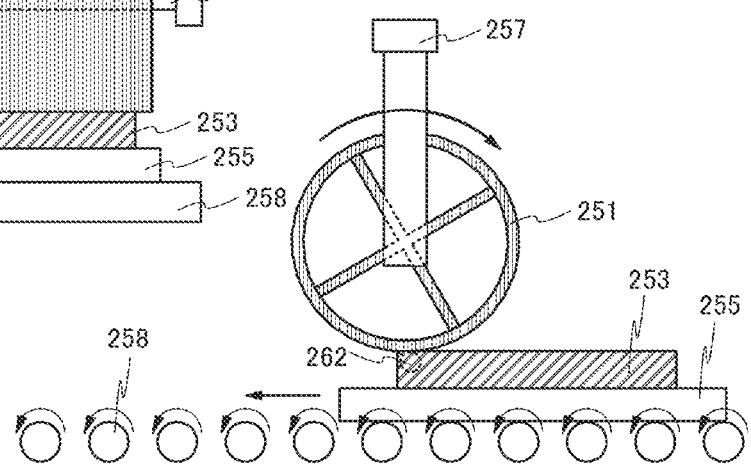

FIG. 22A, FIG. 22B, and FIG. 22C are a perspective view, a front view, and a side view, respectively, of a peeling apparatus just before peeling.

The peeling apparatus illustrated in FIGS. 22A to 22C includes a structure body 251, a stage 255, a support body 257, and transfer rollers 258. The structure body 251 has a convex surface. The stage 255 has a supporting surface facing the convex surface. The support body 257 supports the structure body 251.

In FIGS. 22A to 22C, the process member 253 is positioned between the convex surface and the supporting surface in the peeling apparatus.

Although FIG. 22A illustrates the case where peeling is performed from a side portion of the process member 253, peeling can be performed from a corner portion of the process member 253 as described in Structural Example 1.

The structure body 251, the process member 253, and the stage 255 can have structures similar to those of the structure body 201, the process member 203, and the stage 205 in Structural Example 1, respectively; thus, the descriptions are omitted. In the process member 253, a separation trigger 262 is formed.

The support body 257 supports a rotation axis 259 of the structure body 251. The support body 257 has a function of adjusting the vertical position of the structure body 251. Thus, the distance between the convex surface of the structure body 251 and the supporting surface of the stage 255 can be changed.

The transfer rollers 258 can transfer the stage 255. There is no particular limitation on a transfer means of the stage 255, and a conveyor belt or a transfer robot can be used.

In the case where the peeling apparatus includes a transfer means, the process member 253 may be positioned over the stage 255 by the transfer means.

Figure 23A:
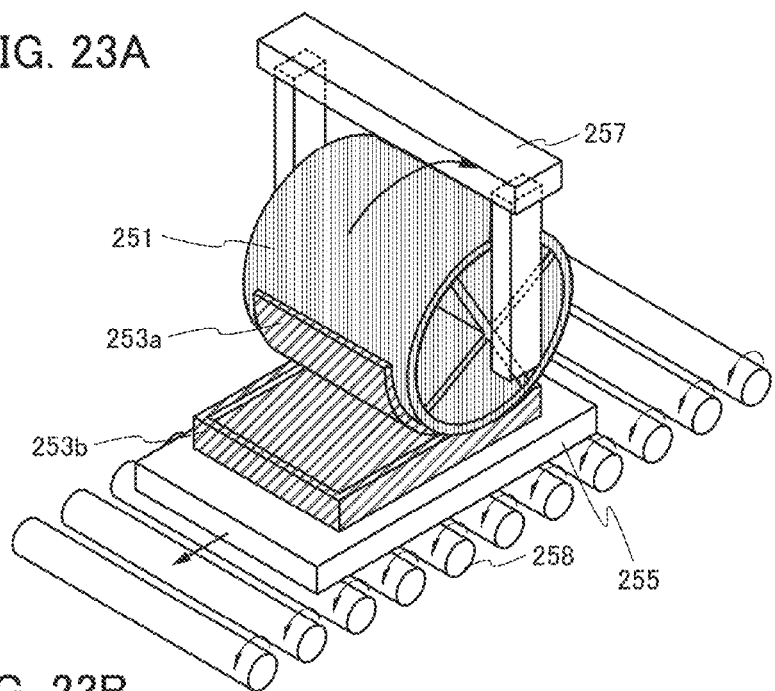
FIGS. 23A to 23C illustrate an example of a peeling apparatus.
Figure 23B:
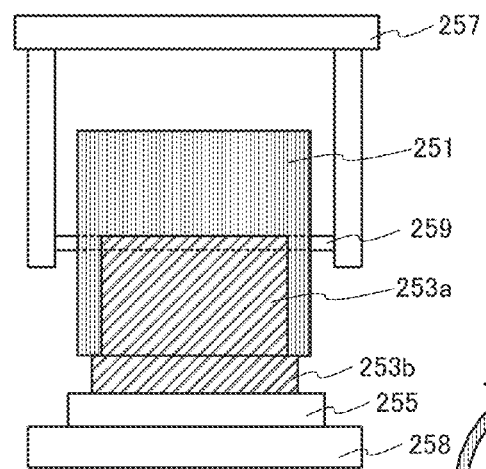
Figure 23C:
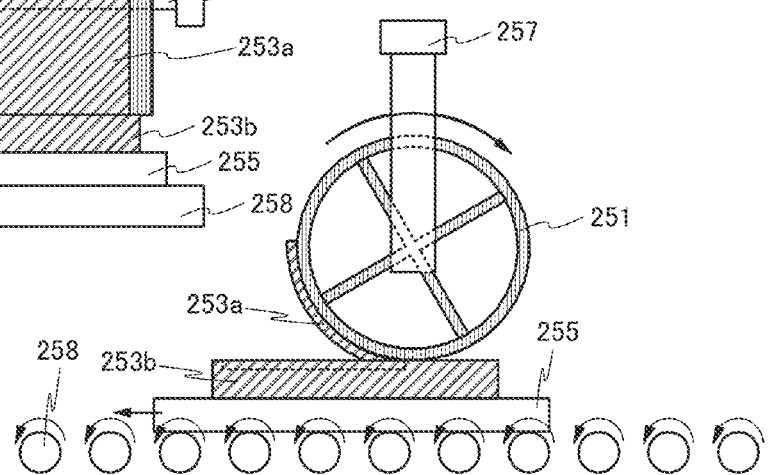
Figure 24A:
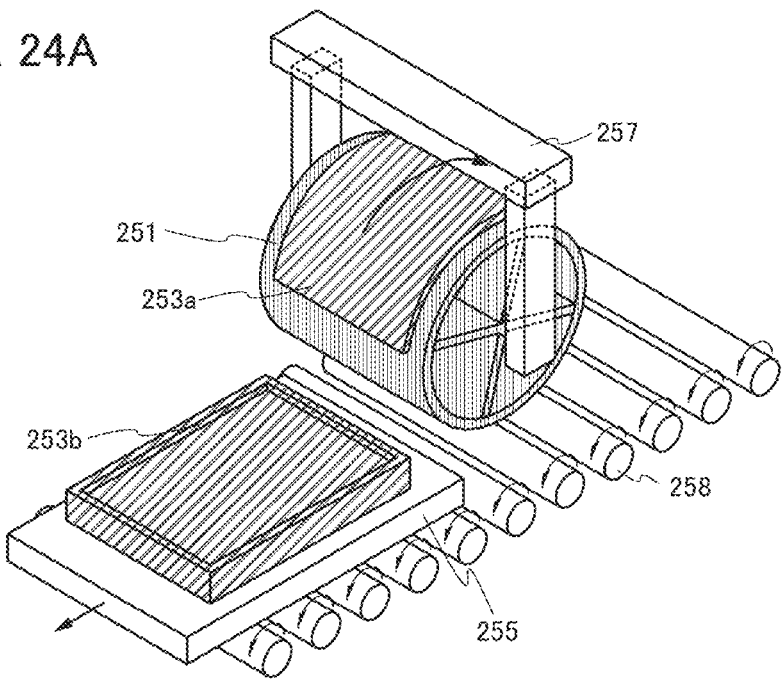
FIGS. 24A to 24C illustrate an example of a peeling apparatus.
Figure 24B:
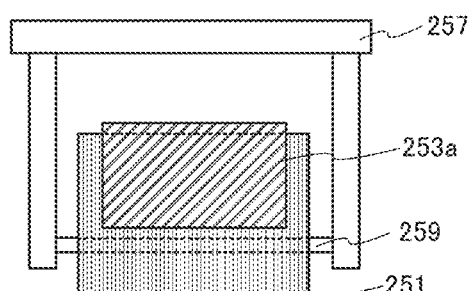
Figure 24C:
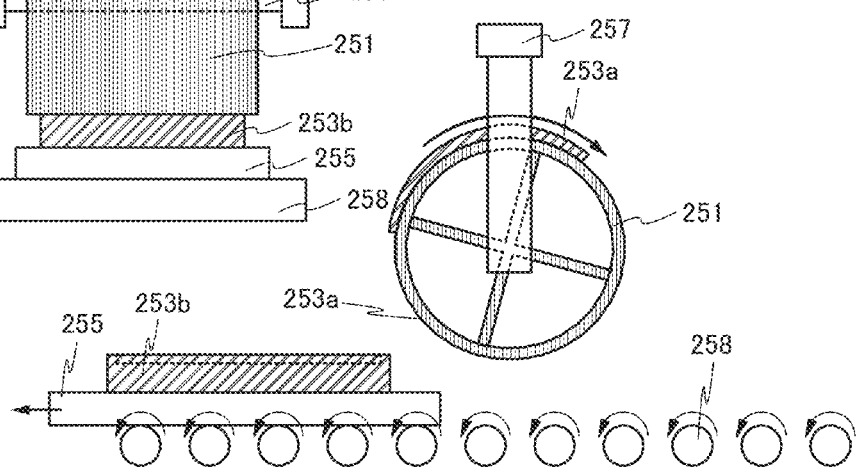

FIG. 23A, FIG. 23B, and FIG. 23C a perspective view, a front view, and a side view, respectively, of the peeling apparatus during the peeling. FIG. 24A, FIG. 24B, and FIG. 24C a perspective view, a front view, and a side view, respectively, of the peeling apparatus after the peeling.

The structure body 251 includes the rotation axis 259 at the center. FIG. 23A, FIG. 23C, and the like show the rotation directions of the structure body 251 and the transfer rollers 258; however, the structure body 251 and the transfer rollers 258 may each rotate in the reverse direction. The transfer rollers 258 rotate, whereby a positional relation between the rotation center of the structure body 251 and the stage 255 and the process member 253 over the stage 255 can change (specifically, the stage 255 and the process member 253 move in the horizontal direction in FIG. 23C or FIG. 24C).

The first member 253*a* held by the structure body 251 is peeled from the process member 253 and wound along the convex surface to be separated from the second member 253*b*. The second member 253*b* is held over the stage 255.

The convex surface of the structure body 251 is positioned so as to overlap with the separation trigger 262 formed in the process member 253. After that, when the structure body 251 rotates, the force of peeling the first member 253*a* is applied to the process member 253; thus, the first member 253*a* is peeled from the vicinity of the separation trigger 262. As a result, the first member 253*a* peeled from the process member 253 is wound along the convex surface and separated from the second member 253*b*. The first member 253*a* is held by the convex surface of the structure body 251 and the second member 253*b* is held over the stage 255.

In the case where the peeling apparatus includes a transfer means, the second member 253*b* over the stage 255 and the first member 253*a* wound by the structure body 251 may be individually transferred by the transfer means after the peeling.

Figure 25A:
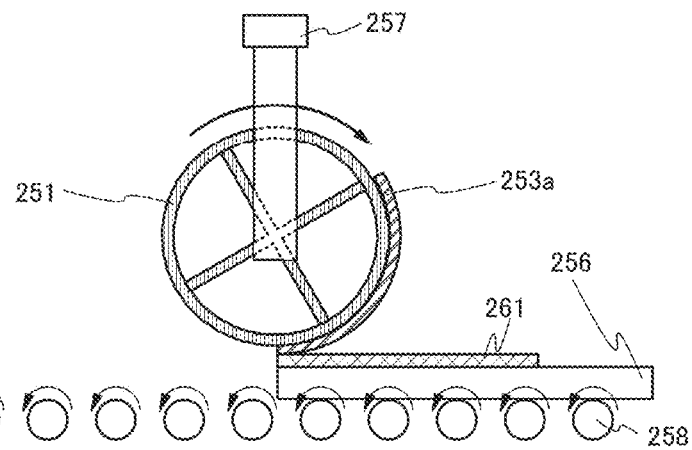
FIGS. 25A to 25E illustrate an example of a peeling apparatus.
Figure 25B:
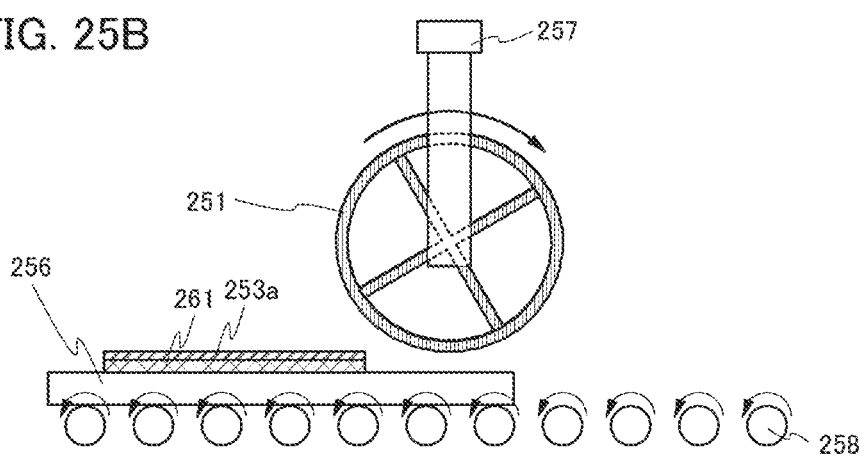
Figure 25C:
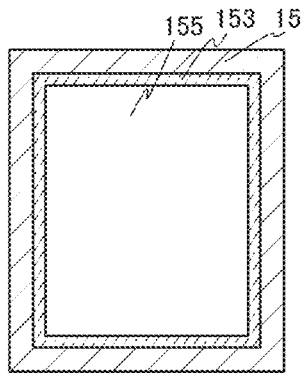
Figure 25D:
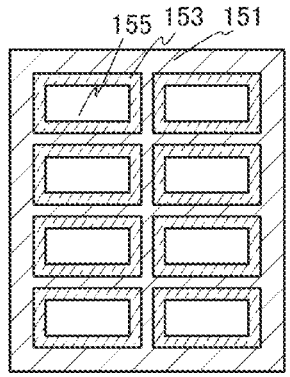
Figure 25E:
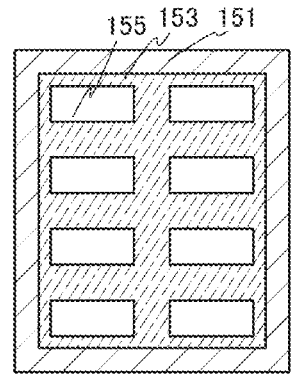

Alternatively, as illustrated in FIGS. 25A and 25B, the structure body 251 and the transfer rollers 258 may further rotate so that the first member 253*a* is bonded to a sheet-like member 261 positioned over a stage 256. Note that the member 261 may be positioned over the same stage (the stage 255) as the process member 253.

Structural Example 3

Another structure of a separation apparatus of one embodiment of the present invention is described with reference to FIGS. 26A1, 26A2, 26B1, 26B2, 26C1, and 26C2. FIGS. 26A1, 26A2, 26B1, 26B2, 26C1, and 26C2 illustrate a structure and operation of the separation apparatus of one embodiment of the present invention.

FIG. 26A1, FIG. 26B1, and FIG. 26C1 are schematic views each illustrating a side surface of the separation apparatus of one embodiment of the present invention. FIG. 26A2, FIG. 26B2, and FIG. 26C2 are schematic views each illustrating a top surface of the separation apparatus.

FIG. 26A1 and FIG. 26A2 illustrate the separation apparatus of one embodiment of the present invention in a state where a step of peeling the first member 103*a* from the process member 103 starts.

FIG. 26B1 and FIG. 26B2 illustrate the separation apparatus of one embodiment of the present invention in a state where the first member 103*a* is being peeled from the process member 103.

FIG. 26C1 and FIG. 26C2 illustrate the separation apparatus of one embodiment of the present invention in a state where the peeling of the first member 103*a* from the process member 103 is finished.

The separation apparatus described in Structural Example 3 of one embodiment includes the cylindrical structure body 101 and a rotator 101*a* that is in contact with an inner wall of the cylindrical structure body 101 and can rotate in synchronization with the rotation of the structure body 101, which is a difference from the separation apparatus described with reference to FIGS. 18A to 18D, FIGS. 19A to 19C, FIGS. 20A to 20C, FIGS. 21A to 21D, FIGS. 22A to 22C, FIGS. 23A to 23C, FIGS. 24A to 24C, and FIGS. 25A to 25E. A different component will be described in detail below, and the above description is referred to for the other similar components.

The structure body 101 has a cylindrical shape. Note that the structure body 101 may be provided with a member 101*b* on its outer surface (see FIG. 26A1 and FIG. 26A2).

The member 101*b* can modify physical properties of the surface of the structure body 101. For example, the member 101*b* allows the surface of the structure body 101 to have viscosity. Alternatively, the member 101*b* allows the surface of the structure body 101 to have elasticity that can disperse stress concentrated on the convex and concave portions.

For example, rubber, silicone rubber, a resin, a natural material, or the like can be used for the member 101*b*.

In the case where the member 101*b* provided on the structure body has a joint portion, the process member is provided between the stage 105 and the structure body 101 so as to prevent the process member 103 from being in contact with the joint portion.

The rotator 101*a* is in contact with the inner periphery of the cylindrical structure body 101, and the process member 103 is sandwiched between the outer periphery of the structure body 101 and the stage 105.

The rotator 101*a* is provided rotatably around the center axis. For example, the rotator 101*a* may be provided with a cylindrical roller or a gear on its outer surface.

In the case where the rotator 101*a* provided with a gear on its outer periphery is used, a gear that meshes the gear provided with the rotator 101*a* is provided on the inner periphery of the structure body 101. In this structure, for example, the rotator 101*a* is driven to rotate with use of a driver unit, and the rotation can influence the structure body 101.

As a first step, the process member 103 in which the separation trigger 102 is provided is inserted between the stage 105 and the structure body 101 (see FIG. 26A1 and FIG. 26A2). In the case where the process member 103 has a short side and a long side, the separation trigger 102 is preferably provided at the corner portion, and the process member 103 may be inserted from the corner portion in a state of being inclined at a θ degree angle with respect to the direction perpendicular to the center axis of the rotator 101a. As a result, the separation surface is gradually expanded from the separation trigger 102 and the first member 103a and the second member 103b can be separated from each other.

As a second step, the further peeling of the first member 103a from the second member 103b makes progress (see FIG. 26B1 and FIG. 26B2).

With use of the liquid supply unit indicated by the arrow 108, a liquid is supplied to a surface where the first member 103a and the second member 103b are separated (separation surface) (see FIG. 26B1). For example, the liquid is injected into the separation surface. Alternatively, the liquid may be sprayed.

For example, as the liquid injected or sprayed, water, a polar solvent, or the like can be used. By injecting the liquid, an influence of static electricity and the like caused by the peeling can be reduced. Alternatively, the peeling may proceed while the peeling layer is dissolved with a liquid.

As a third step, the first member 103a and the second member 103b are separated (see FIG. 26C1 and FIG. 26C2).

Structural Example 4

Another structure of a separation apparatus of one embodiment of the present invention is described with reference to FIGS. 27A1, 27A2, 27B1, 27B2, 27C1, and 27C2. FIGS. 27A1, 27A2, 27B1, 27B2, 27C1, and 27C2 illustrate a structure and operation of the separation apparatus of one embodiment of the present invention.

FIG. 27A1, FIG. 27B1, and FIG. 27C1 are schematic views each illustrating a side surface of the separation apparatus of one embodiment of the present invention. FIG. 27A2, FIG. 27B2, and FIG. 27C2 are schematic views each illustrating a top surface thereof.

FIG. 27A1 and FIG. 27A2 illustrate the separation apparatus of one embodiment of the present invention in a state where the peeling of the first member 103a from the process member 103 starts.

FIG. 27B1 and FIG. 27B2 illustrate the separation apparatus of one embodiment of the present invention in a state where the first member 103a is being peeled from the process member 103.

FIG. 27C1 and FIG. 27C2 illustrate the separation apparatus of one embodiment of the present invention in a state where the peeling of the first member 103a from the process member 103 is finished.

The separation apparatus described in Structural Example 4 in this embodiment includes the cylindrical structure body 101, instead of the cylindrical structure body 251, and the rotator 101a that is in contact with an inner wall of the cylindrical structure body 101 and can rotate in synchronization with the rotation of the structure body 101, which is a difference from the separation apparatus described with reference to FIGS. 22A to 22C, FIGS. 23A to 23C, and FIGS. 24A to 24C.

In addition, in the separation apparatus described in Structural Example 4, the structure body 101 is fixed with the support body 257, and the stage 155 is moved, which is a difference from the case of the separation apparatus described with reference to FIGS. 26A1, 26A2, 26B1, 26B2, 26C1, 26C2.

This embodiment can be combined with any of the other embodiments in this specification as appropriate.

Embodiment 4

In this embodiment, a transistor included in a display device of one embodiment of the present invention will be described.

The transistors included in the display device of one embodiment of the present invention do not necessarily have a uniform structure. For example, a transistor in a pixel portion in the display device and a transistor used in a driver circuit portion for driving the pixel portion have different structures; thus, the transistors can have electric characteristics appropriate to the respective portions, and the reliability of the display device can be improved.

When the transistor included in the driver circuit has a double gate structure, the transistor has high field-effect mobility.

Furthermore, the transistor in the driver circuit portion and the transistor in the pixel portion may have different channel lengths. Typically, the channel length of a transistor in the driver circuit portion is less than 2.5 µm, or greater than or equal to 1.45 µm and less than or equal to 2.2 µm.

The channel length of a transistor in the pixel portion is greater than or equal to 2.5 µm, or greater than or equal to 2.5 µm and less than or equal to 20 µm.

When the channel length of the transistor in the driver circuit portion is less than 2.5 µm or greater than or equal to 1.45 µm and less than or equal to 2.2 µm, as compared with the transistor in the pixel portion, the field-effect mobility can be increased, and the amount of on-state current can be increased. As a result, a driver circuit portion that can operate at high speed can be formed.

When the transistor in the driver circuit portion has high field-effect mobility, the number of input terminals can be made small.

FIG. 16 illustrates an example in which the transistor illustrated in FIG. 28A is used as the transistor in the pixel portion in the liquid crystal display device, and the transistor illustrated in FIG. 31A is used as the transistor in the driver circuit portion. FIG. 17 illustrates an example in which the transistor in the pixel portion and the transistor in the driver circuit portion have different structures in the EL display device. Note that as the transistor in the pixel portion, any of the transistors illustrated in FIG. 28B and FIGS. 29A and 29B can be used. As the transistor in the driver circuit portion, any of the transistors in which an oxide semiconductor layer has a multi-layer structure in FIGS. 31A and 31B and FIGS. 29A and 29B can be used. Note that the transistors in FIGS. 29A and 29B each have a structure in a state before being transferred to a flexible substrate.

For the transistor in the pixel portion, a transistor with high reliability for light irradiation from the backlight or an EL element is preferable. For example, an oxide semiconductor layer deposited by a sputtering method using a material with an atomic ratio In:Ga:Zn=1:1:1 as a target is used for a channel formation region, whereby a transistor with high reliability for light irradiation can be formed.

In contrast, for the transistor in the driver circuit portion, a transistor with high field-effect mobility is preferable. Besides the above structure, an oxide semiconductor layer deposited by a sputtering method using a material with an atomic ratio In:Ga:Zn=3:1:2 as a target is used for a channel formation region, whereby a transistor with high field-effect mobility can be formed.

In this embodiment, a method for forming the above two types of transistors over one substrate is described with reference to FIGS. 32A to 32D and FIGS. 33A to 33D. When one of the transistors has an oxide semiconductor layer with a stacked structure, the two types of transistors can be formed over one substrate with simple process. On the left side of the drawing, a cross section in the channel length direction of a transistor A whose structure is similar to that of the transistor in FIG. 28A is shown, as the transistor in the pixel portion. On the right side of the drawing, a cross section in the channel length direction of a transistor B whose structure is similar to that of the transistor in FIG. 31A is shown, as the transistor in the driver circuit portion. Note that the transistor in FIG. 31A has a structure in a state before being transferred to a flexible substrate. Note that the reference numerals common in the transistor A and the transistor B are given in only one of the transistors. In the method for forming the transistor described in this embodiment, a method for forming components (such as a separation layer) that are transferred to a flexible substrate, which is described in Embodiment 1, is included.

As the substrate 900, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

As a separation layer 910, a tungsten film with a thickness of 0.1 nm or more and 200 nm or less is used. A tungsten film easily absorbs oxygen; thus, the thickness is preferably thin because oxygen can be smoothly supplied to the above oxide semiconductor layer. As an insulating film 915, a tungsten oxide film is preferably formed on the surface of the tungsten film using a deposition gas containing oxygen. The formation of the tungsten oxide film enables the layer to be separated to be separated with weak force. As the insulating film 915, for example, a single layer of a silicon oxide film, a silicon oxynitride film, or a silicon nitride oxide film, or a stacked layer including any of the above films can be used. In the case where as a film in contact with the separation layer 910, a silicon oxide film, a silicon oxynitride film, or a silicon nitride oxide film is used, a silicon nitride film can be used as a layer of the stacked layer.

An insulating layer 935 can be formed by a plasma CVD method, a sputtering method, or the like using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. Alternatively, a stack including any of the above materials may be used, and at least an upper layer which is in contact with the oxide semiconductor layer is preferably formed using a material containing excess oxygen that might serve as a supply source of oxygen to the oxide semiconductor layer.

Oxygen may be added to the insulating layer 935 by an ion implantation method, an ion doping method, a plasma immersion ion implantation method, or the like. Adding oxygen enables the insulating layer 935 to supply oxygen much easily to the oxide semiconductor layer.

In the case where a surface of the substrate 900 is made of an insulator and there is no influence of impurity diffusion to the oxide semiconductor layer to be formed later, the insulating layer 935 is not necessarily provided. Furthermore, as illustrated in FIGS. 30A and 30B, the conductive film 921 is formed over the insulating film 915, and the insulating layer 935 may be formed over the conductive film.

Next, over the insulating layer 935, a first oxide semiconductor film 940c that is to be a first oxide semiconductor layer 942c and a second oxide semiconductor film 940b that is to be a second oxide semiconductor layer 942b in driver circuit transistors are deposited by a sputtering method, a CVD method, an MBE method, or the like.

Figure 32A:
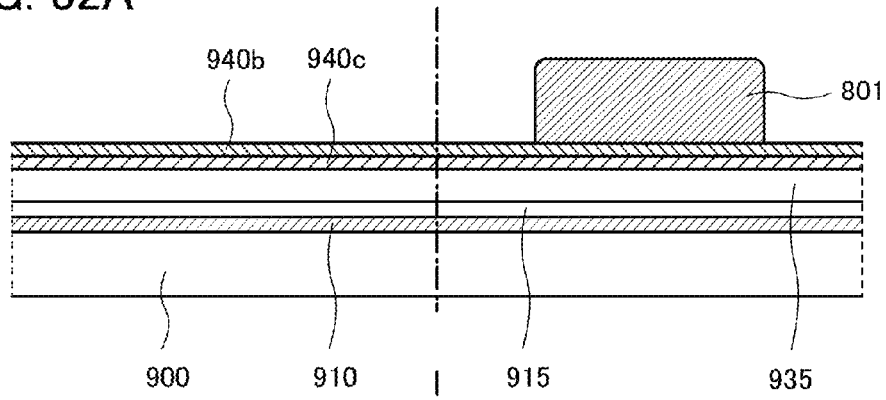
FIGS. 32A to 32D are cross-sectional views illustrating a method for manufacturing a transistor.
Figure 32B:
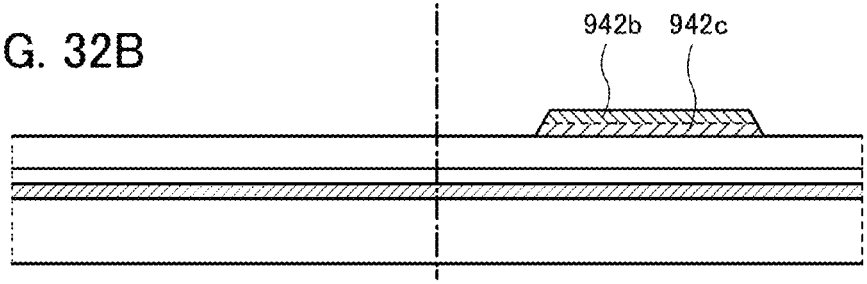
Figure 32C:
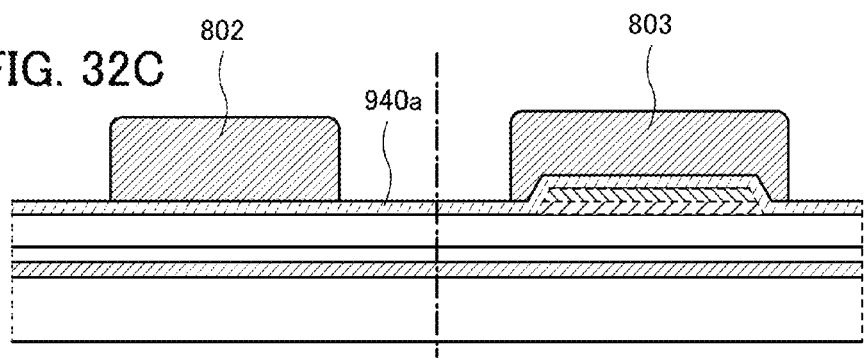
Figure 32D:
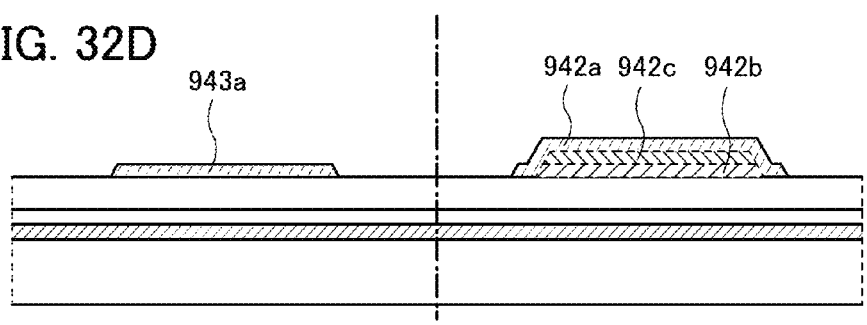

Next, a resist mask 801 is formed in a driver circuit region using a resist mask 801 by a lithography method (see FIG. 32A). With use of the resist mask, the first oxide semiconductor film 940c and the second oxide semiconductor film 940b are selectively etched, a stacked layer including the first oxide semiconductor layer 942c and the second oxide semiconductor layer 942b is formed (see FIG. 32B).

Next, a third oxide semiconductor film 940a that is to be a third oxide semiconductor layer 942a is formed to cover the stacked layer.

The materials described in Embodiment 5 can be used for the first oxide semiconductor film 940c, the second oxide semiconductor film 940b, and the third oxide semiconductor film 940a. In this embodiment, for example, an In—Ga—Zn-oxide (In:Ga:Zn=1:1:1 [atomic ratio]) is used for the first oxide semiconductor film 940c and the third oxide semiconductor film 940a, and an In—Ga—Zn-oxide (In:Ga:Zn=3:1:2 [atomic ratio]) is used for the second oxide semiconductor film 940b. The proportion of each atom in the atomic ratio of the first oxide semiconductor film 940c, the second oxide semiconductor film 940b, and the third oxide semiconductor film 940a may vary within a range of ±20% as an error. In the case where a sputtering method is used for deposition, the above material can be used as a target.

An oxide semiconductor that can be used for each of the first oxide semiconductor film 940c, the second oxide semiconductor film 940b, and the third oxide semiconductor film 940a preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

Note that here, for example, an "In—Ga—Zn oxide" means an oxide containing In, Ga, and Zn as its main components. The In—Ga—Zn oxide may contain another metal element in addition to In, Ga, and Zn. Further, in this specification, a film formed using an In—Ga—Zn oxide is also referred to as an IGZO film.

Alternatively, a material represented by $InMO_3(ZnO)_m$ (m>0 is satisfied, and m is not an integer) may be used. Note that M represents one or more metal elements selected from Ga, Y, Zr, La, Ce, and Nd. Alternatively, a material represented by $In_2SnO_5(ZnO)_m$ (n>0, n is an integer) may be used.

Note that a material of the second oxide semiconductor film 940*b* is selected so that the second oxide semiconductor film 940*b* has an electron affinity lower than that of the first oxide semiconductor film 940*c* and that of the third oxide semiconductor film 940*a*.

Note that the oxide semiconductor film is preferably formed by a sputtering method. As a sputtering method, an RF sputtering method, a DC sputtering method, an AC sputtering method, or the like can be used. To improve uniformity of film thickness of the oxide semiconductor film, film composition, and crystallinity, a DC sputtering method or an AC sputtering method is preferably used rather than an RF sputtering method.

The indium content in the second oxide semiconductor film 940*b* is preferably higher than those in the first and third oxide semiconductor films 940*c* and 940*a*. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. For this reason, with use of an oxide having a high indium content for the channel formation region, a transistor having high mobility can be achieved.

First heat treatment may be performed after the third oxide semiconductor film 940*a* is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. The first heat treatment can increase the crystallinity of the first to third oxide semiconductor films 940*c* to 940*a* and remove impurities such as water and hydrogen from the first to third oxide semiconductor films 940*c* to 940*a* and the insulating layer 935. Note that the first heat treatment may be performed after an etching step of the third oxide semiconductor film 940*a* described below.

Next, a resist mask 802 is formed in a pixel region by a lithography method. A resist mask 803 is formed over a stacked layer including the first oxide semiconductor layer 942*c* and the second oxide semiconductor layer 942*b* in the driver circuit region (see FIG. 32C).

Next, with use of the resist mask, the third oxide semiconductor film 940*a* is selectively etched to form an oxide semiconductor layer 943*a* in a pixel region. In addition, a stacked layer including the first oxide semiconductor layer 942*c*, the second oxide semiconductor layer 942*b*, and the third oxide semiconductor layer 942*a* is formed in the driver circuit region (see FIG. 32D).

Next, a first conductive film is formed over the oxide semiconductor layer 943*a* and the above stacked layer. As the first conductive film, a single layer or a stacked layer can be formed using a material selected from Al, Cr, Cu, Ta, Ti, Mo, W, Ni, Mn, Nd, and Sc and alloys of any of these metal materials. It is also possible to use an alloy or a conductive nitride of any of these materials. It is also possible to use a stack of a plurality of materials selected from these materials, alloys of these materials, and conductive nitrides of these materials. Typically, it is preferable to use Ti, which is particularly easily bonded to oxygen, or W, which has a high melting point and thus allows subsequent process temperatures to be relatively high. Alternatively, Cu or a Cu—X alloy (X indicates Mn, Ni, Cr, Fe, Co, Mo, Ta, or Ti), which has low resistance may be used. Further alternatively, a stacked layer including any of the above materials and Cu or Cu—X alloy may be used.

In the case of using Cu—X alloy (X indicates Mn, Ni, Cr, Fe, Co, Mo, Ta, or Ti), a covering film is formed in a region in contact with the oxide semiconductor layer or a region in contact with an insulating film by heat treatment, in some cases. The covering layer includes a compound containing X. Examples of compound containing X include an oxide of X, an In—X oxide, a Ga—X oxide, an In—Ga—X oxide, and In—Ga—Zn—X oxide. When the covering film is formed, the covering film functions as a blocking film, and Cu in the Cu—X alloy film can be prevented from entering the oxide semiconductor layer.

Figure 33A:
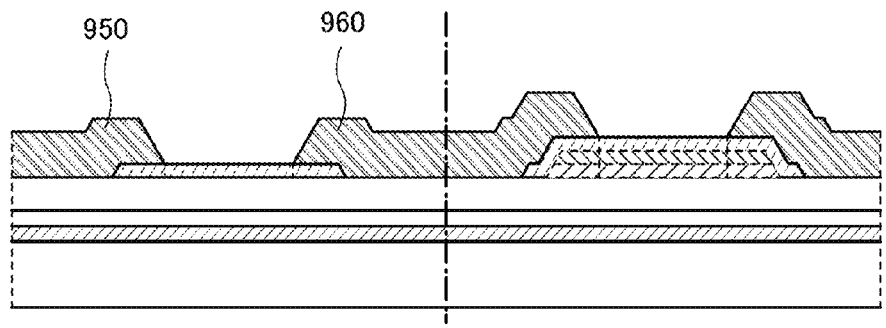
FIGS. 33A to 33D are cross-sectional views illustrating a method for manufacturing a transistor.

Next, a resist mask is formed over the first conductive film, and with use of the resist mask, the first conductive film is selectively etched, so that the source electrode layer 950 and the drain electrode layer 960 are formed (see FIG. 33A). In this step, the oxide semiconductor layer 943*a* and part of the stacked layer including the first to third oxide semiconductor layers 942*c* to 942*a* becomes n-type.

Figure 33B:
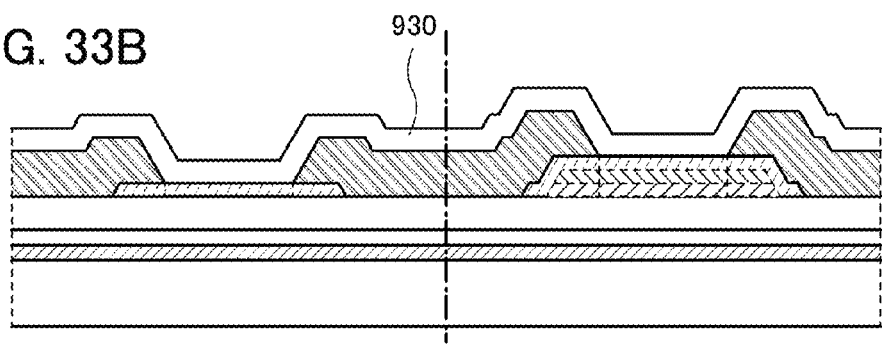

Next, the gate insulating film 930 is formed to cover the pixel region and the driver circuit region (see FIG. 33B). The gate insulating film 930 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The gate insulating film 930 may be a stack including any of the above materials. The gate insulating film 930 can be formed by a sputtering method, a CVD method, an MBE method, or the like.

Then, a second conductive film to be the gate electrode layer 920 is formed over the gate insulating film 930. For the second conductive film, a single layer, a stack, or an alloy of any of Al, Ti, Cr, Co, Ni, Cu, Y, Zr, Mo, Ru, Ag, Mn, Nd, Sc, Ta, and W can be used. The second conductive film can be formed by a sputtering method, a CVD method, or the like. The second conductive film may be formed using a conductive film containing nitrogen or a stack including the conductive film and a conductive film containing nitrogen.

After that, a resist mask is formed over the second conductive film, and the second conductive film is selectively etched using the resist mask to form the gate electrode layer 920.

Figure 33C:
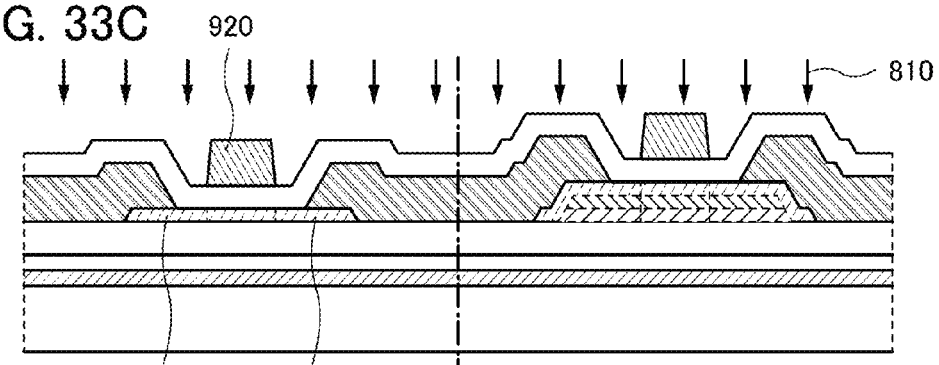

Next, an impurity 810 is added to regions that are not covered with the source electrode layer 950, the drain electrode layer 960, and the gate electrode layer 920, in the oxide semiconductor layer 943*a* and the stacked layer including the first to third oxide semiconductor layers 942*c* to 942*a*, so that the regions are made to be n-type regions and the source region 951 and the drain region 961 are formed (see FIG. 33C).

As a method for adding the impurity, an ion implantation method, an ion doping method, a plasma immersion ion implantation method, or the like can be used. Note that the addition of the impurity may be performed after the gate insulating film 930 is selectively etched using the gate electrode layer 920 as a mask.

As an impurity added to increase the conductivity of an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon.

When a rare gas is added as an impurity element to the oxide semiconductor layer, a bond between a metal element and oxygen in the oxide semiconductor layer is cut, whereby an oxygen vacancy is generated. Interaction between an oxygen vacancy in the oxide semiconductor layer and hydrogen that remains in the oxide semiconductor layer or is added to the oxide semiconductor layer later can increase the conductivity of the oxide semiconductor layer. Specifically, hydrogen enters into the oxygen vacancies in the oxide semiconductor layer, whereby an electron serving as a carrier is produced. As a result, the conductivity is increased.

In FIG. 33C, when the width of a so-called offset region (a region in the oxide semiconductor layer, which does not overlap with the gate electrode layer 920, and the source and drain electrode layers) is less than 0.1 µm, doping with the above impurity is not necessarily performed. In the case where the offset region is less than 0.1 µm, a difference of the amount of off-state current of the transistor whether the doping with the impurity is performed or not is significantly small.

Figure 33D:
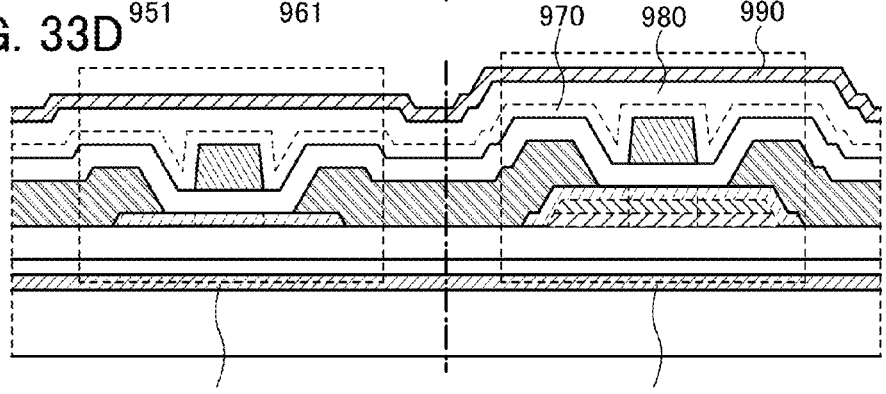

Next, over the gate insulating film 930 and a gate electrode layer 920, the insulating film 970, the insulating film 980, and the insulating film 990 are formed (see FIG. 33D).

Oxygen may be added to the insulating film 970 and/or the insulating film 980 by an ion implantation method, an ion doping method, a plasma immersion ion implantation method, or the like. By adding oxygen, oxygen can be easily supplied from the insulating film 970 and/or the insulating film 980 to the oxide semiconductor layer 943a and the first to third oxide semiconductor layers 942c to 942a.

After that, second heat treatment may be performed. The second heat treatment can be performed in a condition similar to that of the first heat treatment. By the second heat treatment, excess oxygen is easily released from the insulating layer 935, the insulating film 970, and the insulating film 980, and oxygen vacancies in the oxide semiconductor layer 943a and the stacked layer including the first to third oxide semiconductor layers 942c to 942a can be reduced.

Figure 28B:
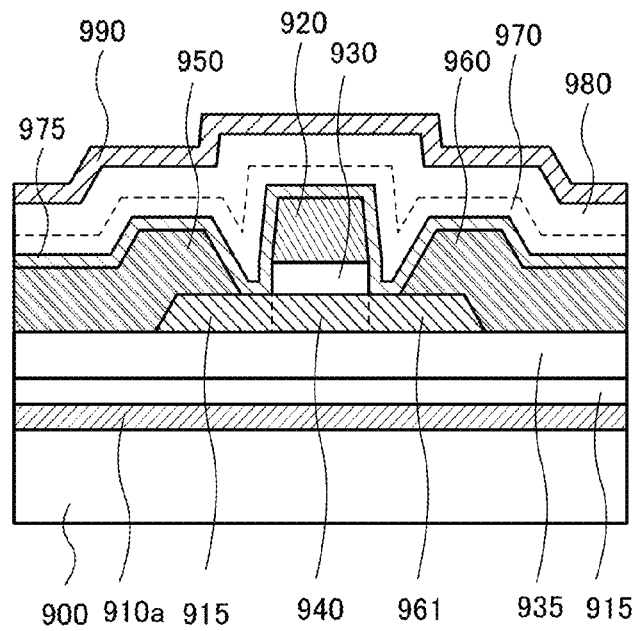
Figure 29A:
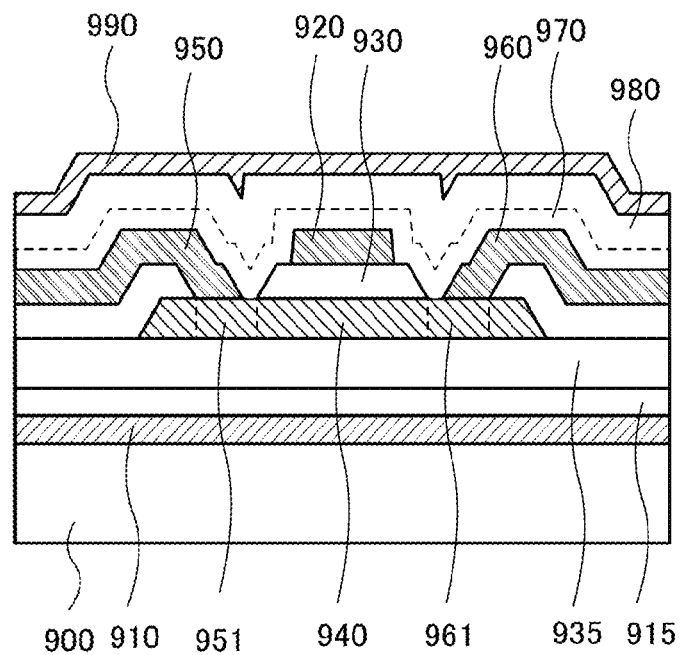
FIGS. 29A and 29B are cross-sectional views each illustrating a transistor.
Figure 29B:
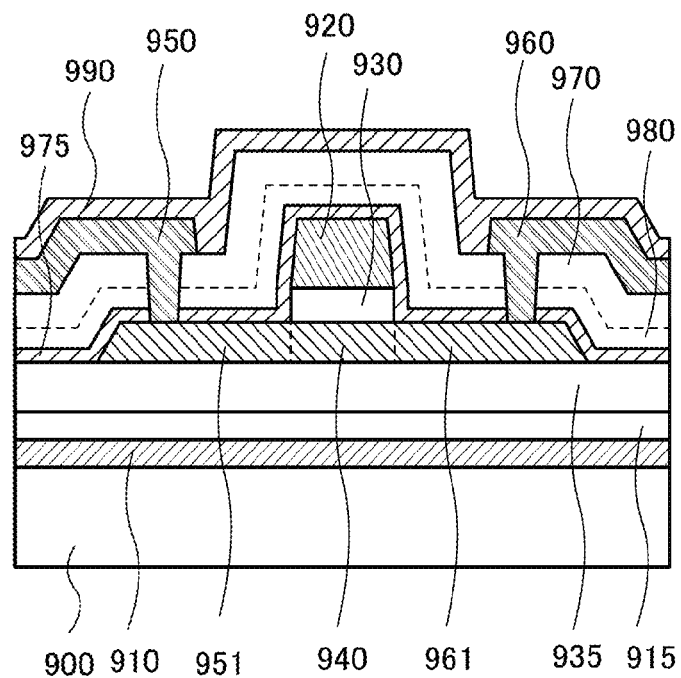

Furthermore, FIGS. 34A to 34D illustrate a method for forming the following structure: as a transistor in the pixel portion, a transistor C whose structure is similar to that of the transistor in FIG. 28B is used, and as a transistor in the driver circuit portion, a transistor D whose structure is similar to that of the transistor in FIG. 29B is used.

Figure 34A:
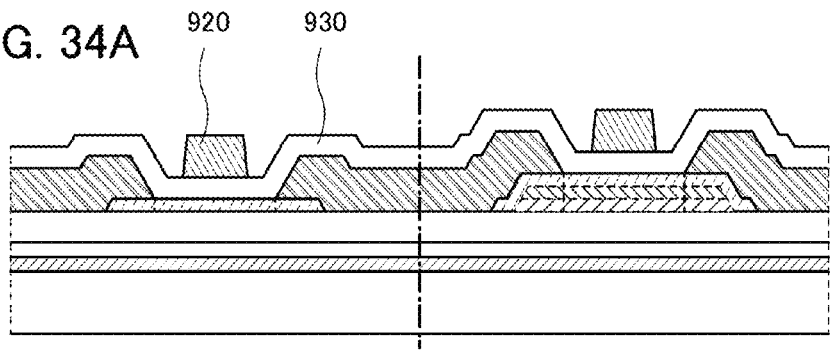
FIGS. 34A to 34D are cross-sectional views illustrating a method for manufacturing a transistor.

Up to the step illustrated in FIG. 33B, the steps similar to those in the above method for forming the transistor described above are performed, whereby the gate electrode layer 920 is formed (see FIG. 34A).

Figure 34B:
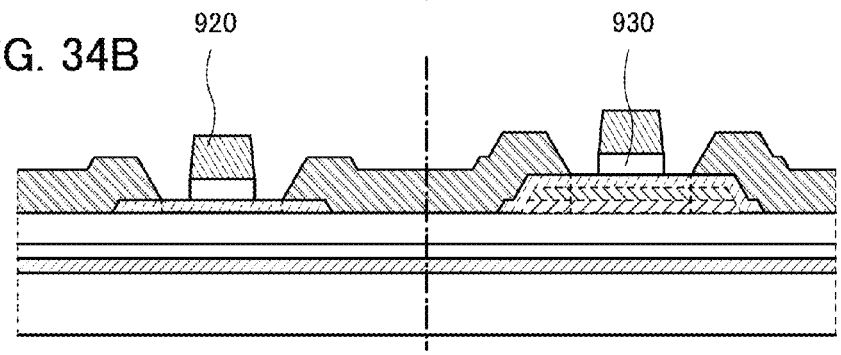

Next, the gate insulating film 930 is etched using the gate electrode layer 920 as a mask (see FIG. 34B).

Figure 34C:
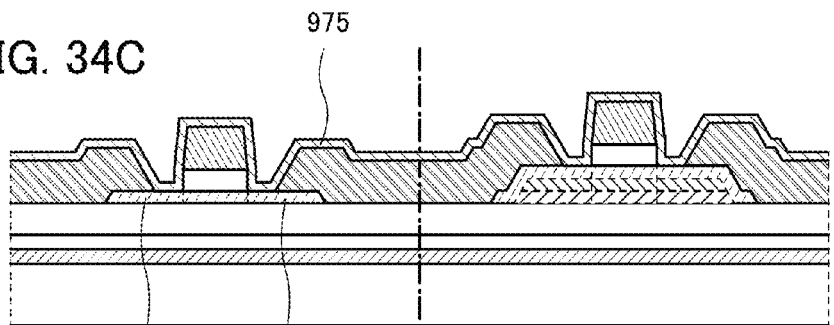

Next, the insulating film 975 containing hydrogen, such as a silicon nitride film or an aluminum nitride film, is formed to be in contact with part of the oxide semiconductor layer 940, so that hydrogen is diffused to the part of the oxide semiconductor layer 940 (see FIG. 34C). The diffused hydrogen is bonded to the oxygen vacancy in the oxide semiconductor layer 940 and serves as a donor; accordingly, the low-resistance source region 951 and the low-resistance drain region 961 can be formed. In the structure in FIG. 34C, the oxide semiconductor layer may be doped with the above impurity.

Figure 34D:
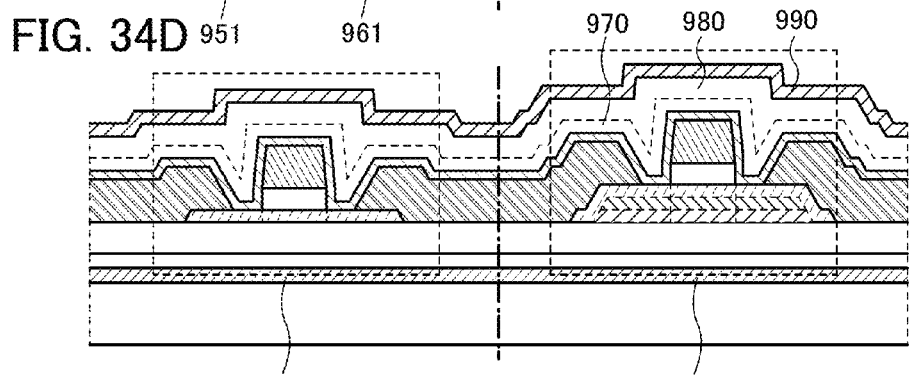

Next, over the insulating film 975, the insulating film 970, the insulating film 980, and the insulating film 990 are formed (see FIG. 34D).

Through the above steps, the transistor including an oxide semiconductor layer with a single-layer structure and the transistor including an oxide semiconductor layer with a stacked structure can be easily formed over one substrate. In addition, a display device which can operate at high speed, less deteriorates due to light irradiation, and includes a pixel portion with excellent display quality can be formed.

This embodiment can be combined with any of the other embodiments in this specification as appropriate.

Embodiment 5

In this embodiment, electronic appliances and lighting devices that can be manufactured using the peeling apparatus of one embodiment of the present invention or the stack manufacturing apparatus of one embodiment of the present invention are described with reference to FIGS. 36A to 36G and FIGS. 37A to 37I.

A light-emitting device, a display device, a semiconductor device, or the like that can be used for an electronic appliance or a lighting device can be manufactured with a high yield by employing one embodiment of the present invention. Moreover, a flexible electronic appliance or lighting device having high productivity can be manufactured by employing one embodiment of the present invention.

Examples of an electronic appliance include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, and a large game machine such as a pinball machine.

The device manufactured by employing one embodiment of the present invention has flexibility and therefore can be incorporated along a curved inside/outside wall surface of a house or a building or a curved interior/exterior surface of a car.

Figure 36A:
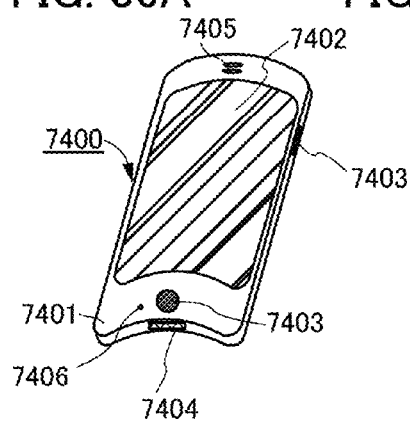
FIGS. 36A to 36G illustrate examples of electronic devices and lighting devices.

FIG. 36A illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the cellular phone 7400 is manufactured using the display device manufactured by employing one embodiment of the present invention for the display portion 7402. One embodiment of the present invention enables a highly reliable mobile phone having a curved display portion to be provided with a high yield.

When the display portion 7402 of the mobile phone 7400 illustrated in FIG. 36A is touched with a finger or the like, data can be input into the mobile phone 7400. In addition, operations such as making a call and inputting a letter can be performed by touch on the display portion 7402 with a finger or the like.

With the operation buttons 7403, the power can be turned on or off. In addition, types of images displayed on the display portion 7402 can be switched; switching images from a mail creation screen to a main menu screen.

Figure 36B:
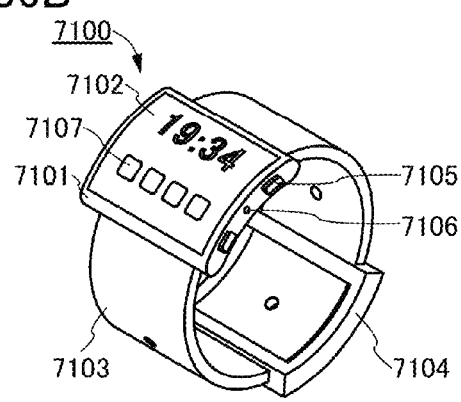

FIG. 36B illustrates an example of a wrist-watch-type portable information terminal. A portable information terminal 7100 includes a housing 7101, a display portion 7102, a band 7103, a buckle 7104, an operation button 7105, an input/output terminal 7106, and the like.

The portable information terminal 7100 is capable of executing a variety of applications such as mobile phone calls, e-mailing, reading and editing texts, music reproduction, Internet communication, and a computer game.

The display surface of the display portion 7102 is bent, and images can be displayed on the bent display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as ON/OFF of the power, ON/OFF of wireless communication, setting and cancellation of manner mode, and setting and cancellation of power saving mode can be performed. For example, the functions of the operation button 7105 can be set freely by setting the operation system incorporated in the portable information terminal 7100.

The portable information terminal 7100 can employ near field communication that is a communication method based on an existing communication standard. In that case, for example, mutual communication between the portable information terminal 7100 and a headset capable of wireless communication can be performed, and thus hands-free calling is possible.

Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

The display portion 7102 of the portable information terminal 7100 includes a light-emitting device manufactured by using one embodiment of the present invention. One embodiment of the present invention enables a highly reliable portable information terminal having a curved display portion to be provided with a high yield.

Figure 36C:
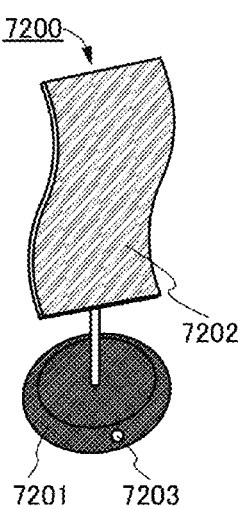
Figure 36D:
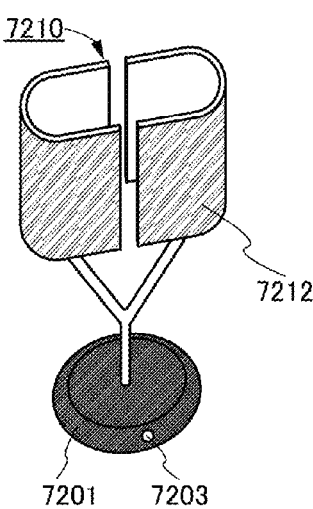
Figure 36E:
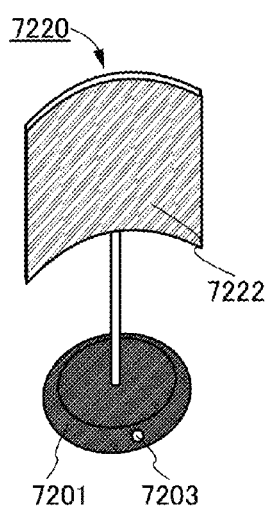

FIGS. 36C to 36E illustrate examples of a lighting device. Lighting devices 7200, 7210, and 7220 each include a stage 7201 provided with an operation switch 7203 and a light-emitting portion supported by the stage 7201.

The lighting device 7200 illustrated in FIG. 36C includes a light-emitting portion 7202 having a wave-shaped light-emitting surface, and thus has good design.

A light-emitting portion 7212 included in the lighting device 7210 illustrated in FIG. 36D has two convex-curved light-emitting portions symmetrically placed. Thus, light radiates from the lighting device 7210 in all directions.

The lighting device 7220 illustrated in FIG. 36E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 are flexible; thus, the light-emitting portion may be fixed on a plastic member, a frame that can be changed in shape, or the like so that an emission surface of the light-emitting portion can be bent freely depending on the intended use.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Here, each light-emitting portion includes a light-emitting device manufactured by employing one embodiment of the present invention. One embodiment of the present invention enables a highly reliable lighting device having a curved light-emitting portion to be provided with a high yield.

Figures 36F, 36G:
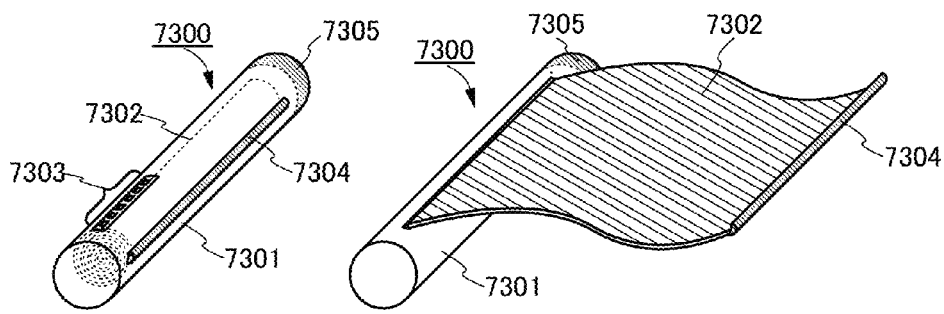

FIG. 36F illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring.

By pressing the operation buttons 7303, ON/OFF of the power, switching of displayed videos, and the like can be performed.

FIG. 36G illustrates a display device 7300 in a state where the display portion 7302 is pulled out with the display portion pull 7304. Videos can be displayed on the display portion 7302 in this state. Furthermore, the operation buttons 7303 on the surface of the housing 7301 allow one-handed operation. The operation buttons 7303 are provided not in the center of the housing 7301 but on one side of the housing 7301 as illustrated in FIG. 36F, which makes one-handed operation easy.

Note that a reinforcement frame may be provided for a side portion of the display portion 7302 so that the display portion 7302 has a flat display surface when pulled out.

Note that in addition to this structure, a speaker may be provided for the housing so that sound is output with an audio signal received together with a video signal.

The display portion 7302 includes a display device manufactured by employing one embodiment of the present invention. One embodiment of the present invention enables a lightweight and highly reliable display device to be provided with a high yield.

Figure 37A:
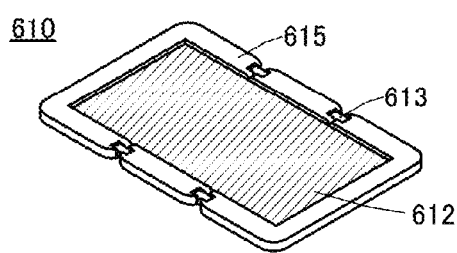
FIGS. 37A to 37I illustrate examples of electronic devices.
Figure 37B:
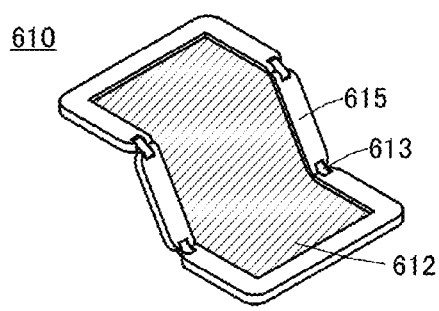
Figure 37C:
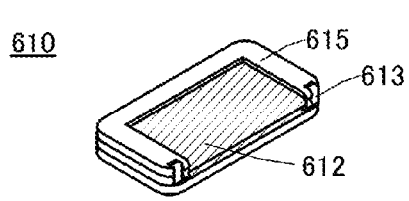

FIGS. 37A to 37C illustrate a foldable portable information terminal 610. FIG. 37A illustrates the portable information terminal 610 that is opened. FIG. 37B illustrates the portable information terminal 610 that is being opened or being folded. FIG. 37C illustrates the portable information terminal 610 that is folded. The portable information terminal 610 is highly portable when folded. When the portable information terminal 610 is opened, a seamless large display region is highly browsable.

A display panel 612 is supported by three housings 615 joined together by hinges 613. By folding the portable information terminal 610 at a connection portion between two housings 615 with the hinges 613, the portable information terminal 610 can be reversibly changed in shape from an opened state to a folded state. A display device manufactured by any of the peeling methods of embodiments of the present invention can be used for the display panel 612. For example, a display device that can be bent with a radius of curvature of greater than or equal to 1 mm and less than or equal to 150 mm can be used.

Figure 37D:
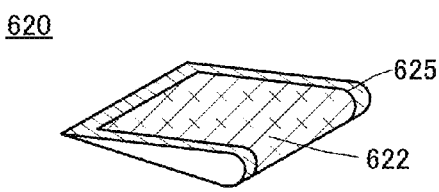
Figure 37E:
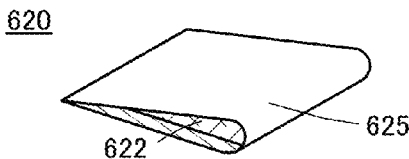

FIGS. 37D and 37E illustrate a foldable portable information terminal 620. FIG. 37D is the portable information terminal 620 that is folded so that the display portion 622 is on the outside. FIG. 37E is the portable information terminal 620 that is folded so that the display portion 622 is on the inside. Because a non-display portion 625 is on the outside when the portable information terminal 620 is not used, the display portion 622 can be prevented from dirt and scratches. The display device according to one embodiment of the present invention can be used for the display portion 622.

Figure 37F:
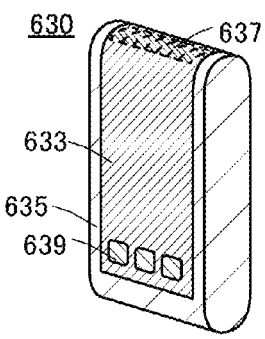
Figure 37G:
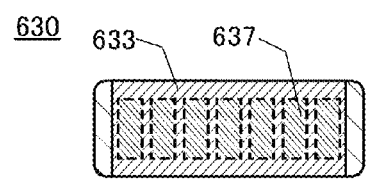
Figure 37H:
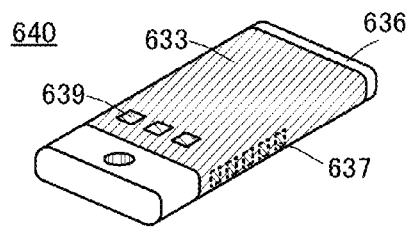

FIG. 37F is a perspective view illustrating an external shape of the portable information terminal 630. FIG. 37G is a top view of the portable information terminal 630. FIG. 37H is a perspective view illustrating an external shape of a portable information terminal 640.

The portable information terminals 630 and 640 each function as, for example, one or more of a telephone set, a notebook, and an information browsing system. Specifically, the portable information terminals 630 and 640 each can be used as a smartphone.

The portable information terminals 630 and 640 can display characters and image information on its plurality of surfaces. For example, three operation buttons 639 can be displayed on one surface (FIGS. 37F and 37H). In addition, information 637 indicated by dashed rectangles can be displayed on another surface (FIGS. 37G and 37H). Examples of the information 637 include display indicating reception of an incoming email, social networking service (SNS) message, and call; the title and sender of an email and SNS massage; the date; the time; remaining battery; and the reception strength of an antenna. Alternatively, the operation buttons 639, an icon, or the like may be displayed in place of the information 637. Although FIGS. 37F and 37G illustrate an example in which the information 637 is displayed at the top, one embodiment of the present invention is not limited thereto. The information may be displayed, for example, on the side as in the portable information terminal 640 in FIG. 37H.

For example, a user of the portable information terminal 630 can see the display (here, the information 637) with the portable information terminal 630 put in a breast pocket of his/her clothes.

Specifically, a caller's phone number, name, or the like of an incoming call is displayed in a position that can be seen from above the portable information terminal 630. Thus, the user can see the display without taking out the portable information terminal 630 from the pocket and decide whether to answer the call.

A display device manufactured by any of the embodiments of the present invention can be used for a display portion 633 mounted in each of a housing 635 of the portable information terminal 630 and a housing 636 of the portable information terminal 640. One embodiment of the present invention makes it possible to provide a highly reliable display device having a curved display portion with a high yield.

Figure 37I:
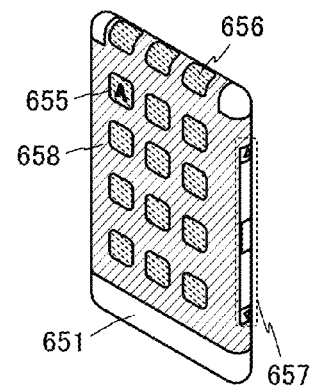

Information may be displayed, for example, on three or more sides in a portable information terminal 645 illustrated in FIG. 37I. Here, information 655, information 656, and information 657 are displayed on different sides.

A display device manufactured by one embodiment of the present invention can be used for a display portion 658 mounted in a housing 651 of the portable information terminal 645. According to one embodiment of the present invention, a highly reliable portable display device having a curved display portion can be provided at a high yield.

This embodiment can be combined with any of the other embodiments as appropriate.

This application is based on Japanese Patent Application serial no. 2013-273513 filed with Japan Patent Office on Dec. 27, 2013, the entire contents of which are hereby incorporated by reference.

What is claimed is:

1. A display device comprising:
a first flexible substrate;
a first bonding layer over the first flexible substrate;
a first insulating film over the first bonding layer;
a first element layer over the first insulating film;
a second element layer over the first element layer;
a second insulating film over the second element layer;
a second bonding layer over the second insulating film; and
a second flexible substrate over the second bonding layer,
wherein the first element layer includes a pixel portion and a circuit portion, wherein the pixel portion includes a display element and a first transistor and the circuit portion includes a second transistor,
wherein the second element layer includes a coloring layer and a light-blocking layer,
wherein the first transistor includes:
a first oxide semiconductor layer including a channel formation region; and
a first gate electrode over the first oxide semiconductor layer,
wherein the second transistor includes:
a conductive layer;
a second oxide semiconductor layer over the conductive layer;
a third oxide semiconductor layer over the second oxide semiconductor layer, the third oxide semiconductor layer including a channel formation region;
a fourth oxide semiconductor layer over the third oxide semiconductor layer; and
a second gate electrode over the fourth oxide semiconductor layer, the second gate electrode facing a side surface of the third oxide semiconductor layer, and
wherein the first transistor is a transistor having a single-gate structure.

2. The display device according to claim 1,
wherein each of the first insulating film and the second insulating film includes a silicon oxide film, a silicon oxynitride film, a silicon nitride film, or a silicon nitride oxide film.

3. The display device according to claim 1,
wherein each of the first insulating film and the second insulating film is a film containing nitrogen.

4. The display device according to claim 1,
wherein each of the first oxide semiconductor layer and the second oxide semiconductor layer includes an In-M-Zn oxide, and
wherein the M is Al, Ti, Y, Zr, La, Ce, Nd, or Hf.

5. The display device according to claim 1,
wherein each of the first oxide semiconductor layer and the second oxide semiconductor layer includes an In—Ga—Zn oxide.

6. The display device according to claim 1,
wherein the first oxide semiconductor layer includes a crystal part whose c-axis is perpendicular to a top surface of the first oxide semiconductor layer,
wherein the first oxide semiconductor layer is a non-single-crystal oxide semiconductor layer,
wherein the second oxide semiconductor layer includes a crystal part whose c-axis is perpendicular to a top surface of the second oxide semiconductor layer, and
wherein the second oxide semiconductor layer is a non-single-crystal oxide semiconductor layer.

7. The display device according to claim 1,
wherein the first oxide semiconductor layer is a single layer, and
wherein the second oxide semiconductor layer is a multilayer.

8. The display device according to claim 7,
wherein the first oxide semiconductor layer has the same composition as a layer of the multilayer, the layer being in contact with a gate insulating film of the second oxide semiconductor layer.

9. The display device according to claim 1,
wherein the display element is an organic EL element.

10. A display device comprising:
a first flexible substrate;
a first bonding layer over the first flexible substrate;
a first insulating film over the first bonding layer;
a first element layer over the first insulating film;
a second element layer over the first element layer;
a second insulating film over the second element layer;
a second bonding layer over the second insulating film; and
a second flexible substrate over the second bonding layer,
wherein the first element layer includes a pixel portion and a circuit portion, wherein the pixel portion includes a display element and a first transistor and the circuit portion includes a second transistor,
wherein the second element layer includes a coloring layer and a light-blocking layer,
wherein the first transistor includes:
a first oxide semiconductor layer including a channel formation region; and
a first gate electrode over the first oxide semiconductor layer,
wherein the second transistor includes:
a conductive layer;
a second oxide semiconductor layer over the conductive layer;
a third oxide semiconductor layer over the second oxide semiconductor layer, the third oxide semiconductor layer including a channel formation region;
a fourth oxide semiconductor layer over the third oxide semiconductor layer; and
a second gate electrode over the fourth oxide semiconductor layer, the second gate electrode facing a side surface of the third oxide semiconductor layer,
wherein the first transistor is a transistor having a single-gate structure, and
wherein an insulating layer is in contact with a top surface of the first oxide semiconductor layer.

11. The display device according to claim 10,
wherein each of the first insulating film and the second insulating film includes a silicon oxide film, a silicon oxynitride film, a silicon nitride film, or a silicon nitride oxide film.

12. The display device according to claim 10,
wherein each of the first insulating film and the second insulating film is a film containing nitrogen.

13. The display device according to claim 10,
wherein each of the first oxide semiconductor layer and the second oxide semiconductor layer includes an In-M-Zn oxide, and
wherein the M is Al, Ti, Y, Zr, La, Ce, Nd, or Hf.

14. The display device according to claim 10,
wherein each of the first oxide semiconductor layer and the second oxide semiconductor layer includes an In—Ga—Zn oxide.

15. The display device according to claim 10,
wherein the first oxide semiconductor layer includes a crystal part whose c-axis is perpendicular to a top surface of the first oxide semiconductor layer,
wherein the first oxide semiconductor layer is a non-single-crystal oxide semiconductor layer,
wherein the second oxide semiconductor layer includes a crystal part whose c-axis is perpendicular to a top surface of the second oxide semiconductor layer, and
wherein the second oxide semiconductor layer is a non-single-crystal oxide semiconductor layer.

16. The display device according to claim 10,
wherein the first oxide semiconductor layer is a single layer, and
wherein the second oxide semiconductor layer is a multilayer.

17. The display device according to claim 16,
wherein the first oxide semiconductor layer has the same composition as a layer of the multilayer, the layer being in contact with a gate insulating film of the second oxide semiconductor layer.

18. The display device according to claim 10,
wherein the display element is an organic EL element.

19. A display device comprising:
a first flexible substrate;
a first bonding layer over the first flexible substrate;
a first insulating film over the first bonding layer;
a first element layer over the first insulating film;
a second element layer over the first element layer; and
a second insulating film over the second element layer,
wherein the first element layer includes a pixel portion and a circuit portion, wherein the pixel portion includes a display element and a first transistor and the circuit portion includes a second transistor,
wherein the second element layer includes a coloring layer and a light-blocking layer,
wherein the first transistor includes:
a first oxide semiconductor layer including a channel formation region; and
a first gate electrode overlapping with the first oxide semiconductor layer, and
wherein the second transistor includes:
a conductive layer;
a second oxide semiconductor layer over the conductive layer;
a third oxide semiconductor layer over the second oxide semiconductor layer, the third oxide semiconductor layer including a channel formation region;
a fourth oxide semiconductor layer over the third oxide semiconductor layer; and
a second gate electrode over the fourth oxide semiconductor layer, and
wherein the first transistor is a transistor having a single-gate structure.

20. The display device according to claim 19,
wherein each of the first insulating film and the second insulating film includes a silicon oxide film, a silicon oxynitride film, a silicon nitride film, or a silicon nitride oxide film.

21. The display device according to claim 19,
wherein each of the first insulating film and the second insulating film is a film containing nitrogen.

22. The display device according to claim 19,
wherein each of the first oxide semiconductor layer and the second oxide semiconductor layer includes an In—Ga—Zn oxide.

23. A semiconductor device comprising:
a first transistor including:
- a first oxide semiconductor layer over an insulating surface; and
- a first gate electrode overlapping with the first oxide semiconductor layer; and a second transistor including:
- a second oxide semiconductor layer over the insulating surface;
- a third oxide semiconductor layer over the second oxide semiconductor layer;
- a fourth oxide semiconductor layer over the third oxide semiconductor layer; and
- a second gate electrode overlapping with the second oxide semiconductor layer, the third oxide semiconductor layer, and the fourth oxide semiconductor layer, wherein the first oxide semiconductor layer and the fourth oxide semiconductor layer comprises a same material,
wherein indium content in the third oxide semiconductor layer is higher than indium content in the fourth oxide semiconductor layer and higher than indium content in the first oxide semiconductor layer, and
wherein a channel formation region of the first oxide semiconductor layer is in contact with the insulating surface, the channel formation region overlapping with the first gate electrode.

24. The semiconductor device according to claim 23, wherein the first oxide semiconductor layer and the fourth oxide semiconductor layer are formed from a same oxide semiconductor layer.

25. The semiconductor device according to claim 23, further comprising:
- a flexible substrate;
- a bonding layer over the flexible substrate;
- an insulating film over the bonding layer, wherein the first oxide semiconductor layer and the second oxide semiconductor layer are located over the insulating film.

26. The semiconductor device according to claim 23,
wherein a pixel portion comprises the first transistor, and
wherein a driver circuit portion comprises the second transistor.

* * * * *